(12) United States Patent
Hinoue et al.

(10) Patent No.: US 12,457,744 B2
(45) Date of Patent: Oct. 28, 2025

(54) THREE-DIMENSIONAL MEMORY DEVICE AND METHOD OF MAKING THEREOF USING SELECTIVE METAL NITRIDE DEPOSITION ON DIELECTRIC METAL OXIDE BLOCKING DIELECTRIC

(71) Applicant: SANDISK TECHNOLOGIES LLC, Addison, TX (US)

(72) Inventors: Tatsuya Hinoue, Yokkaichi (JP); Tomohiro Uno, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 537 days.

(21) Appl. No.: 17/932,942

(22) Filed: Sep. 16, 2022

(65) Prior Publication Data
US 2024/0098992 A1    Mar. 21, 2024

(51) Int. Cl.
*H10B 43/27*    (2023.01)
*H10B 51/20*    (2023.01)
*H10B 63/00*    (2023.01)

(52) U.S. Cl.
CPC ............ *H10B 43/27* (2023.02); *H10B 51/20* (2023.02); *H10B 63/34* (2023.02)

(58) Field of Classification Search
CPC . H01L 27/1027; H01L 27/1028; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30;
(Continued)

(56) References Cited

U.S. PATENT DOCUMENTS 9,613,977 B2    4/2017    Sharangpani et al.
9,659,955 B1    5/2017    Sharangpani et al.
(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36, doi: 10.1109/IEDM.2001.979396.
(Continued)

*Primary Examiner* — William B Partridge
*Assistant Examiner* — Gustavo G Ramallo
(74) *Attorney, Agent, or Firm* — THE MARBURY LAW GROUP PLLC

(57) ABSTRACT

A three-dimensional memory device includes an alternating stack of insulating layers and electrically conductive layers, a memory opening vertically extending through the alternating stack, and a memory opening fill structure located in the memory opening and including a set of dielectric-metal-oxide blocking dielectric portions located at levels of the electrically conductive layers, a memory material layer, and a vertical semiconductor channel. Each of the electrically conductive layers includes a tubular metal nitride portion and a metal fill material portion, each of the tubular metal nitride portions laterally surrounds and contacts a respective one of the dielectric-metal-oxide blocking dielectric portions, and each metal fill material portion either contacts respective overlying and underlying insulating layers of the insulating layers, or contacts respective upper and lower metal nitride liner portions which have a smaller thickness than the tubular metal nitride portions.

4 Claims, 46 Drawing Sheets

(58) Field of Classification Search
CPC .............. H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50

See application file for complete search history.

(56) References Cited

U.S. PATENT DOCUMENTS

| | | | |
|---|---|---|---|
| 9,659,956 | B1 | 5/2017 | Pachamuthu et al. |
| 9,780,182 | B2 | 10/2017 | Peri et al. |
| 9,875,929 | B1 | 1/2018 | Shukla et al. |
| 9,984,963 | B2 | 5/2018 | Peri et al. |
| 10,283,513 | B1 | 5/2019 | Zhou et al. |
| 10,438,964 | B2 | 10/2019 | Makala et al. |
| 10,707,233 | B1 | 7/2020 | Cui et al. |
| 10,804,282 | B2 | 10/2020 | Baraskar et al. |
| 10,818,542 | B2 | 10/2020 | Cui et al. |
| 10,840,259 | B2 | 11/2020 | Rabkin et al. |
| 10,861,869 | B2 | 12/2020 | Nakamura et al. |
| 10,916,504 | B2 | 2/2021 | Mukae et al. |
| 10,991,721 | B2 | 4/2021 | Rabkin et al. |
| 11,049,807 | B2 | 6/2021 | Li et al. |
| 11,063,063 | B2 | 7/2021 | Zhang et al. |
| 11,101,288 | B2 | 8/2021 | Zhang et al. |
| 11,177,280 | B1 | 11/2021 | Rajashekhar et al. |
| 11,244,953 | B2 | 2/2022 | Kanakamedala et al. |
| 11,244,958 | B2 | 2/2022 | Cui et al. |
| 11,289,416 | B2 | 3/2022 | Tsutsumi et al. |
| 2008/0251851 | A1* | 10/2008 | Pan .................. H10D 84/0167 257/E29.345 |
| 2010/0163968 | A1* | 7/2010 | Kim .................. H10B 43/10 257/E21.423 |
| 2012/0120728 | A1* | 5/2012 | Kim .................. G11C 5/063 257/315 |
| 2014/0284695 | A1* | 9/2014 | Won .................. H10D 30/696 257/324 |
| 2016/0149002 | A1* | 5/2016 | Sharangpani .......... H10B 43/35 257/314 |
| 2016/0225866 | A1* | 8/2016 | Peri .................. H10D 30/693 |
| 2016/0351497 | A1 | 12/2016 | Peri et al. |
| 2016/0379989 | A1 | 12/2016 | Sharangpani et al. |
| 2017/0125436 | A1 | 5/2017 | Sharangpani et al. |
| 2018/0374866 | A1 | 12/2018 | Makala et al. |
| 2020/0020715 | A1 | 1/2020 | Nakamura et al. |
| 2020/0051993 | A1 | 2/2020 | Rabkin et al. |
| 2020/0395310 | A1 | 12/2020 | Mukae et al. |
| 2021/0159167 | A1 | 5/2021 | Tsutsumi et al. |
| 2021/0265372 | A1 | 8/2021 | Kanakamedala et al. |
| 2021/0265385 | A1 | 8/2021 | Rajashekhar et al. |
| 2021/0335805 | A1 | 10/2021 | Kai et al. |
| 2021/0335999 | A1 | 10/2021 | Kai et al. |
| 2022/0052073 | A1 | 2/2022 | Kitazawa et al. |
| 2022/0059462 | A1 | 2/2022 | Said et al. |
| 2022/0102379 | A1* | 3/2022 | Liao .................. H10B 51/30 |
| 2022/0109003 | A1 | 4/2022 | Nagahata et al. |

OTHER PUBLICATIONS

Zheng, L. et al., "Zheng et. al., Area-Selective Atomic Layer Deposition of TiN Using Trimethoxy(octadecyl)silane as a Passivation Layer," *Langmuir* 2020, vol. 36, No. 44, pp. 13144-1315, (2020); https://doi.org/10.1021/acs.langmuir.0c00741.

U.S. Appl. No. 17/155,541, filed Jan. 22, 2021, SanDisk Technologies LLC.
U.S. Appl. No. 17/192,603, filed Mar. 4, 2021, SanDisk Technologies LLC.
U.S. Appl. No. 17/192,668, filed Mar. 4, 2021, SanDisk Technologies LLC.
U.S. Appl. No. 17/317,442, filed May 11, 2021, SanDisk Technologies LLC.
U.S. Appl. No. 17/345,831, filed Jun. 11, 2021, SanDisk Technologies LLC.
U.S. Appl. No. 17/345,860, filed Jun. 11, 2021, SanDisk Technologies LLC.
U.S. Appl. No. 17/348,305, filed Jun. 15, 2021, SanDisk Technologies LLC.
U.S. Appl. No. 17/348,328, filed Jun. 15, 2021, SanDisk Technologies LLC.
U.S. Appl. No. 17/351,756, filed Jun. 18, 2021, SanDisk Technologies LLC.
U.S. Appl. No. 17/351,789, filed Jun. 18, 2021, SanDisk Technologies LLC.
U.S. Appl. No. 17/351,811, filed Jun. 18, 2021, SanDisk Technologies LLC.
U.S. Appl. No. 17/378,196, filed Jul. 16, 2021, SanDisk Technologies LLC.
U.S. Appl. No. 17/406,493, filed Aug. 19, 2021, SanDisk Technologies LLC.
U.S. Appl. No. 17/587,470, filed Jan. 28, 2022, SanDisk Technologies LLC.
U.S. Appl. No. 17/587,518, filed Jan. 28, 2022, SanDisk Technologies LLC.
U.S. Appl. No. 17/655,827, filed Mar. 22, 2022, SanDisk Technologies LLC.
U.S. Appl. No. 17/663,055, filed May 12, 2022, SanDisk Technologies LLC.

* cited by examiner

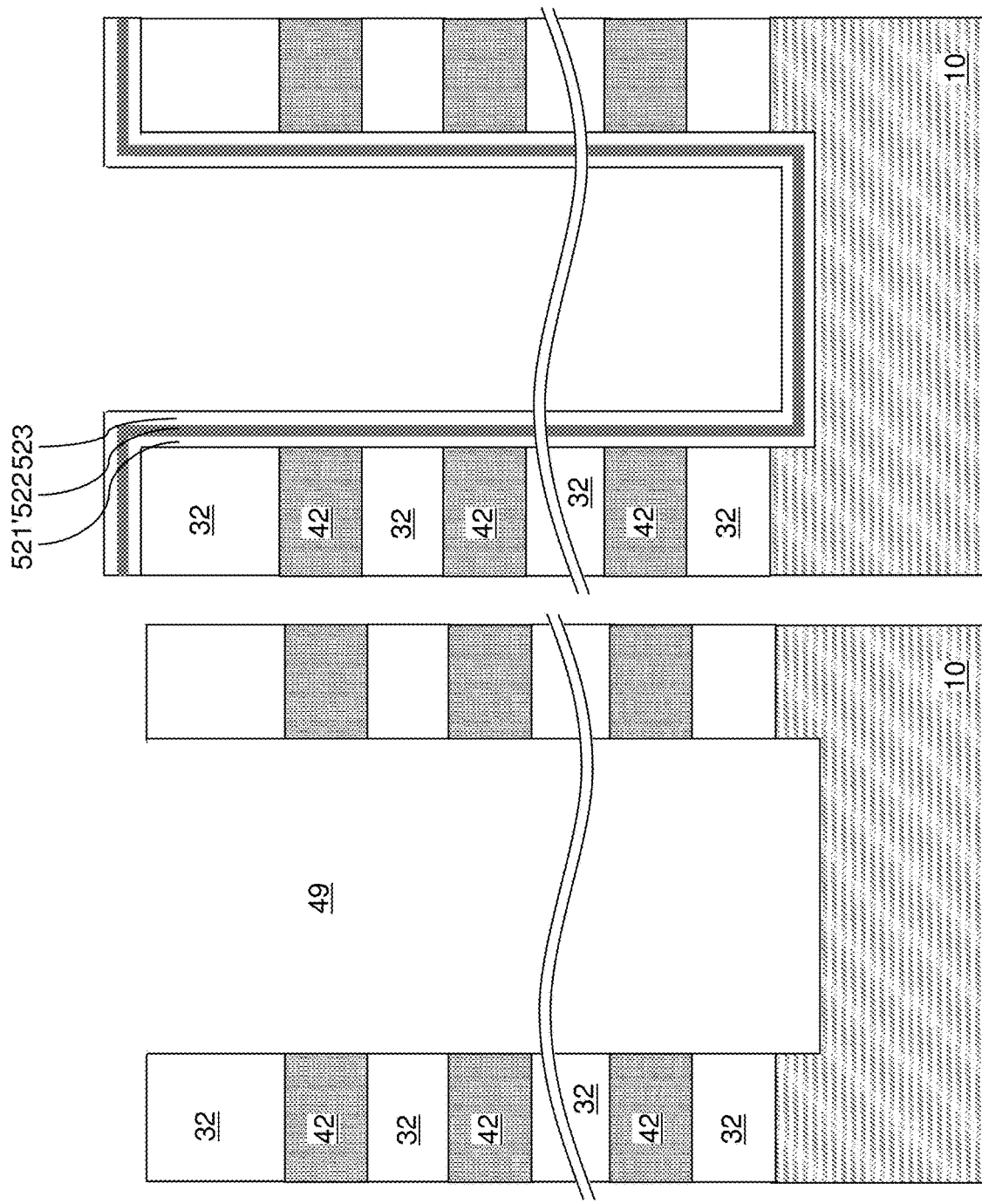

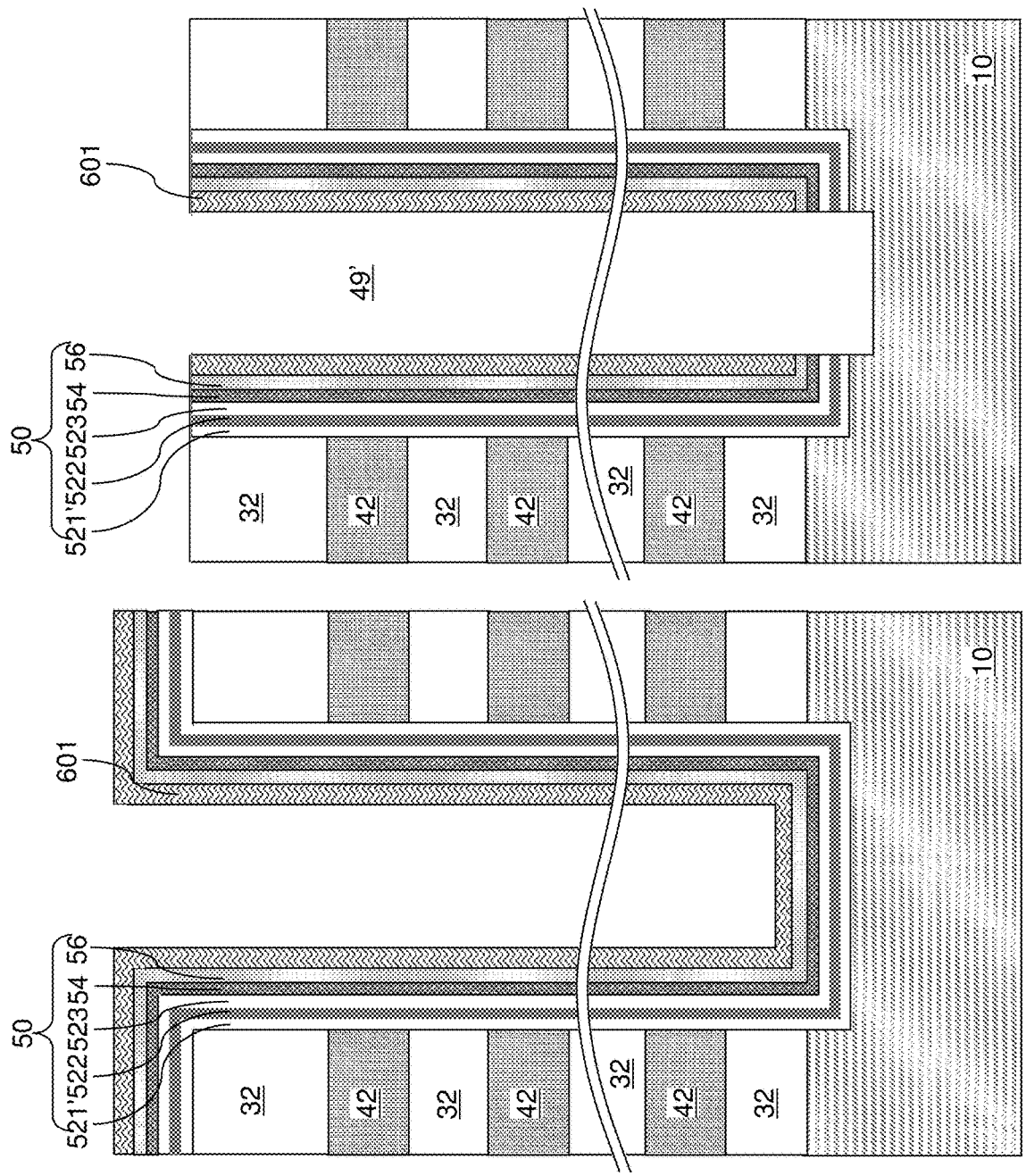

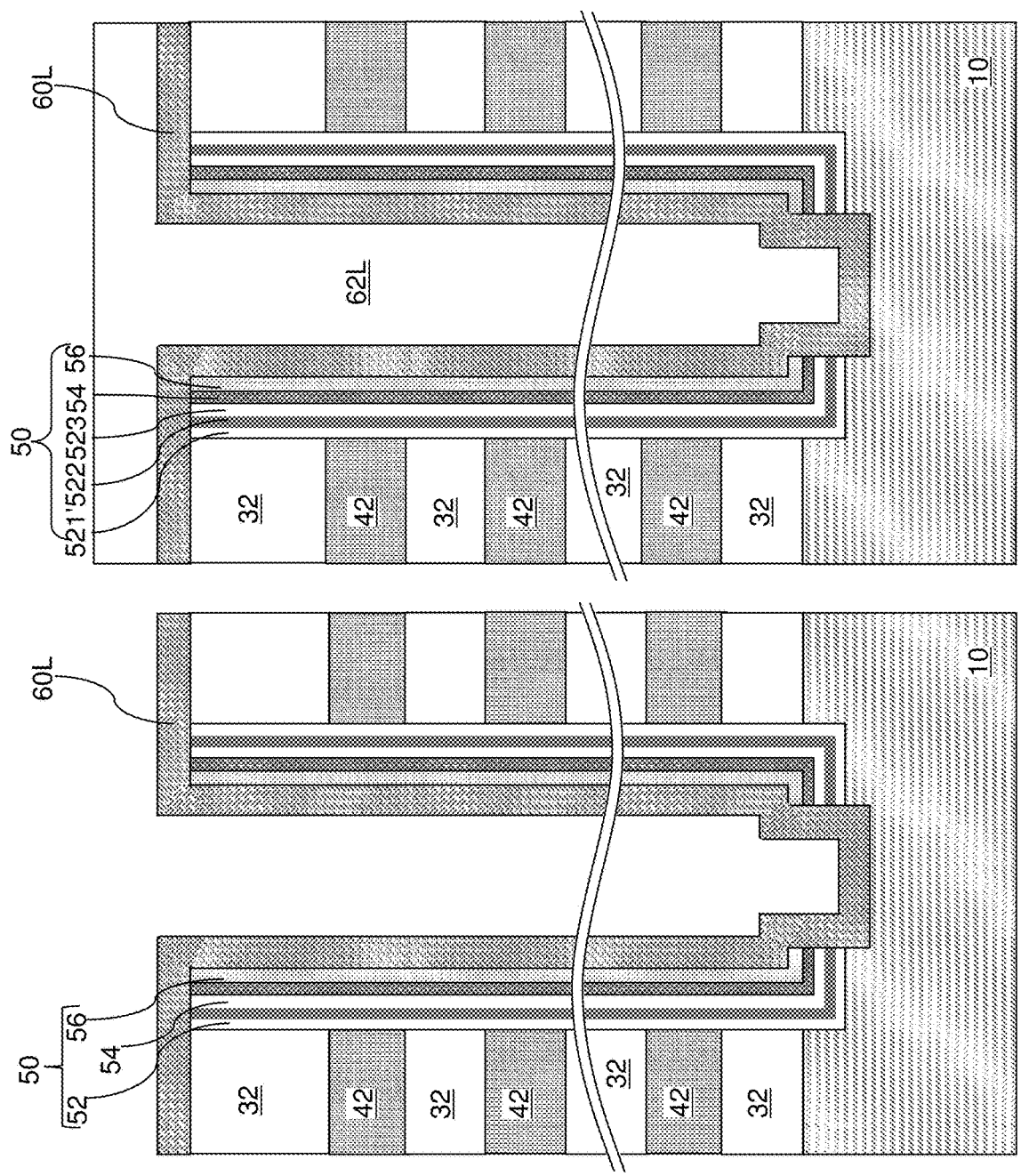

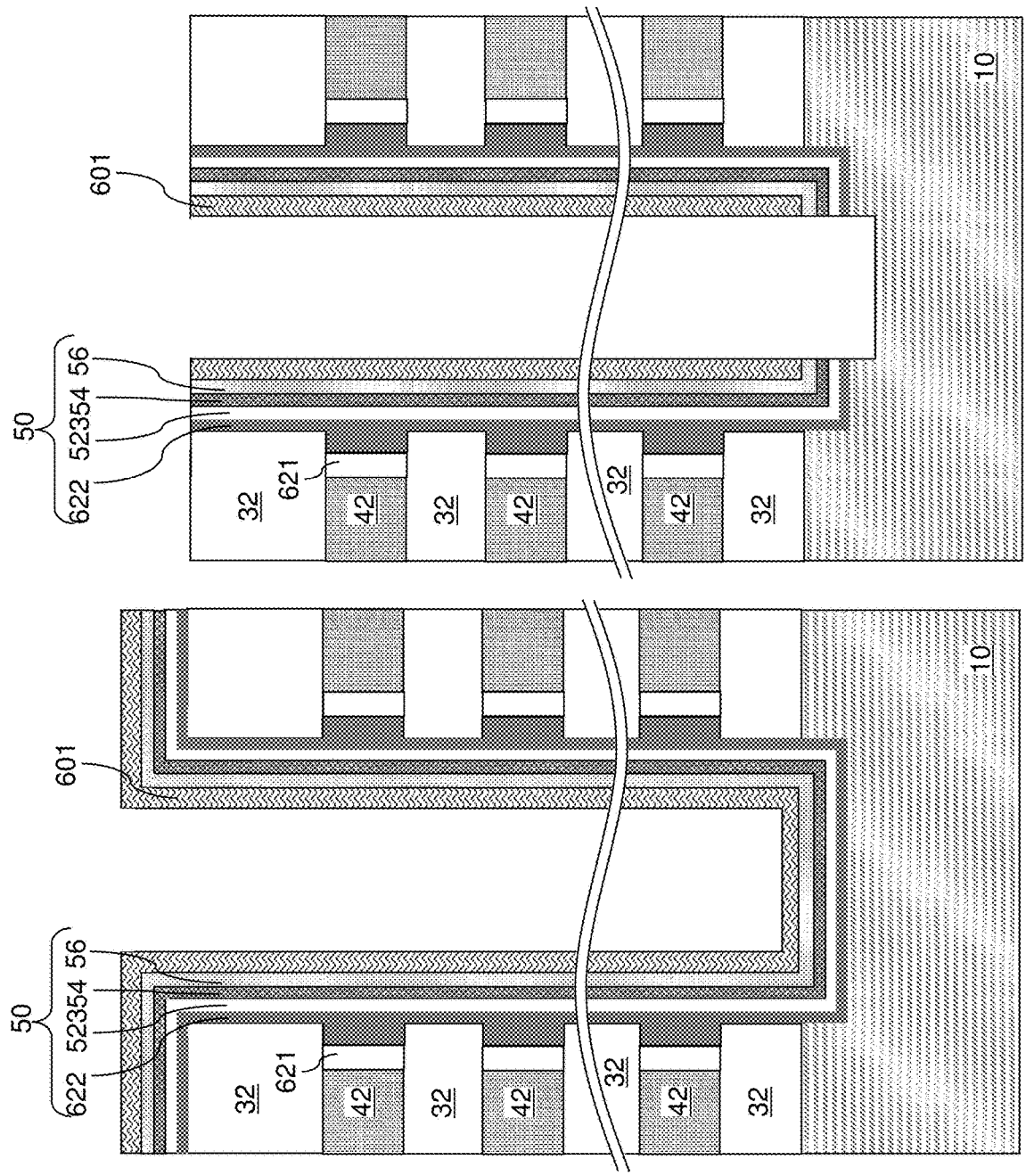

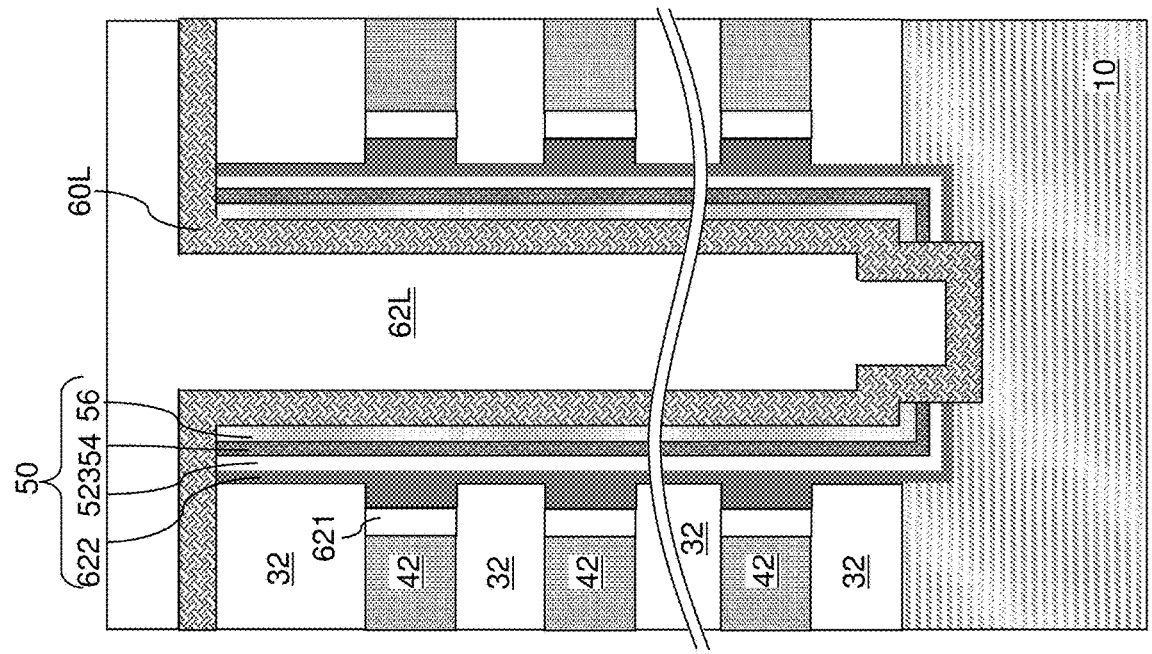
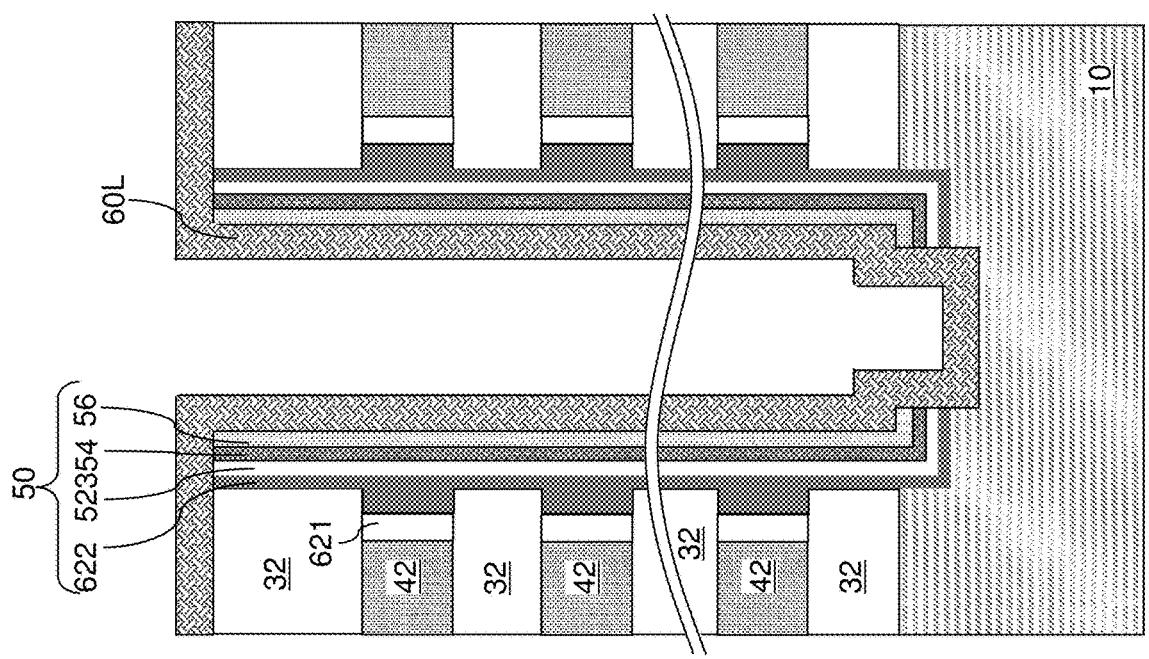

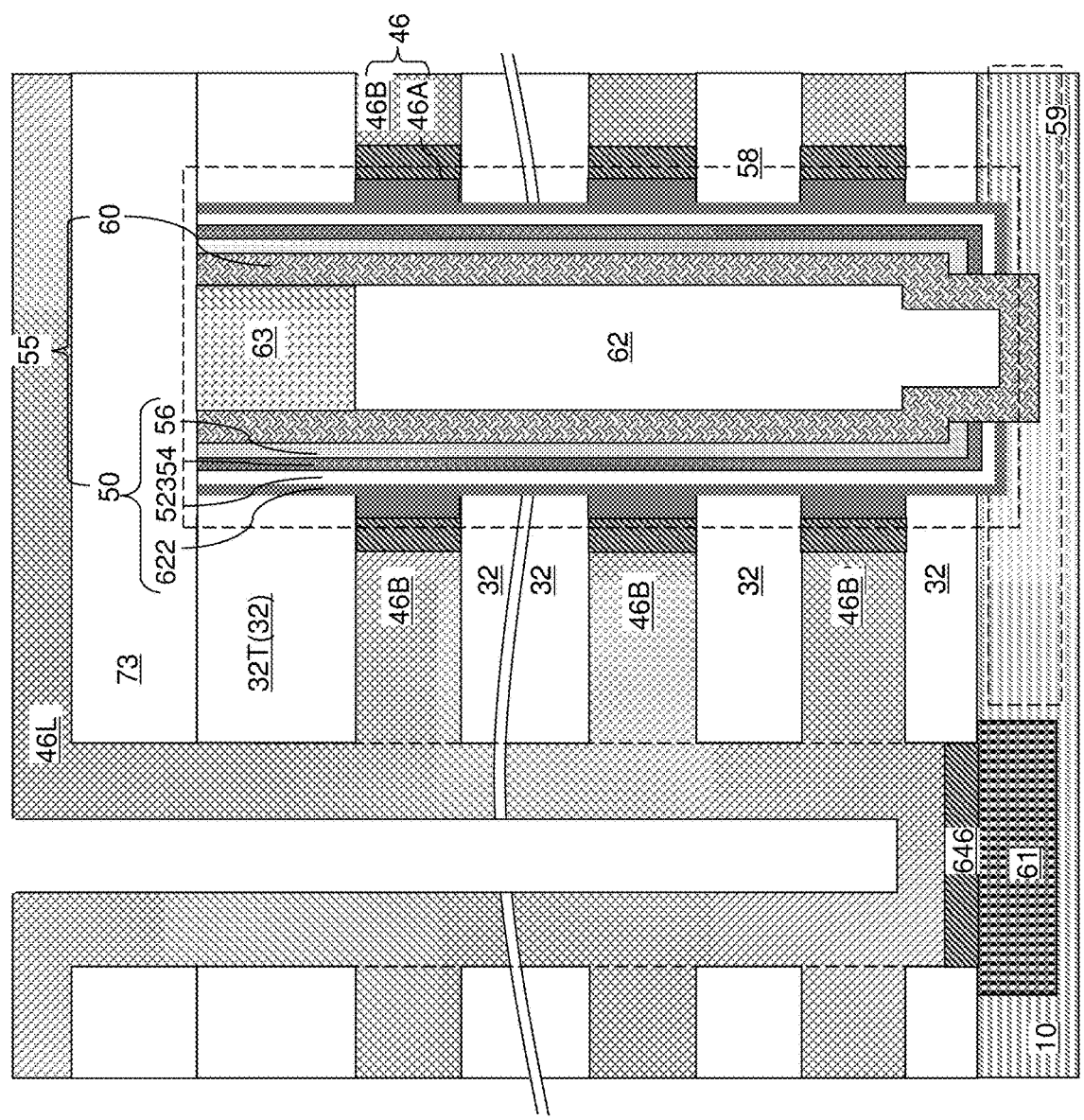

THREE-DIMENSIONAL MEMORY DEVICE AND METHOD OF MAKING THEREOF USING SELECTIVE METAL NITRIDE DEPOSITION ON DIELECTRIC METAL OXIDE BLOCKING DIELECTRIC

FIELD

The present disclosure relates generally to the field of semiconductor devices, and particularly to a three-dimensional memory device including electrically conductive layers formed by selective metal nitride deposition on dielectric metal oxide blocking dielectric, and methods for manufacturing the same.

BACKGROUND

Three-dimensional vertical NAND strings having one bit per cell are disclosed in an article by T. Endoh et al., titled "Novel Ultra High-Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers, a memory opening vertically extending through the alternating stack, and a memory opening fill structure located in the memory opening and including a set of dielectric-metal-oxide blocking dielectric portions located at levels of the electrically conductive layers, a memory material layer, and a vertical semiconductor channel. Each of the electrically conductive layers includes a tubular metal nitride portion and a metal fill material portion, each of the tubular metal nitride portions laterally surrounds and contacts a respective one of the dielectric-metal-oxide blocking dielectric portions, and each metal fill material portion either contacts respective overlying and underlying insulating layers of the insulating layers, or contacts respective upper and lower metal nitride liner portions which have a smaller thickness than the tubular metal nitride portions.

According to another aspect of the present disclosure, a method of forming a three-dimensional memory device is provided, which comprises: forming an alternating stack of insulating layers and sacrificial material layers over a substrate; forming a memory opening through the alternating stack; forming a memory opening fill structure in the memory opening, wherein the memory opening fill structure comprises a set of dielectric-metal-oxide blocking dielectric portions located at levels of the sacrificial material layers, a memory material layer, and a vertical semiconductor channel; forming backside recesses by removing the sacrificial material layers; forming a metal nitride liner within each of the backside recesses by performing a selective deposition process which grows a metal nitride material from physically exposed surfaces of the set of dielectric-metal-oxide blocking dielectric portions in the backside recesses while suppressing or retarding growth of the metal nitride material from surfaces of the insulating layers; and forming a metal fill material portion within each remaining volume of the backside recesses.

BRIEF DESCRIPTION OF THE DRAWINGS

FIGS. 5A-5H are sequential schematic vertical cross-sectional views of a memory opening within the first exemplary structure during formation of a memory stack structure, an optional dielectric core, and a drain region therein according to the first embodiment of the present disclosure.

FIGS. 12A-12J are sequential schematic vertical cross-sectional views of a memory opening within a third exemplary structure during formation of a memory stack structure, an optional dielectric core, and a drain region therein according to a third embodiment of the present disclosure.

FIGS. 13A-13F are sequential vertical cross-sectional views of a region of the third exemplary structure during formation of electrically conductive layers and backside trench fill structures according to the third embodiment of the present disclosure.

DETAILED DESCRIPTION

Figure 1:
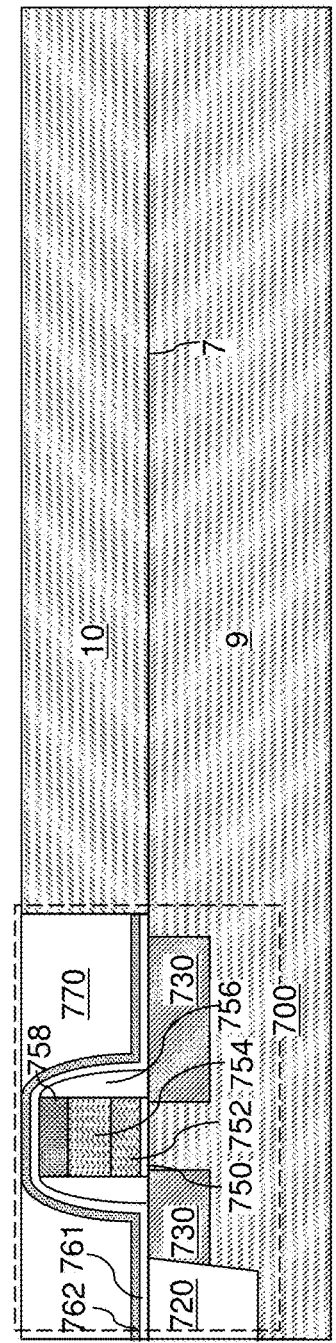
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to a three-dimensional memory device including electrically conductive layers containing a diffusion barrier formed by selective metal nitride deposition on dielectric metal oxide blocking dielectric, and methods for manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 (e.g., silicon wafer) and an optional semiconductor material layer 10 (e.g., doped well in the silicon wafer or an epitaxial silicon layer on the silicon wafer). The substrate can have a major surface 7, which can be, for example, a topmost surface of the substrate semiconductor layer 9. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. A dielectric material such as silicon oxide can be deposited over the at least one semiconductor device, and can be subsequently planarized to form a planarization dielectric layer 770. Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
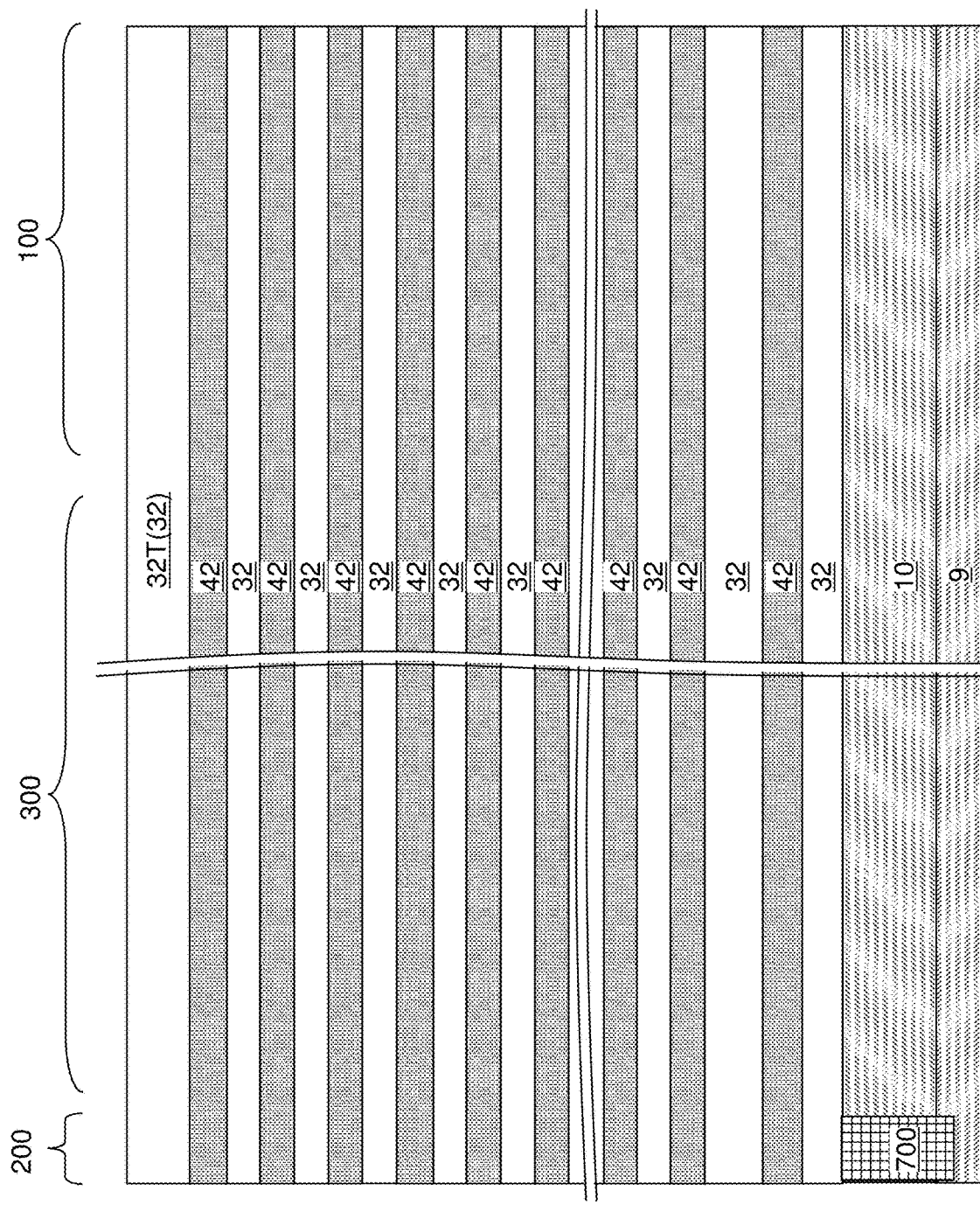
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes an in-process alternating stack of insulating layers 32 and sacrificial material layers 42. As used herein, a "prototype" structure or an "in-process" structure refers to a transient structure that is subsequently modified in the shape or composition of at least one component therein.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

While an embodiment is described in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

The topmost layer of the alternating stack (32, 42) may comprise an insulating layer 32, which is herein referred to as a topmost insulating layer 32T. The topmost insulating layer 32T includes a dielectric material that is different from the material of the sacrificial material layers 42. In one embodiment, the topmost insulating layer 32T can include a dielectric material that can be employed for the insulating layers 32 as described above. The topmost insulating layer 32T can have a greater thickness than each of the insulating layers 32. The topmost insulating layer 32T can be deposited, for example, by chemical vapor deposition. In one embodiment, the topmost insulating layer 32T can be a silicon oxide layer.

Figure 3:
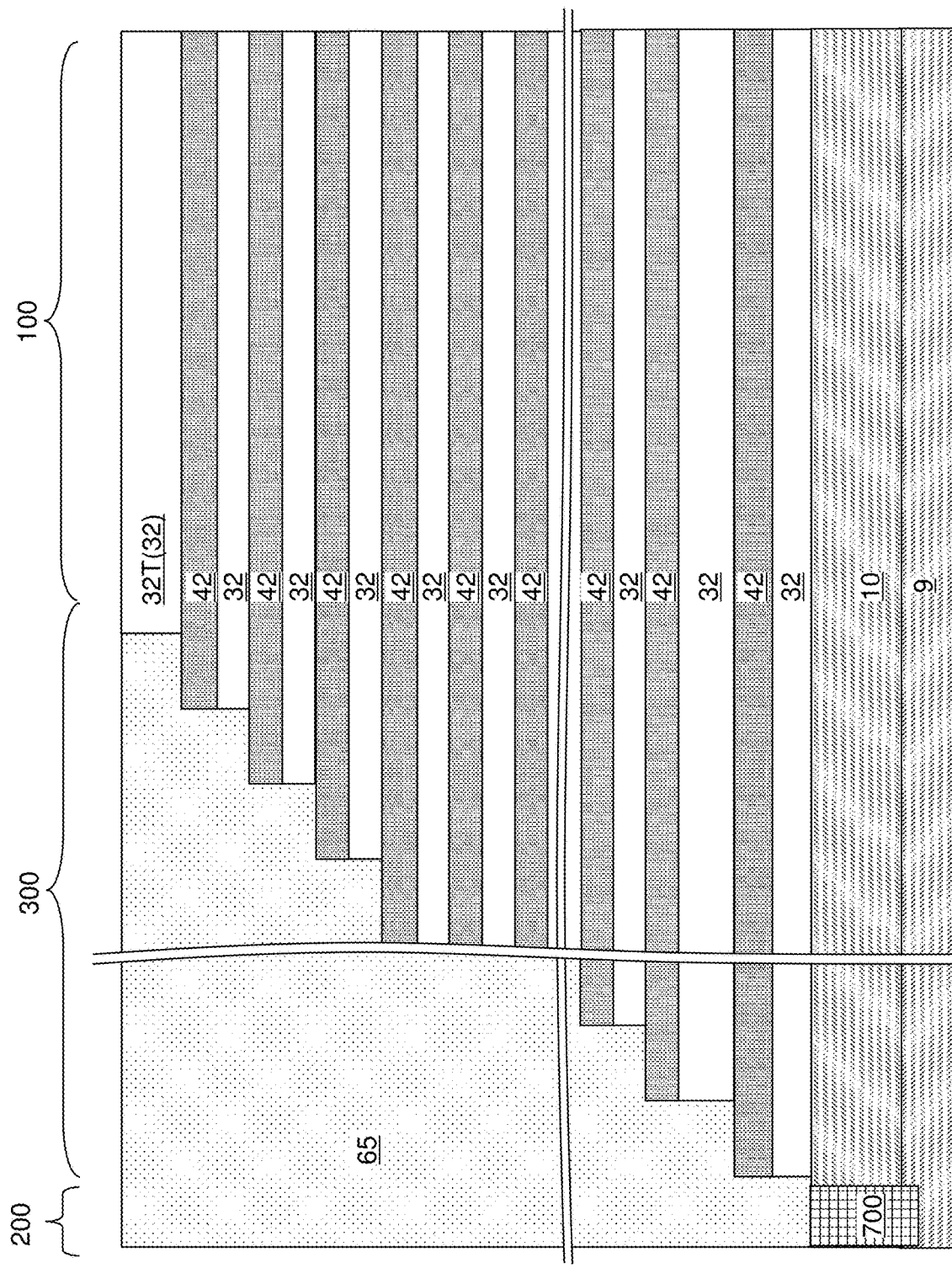
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the topmost insulating layer 32T and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the topmost insulating layer 32T.

Figure 4A:
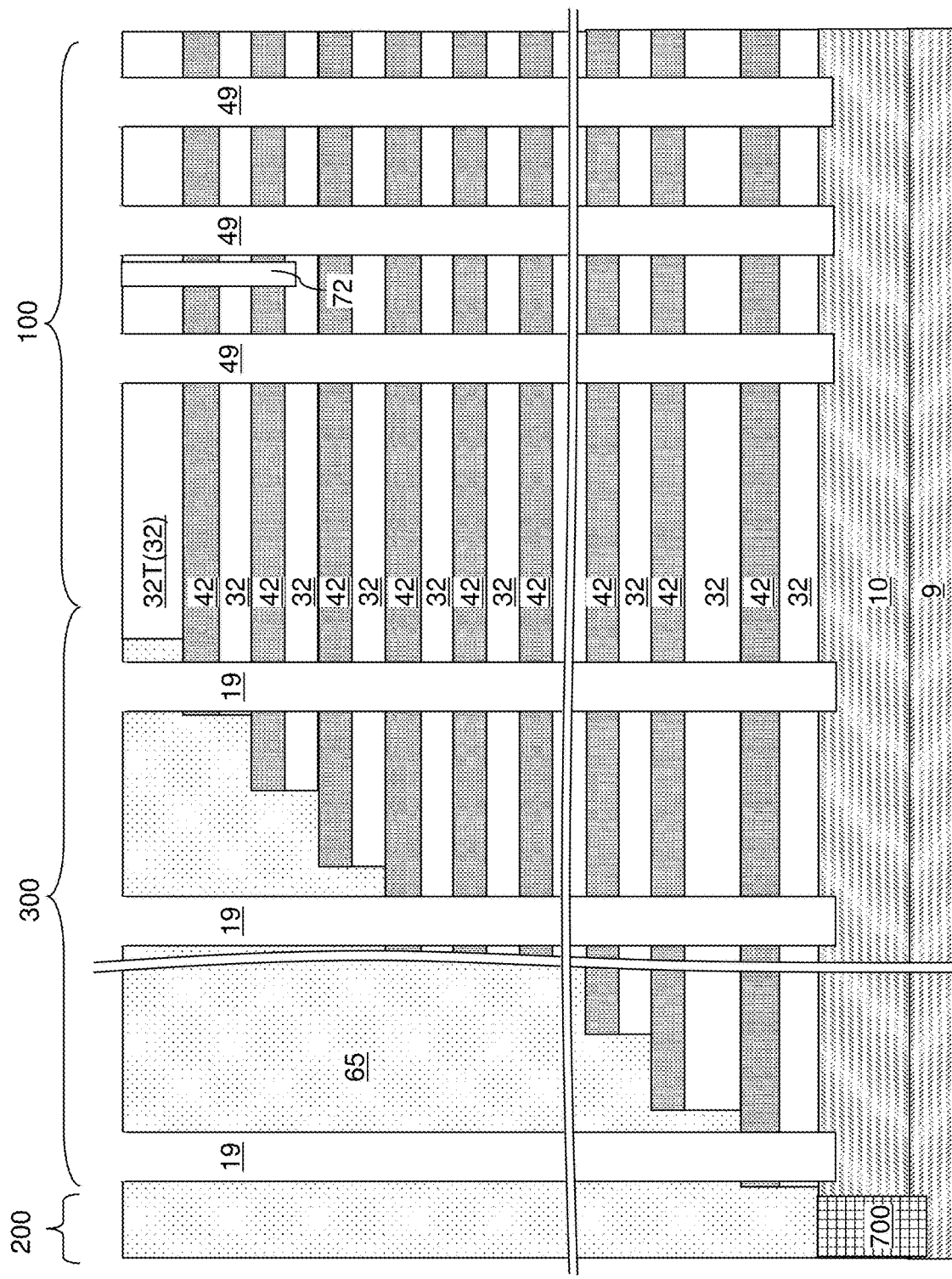
FIG. 4A is a schematic vertical cross-sectional view of the first exemplary structure after formation of memory openings and support openings according to the first embodiment of the present disclosure.
Figure 4B:
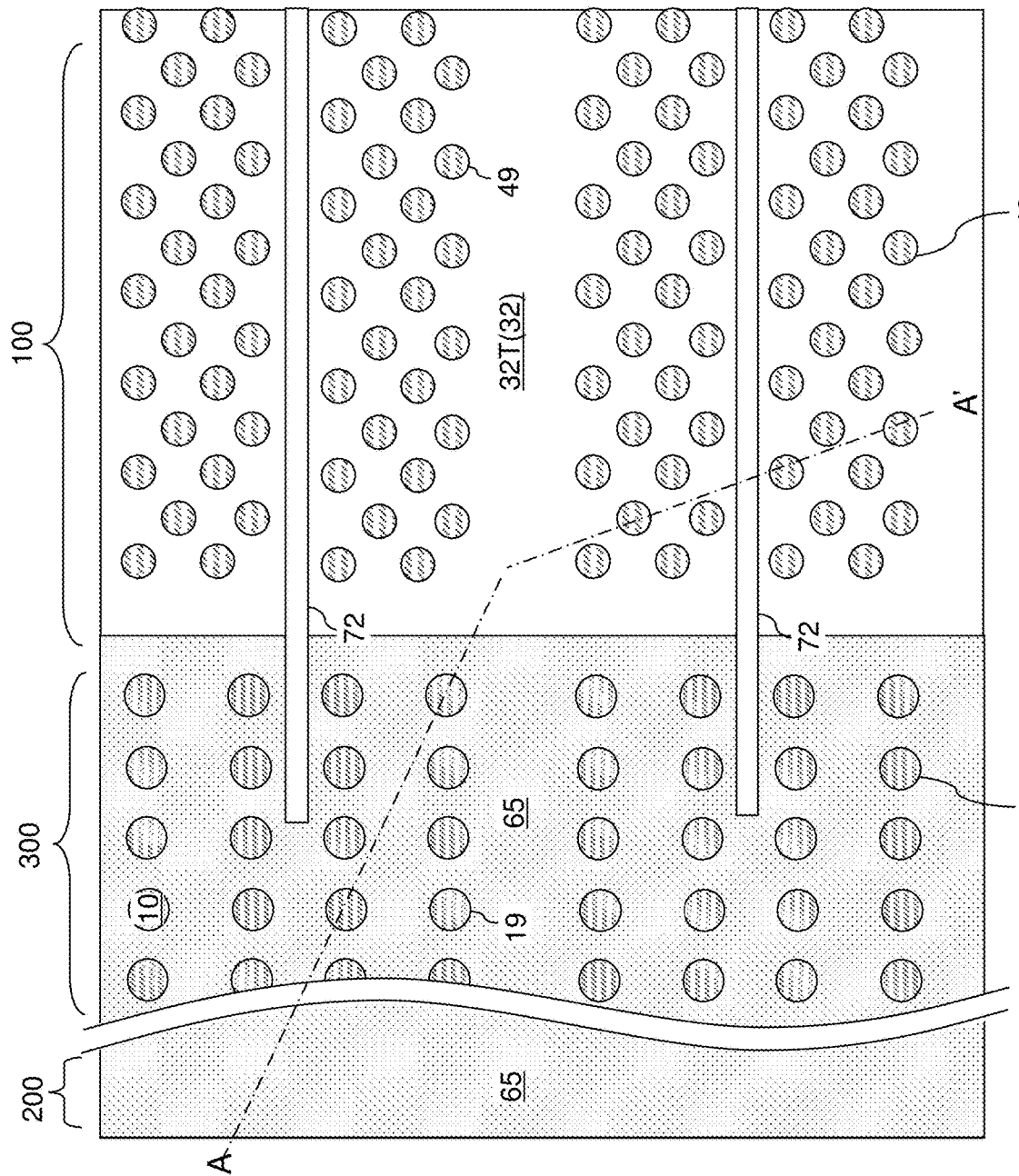
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the topmost insulating layer 32T or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the topmost insulating layer 32T, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, a stack of layers including an optional dielectric liner layer 521', a continuous dielectric-metal-oxide blocking dielectric layer 522, and a silicon oxide blocking dielectric layer 523 can be sequentially deposited in the memory openings 49 by a respective conformal deposition process.

The optional dielectric liner layer 521' comprise a dielectric material such as silicon oxide. The dielectric liner layer 521' may have a thickness in a range from 1 nm to 10 nm, such as from 2 nm to 6 nm, although lesser and greater thicknesses may also be employed. The optional dielectric liner layer 521' may function as an etch stop layer during a subsequent etching step to be described below.

The continuous dielectric-metal-oxide blocking dielectric layer 522 comprises a dielectric metal oxide material such as aluminum oxide or a dielectric transition metal oxide, such as hafnium oxide or lanthanum oxide. Preferably, the dielectric-metal-oxide blocking dielectric layer 522 comprises aluminum oxide, such as stoichiometric alumina (i.e., $Al_2O_3$). The thickness of the continuous dielectric-metal-oxide blocking dielectric layer 522 may be in a range from 1 nm to 10 nm, such as from 2 nm to 6 nm, although lesser and greater thicknesses may also be employed.

The silicon oxide blocking dielectric layer 523 comprises silicon oxide. The thickness of the silicon oxide blocking dielectric layer 523 may be in a range from 1 nm to 10 nm, such as from 2 nm to 6 nm, although lesser and greater thicknesses may also be employed. In an alternative embodiment, the silicon oxide blocking dielectric layer 523 may be omitted.

Referring to FIG. 5C, a memory material layer 54, an inner dielectric liner 56, and an optional sacrificial cover material layer 601 can be sequentially deposited over the silicon oxide blocking dielectric layer 523. The memory material layer 54 comprises a memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed. As used herein, a first surface and a second surface are vertically coincident with each other if the second surface overlies or underlies the first surface, and if there exists a vertical plane that contains the first surface and the second surface. The vertical plane may be a Euclidean plane or a curved plane that extends straight along a vertical direction and having a contoured profile in a horizontal cross-sectional view.

The inner dielectric liner 56 includes a dielectric material. In one embodiment, the inner dielectric liner 56 comprises a tunneling dielectric layer through which charge tunneling can be performed under suitable electrical bias conditions. The inner dielectric liner 56 can include silicon oxide, silicon nitride, silicon oxynitride, dielectric metal oxide (such as aluminum oxide or hafnium oxide), dielectric metal oxynitride, dielectric metal silicates, alloys thereof, and/or combinations thereof. In one embodiment, the inner dielectric liner 56 can include a stack of a first silicon oxide layer, a silicon oxynitride layer, and a second silicon oxide layer, which is commonly known as an ONO stack. In one embodiment, the inner dielectric liner 56 can include a silicon oxide layer that is substantially free of carbon or a silicon oxynitride layer that is substantially free of carbon. The thickness of the inner dielectric liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

The combination of the dielectric liner layer 521', the continuous dielectric-metal-oxide blocking dielectric layer 522, the silicon oxide blocking dielectric layer 523, the memory material layer 54, and the inner dielectric liner 56 in each memory opening 50 constitutes a memory film 50.

Referring to FIG. 5D, horizontally-extending portions of the optional sacrificial cover material layer 601, the dielectric material liner 56, the memory material layer 54, the silicon oxide blocking dielectric layer 523, the continuous dielectric-metal-oxide blocking dielectric layer 522, and the dielectric liner layer 521' can be removed by performing at least one anisotropic etch process. The portions of the sacrificial cover material layer 601, the dielectric material liner 56, the memory material layer 54, the silicon oxide blocking dielectric layer 523, the continuous dielectric-metal-oxide blocking dielectric layer 522, and the dielectric liner layer 521' located above the top surface of the topmost insulating layer 32T can be removed by the at least one anisotropic etch process. Further, the horizontal portions of the sacrificial cover material layer 601, the dielectric material liner 56, the memory material layer 54, the silicon oxide blocking dielectric layer 523, the continuous dielectric-metal-oxide blocking dielectric layer 522, and the dielectric liner layer 521' at a bottom of each memory cavity 49' can be removed to form openings in remaining portions thereof. Each of the sacrificial cover material layer 601, the dielectric material liner 56, the memory material layer 54, the silicon oxide blocking dielectric layer 523, the continuous dielectric-metal-oxide blocking dielectric layer 522, and the dielectric liner layer 521' can be etched by a respective anisotropic etch process employing a respective etch chemistry, which may, or may not, be the same for the various material layers. A memory cavity 49' is present within each memory opening 49.

In one embodiment, the sacrificial cover material layer 601, the dielectric material liner 56, the memory material layer 54, the silicon oxide blocking dielectric layer 523, the continuous dielectric-metal-oxide blocking dielectric layer 522, and the dielectric liner layer 521' can have vertically coincident sidewalls at the bottom of the memory opening 49 around a physically exposed recessed surface segment of the semiconductor material layer 10. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the semiconductor material layer 10, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
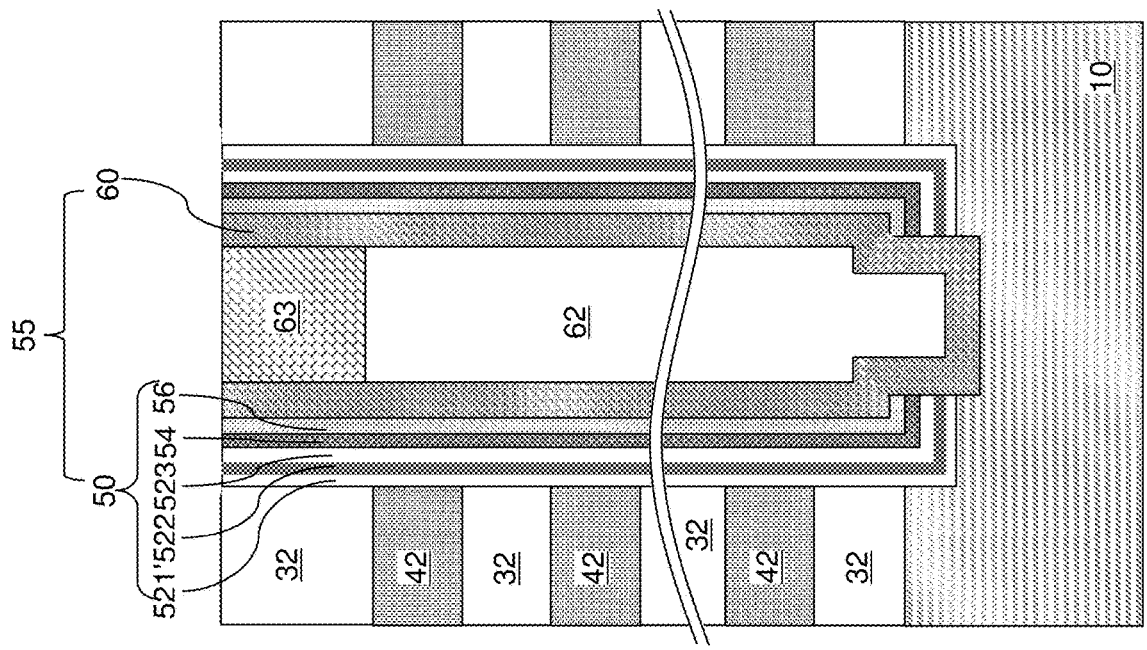
Figure 5G:
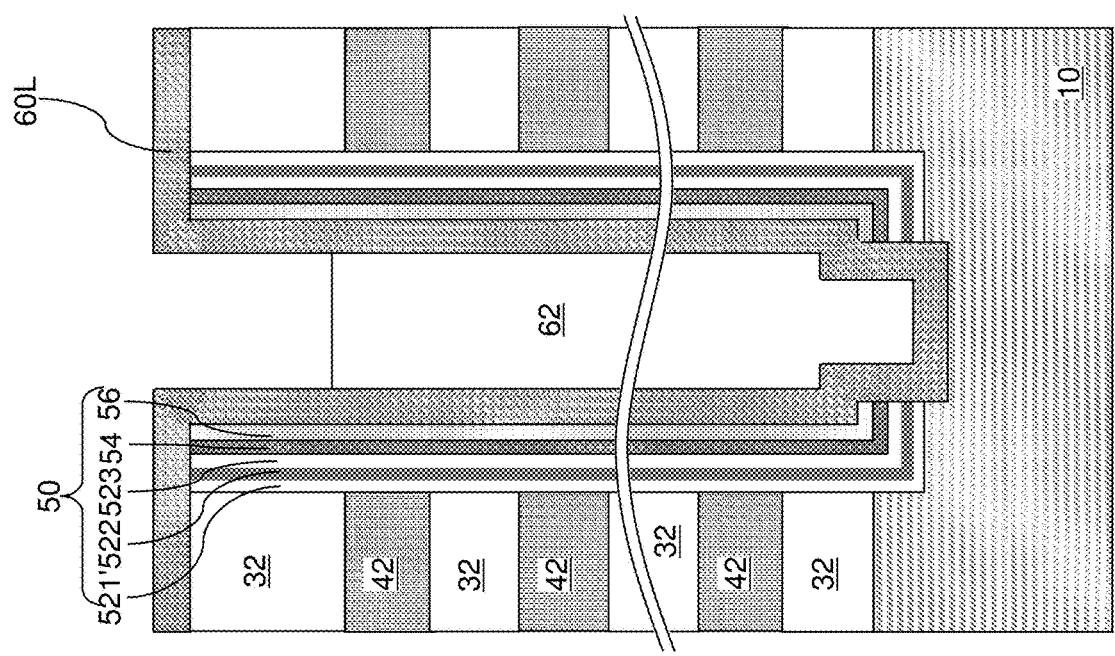

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the topmost insulating layer 32T. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{19}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the memory film 50.

Each combination of a memory film 50 and a vertical semiconductor channel 60 within a memory opening 49 constitutes a memory stack structure 55. An entire set of material portions that fills a memory opening 49 is herein referred to as a memory opening fill structure 58. An entire set of material portions that fills a support opening 19 constitutes a support pillar structure. Generally, a memory opening fill structure 58 can be formed in each memory opening 49. The memory opening fill structure 58 comprises a memory film 50, a vertical semiconductor channel 60, an optional dielectric core 62, and a drain region 63.

According to an embodiment of the present disclosure, each memory film 50 comprises a set of dielectric-metal-oxide blocking dielectric portions (comprising portions of a continuous dielectric-metal-oxide blocking dielectric layer 522) located at levels of the sacrificial material layers 42. In one embodiment, the dielectric-metal-oxide blocking dielectric portions may consist essentially of aluminum oxide or a dielectric transition metal oxide. The continuous dielectric-metal-oxide blocking dielectric layer 522 vertically extends continuously through each sacrificial material layer 42 within the alternating stack (32, 42).

In one embodiment, each continuous dielectric-metal-oxide blocking dielectric layer 522 comprises a straight inner sidewall that vertically extends through each layer within the alternating stack (32, 42). In one embodiment, each continuous dielectric-metal-oxide blocking dielectric layer 522 comprises a straight outer sidewall that vertically extends through each layer within the alternating stack (32, 42). In one embodiment, the entirety of the continuous dielectric-metal-oxide blocking dielectric layer 522 in each memory opening fill structure 58 may have a uniform thickness throughout.

Figure 6:
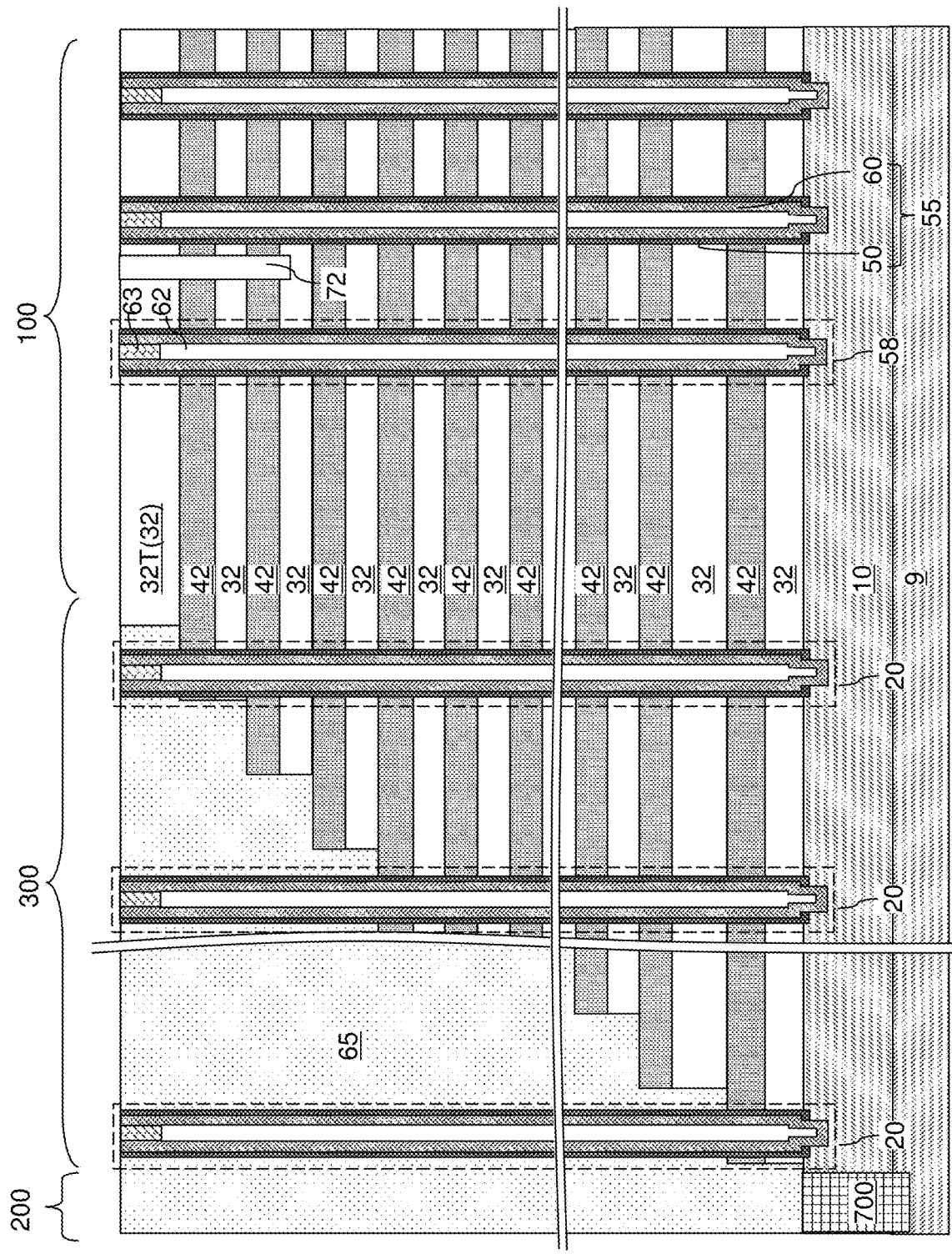
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner (e.g., tunneling dielectric) 56 laterally surrounding the vertical semiconductor channel 60, a vertical stack of charge storage regions (comprising portions of the memory material layer 54) laterally surrounding the dielectric material liner 56, and an optional blocking dielectric layer 52. While the illustrated configuration for the memory stack structure is described the above embodiment, the methods of the present disclosure can be applied to alternative memory stack structures including different layer stacks or structures for the memory film 50 and/or for the vertical semiconductor channel 60.

Figure 7A:
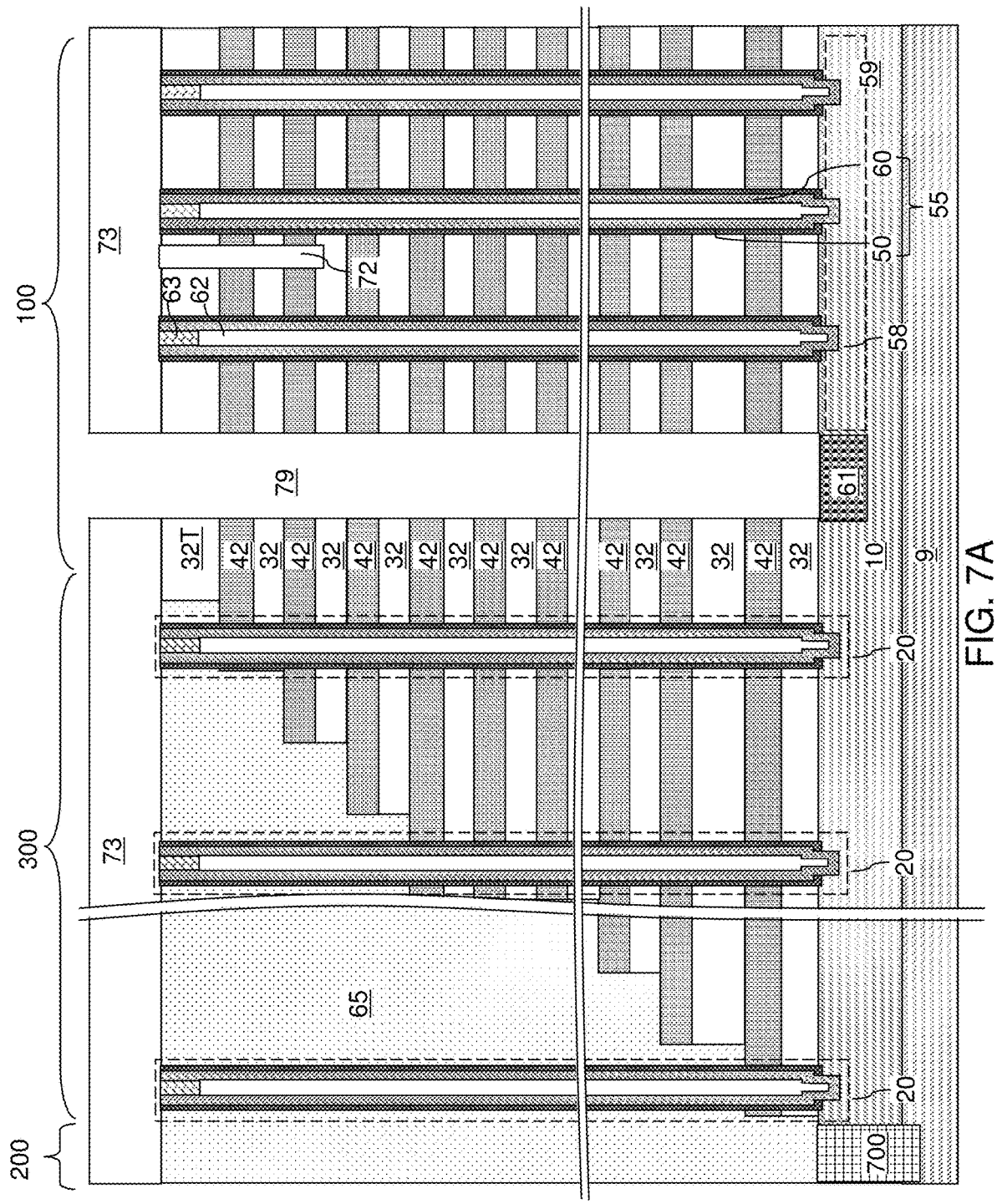
FIG. 7A is a schematic vertical cross-sectional view of the first exemplary structure after formation of backside trenches according to the first embodiment of the present disclosure.
Figure 7B:
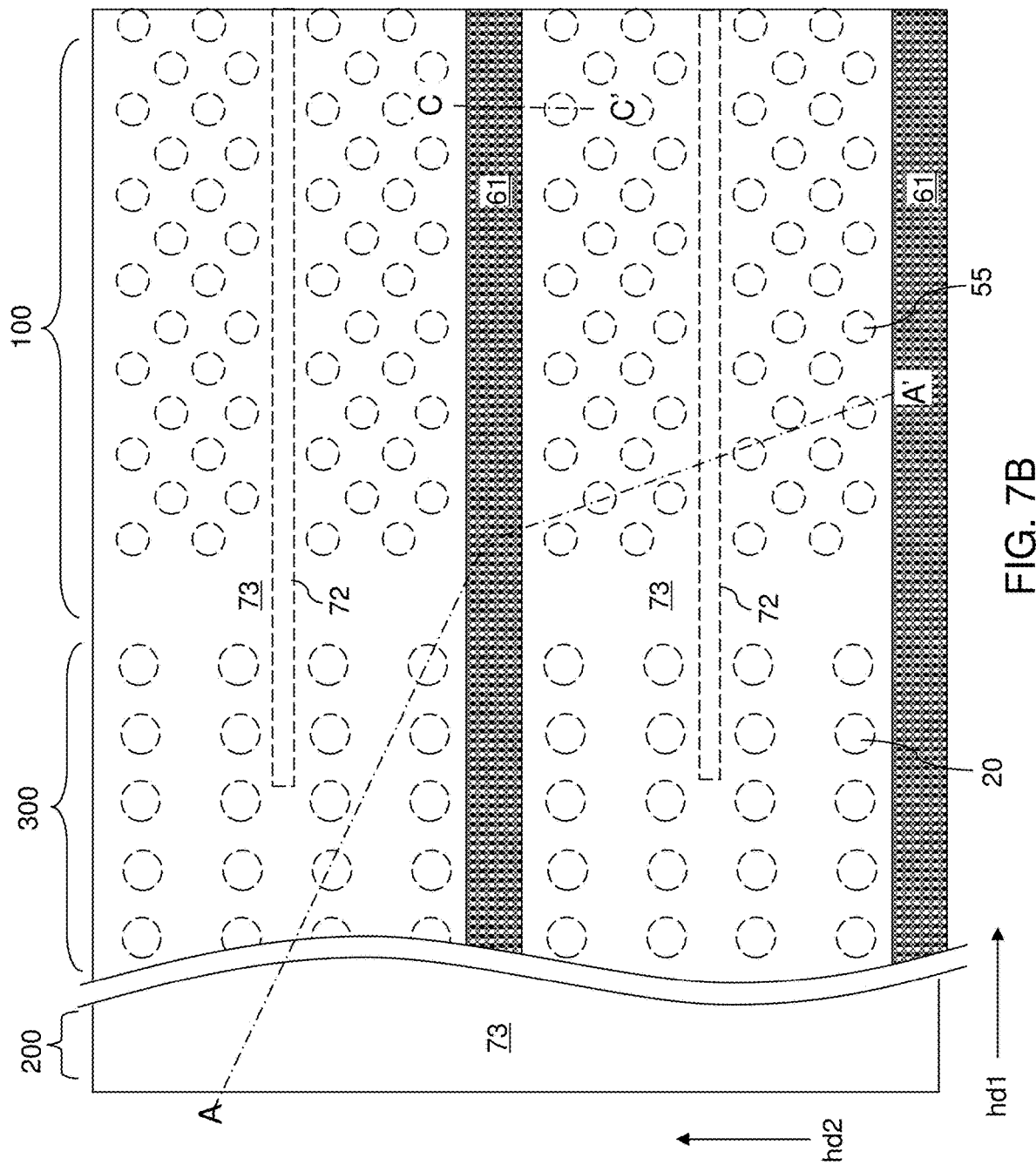
FIG. 7B is a partial see-through top-down view of the first exemplary structure of FIG. 7A. The vertical plane A-A' is the plane of the schematic vertical cross-sectional view of FIG. 7A.
Figure 7C:
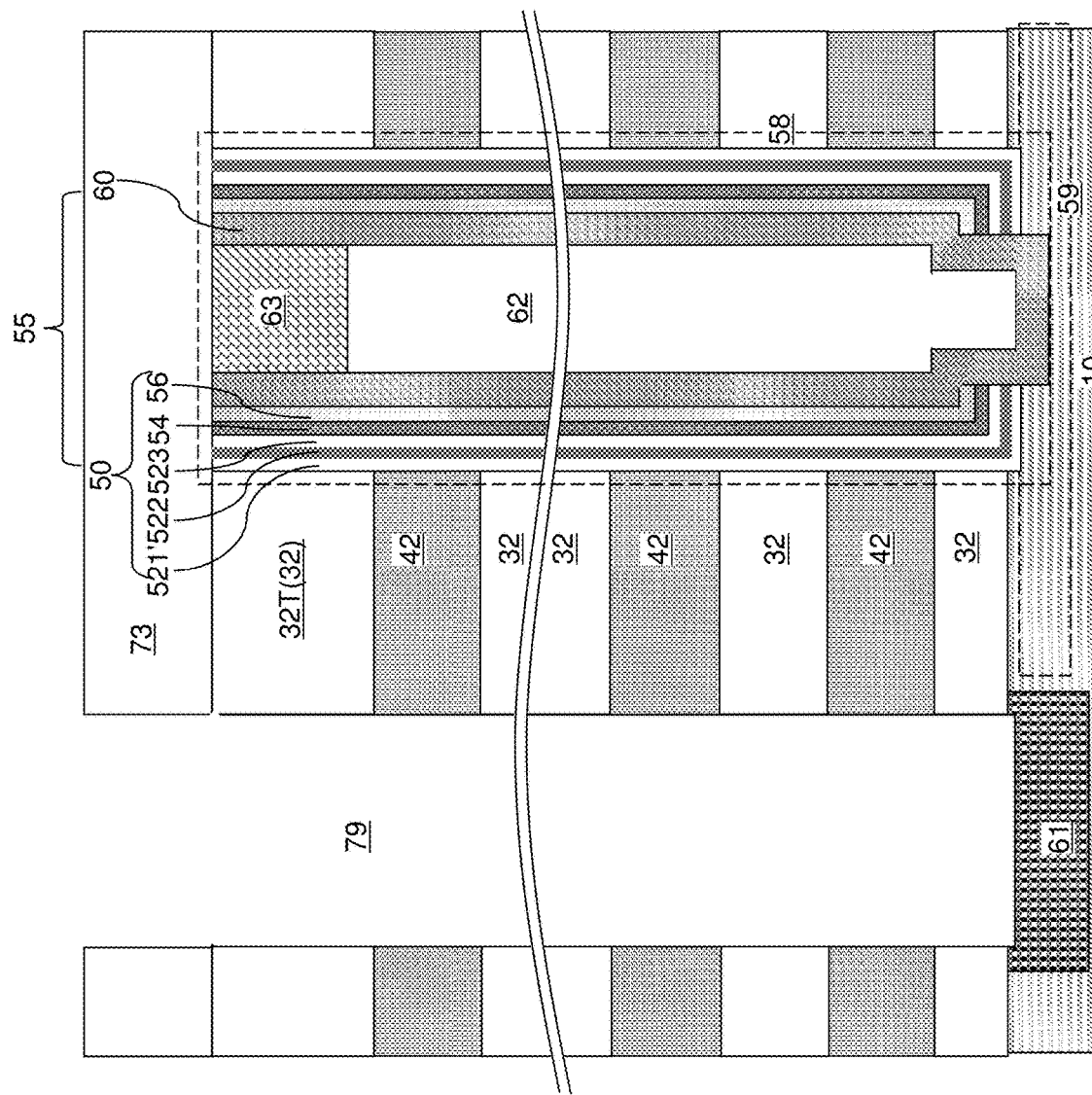
FIG. 7C is a vertical cross-sectional view of the first exemplary structure along the vertical plane C-C' of FIG. 7B.

Referring to FIGS. 7A-7C, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the vertical semiconductor channels 60 constitutes a horizontal semiconductor channel 59 for a plurality of field effect transistors.

Figure 8:
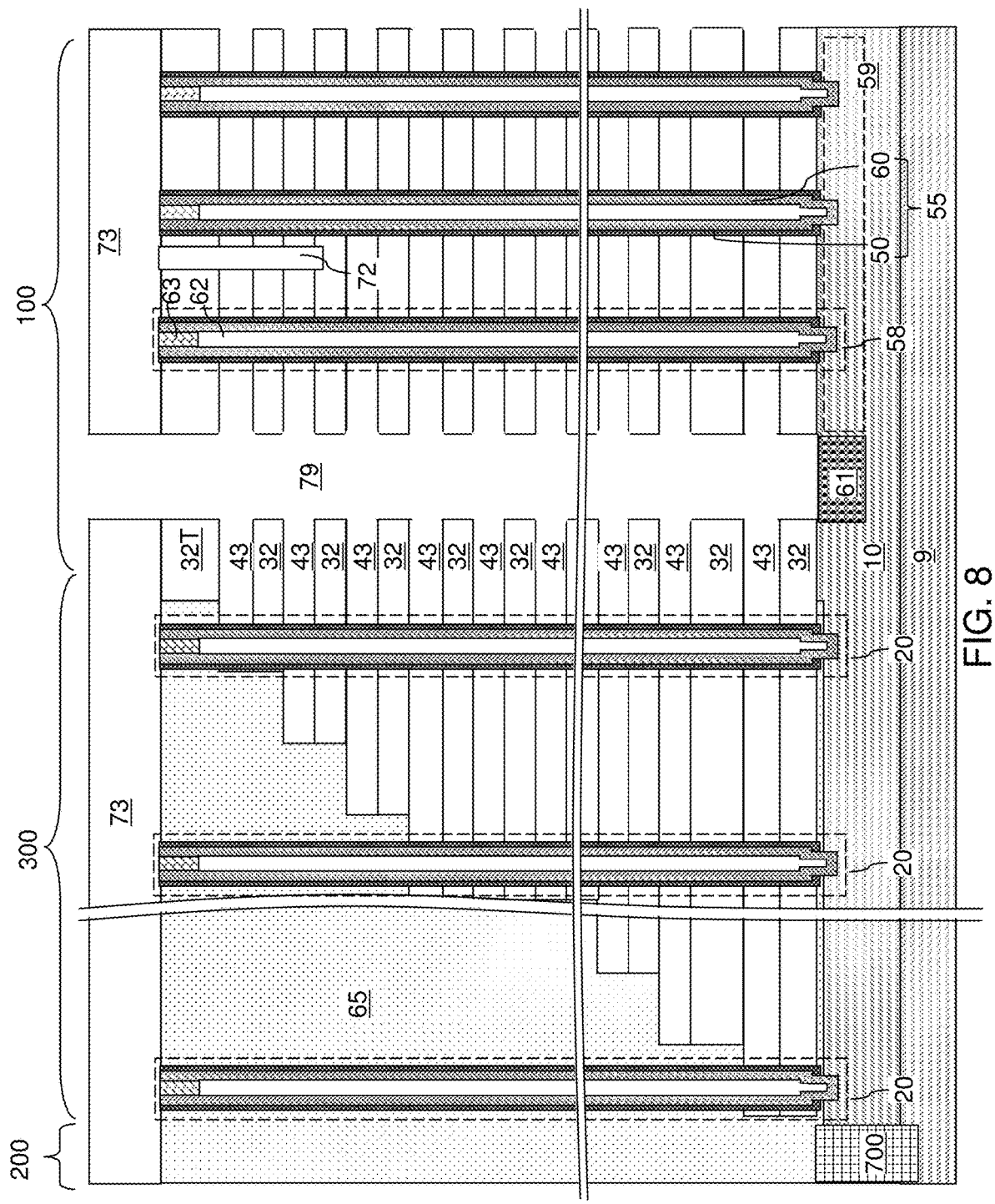
FIG. 8 is a schematic vertical cross-sectional view of the first exemplary structure after formation of backside recesses according to the first embodiment of the present disclosure.
Figure 9A:
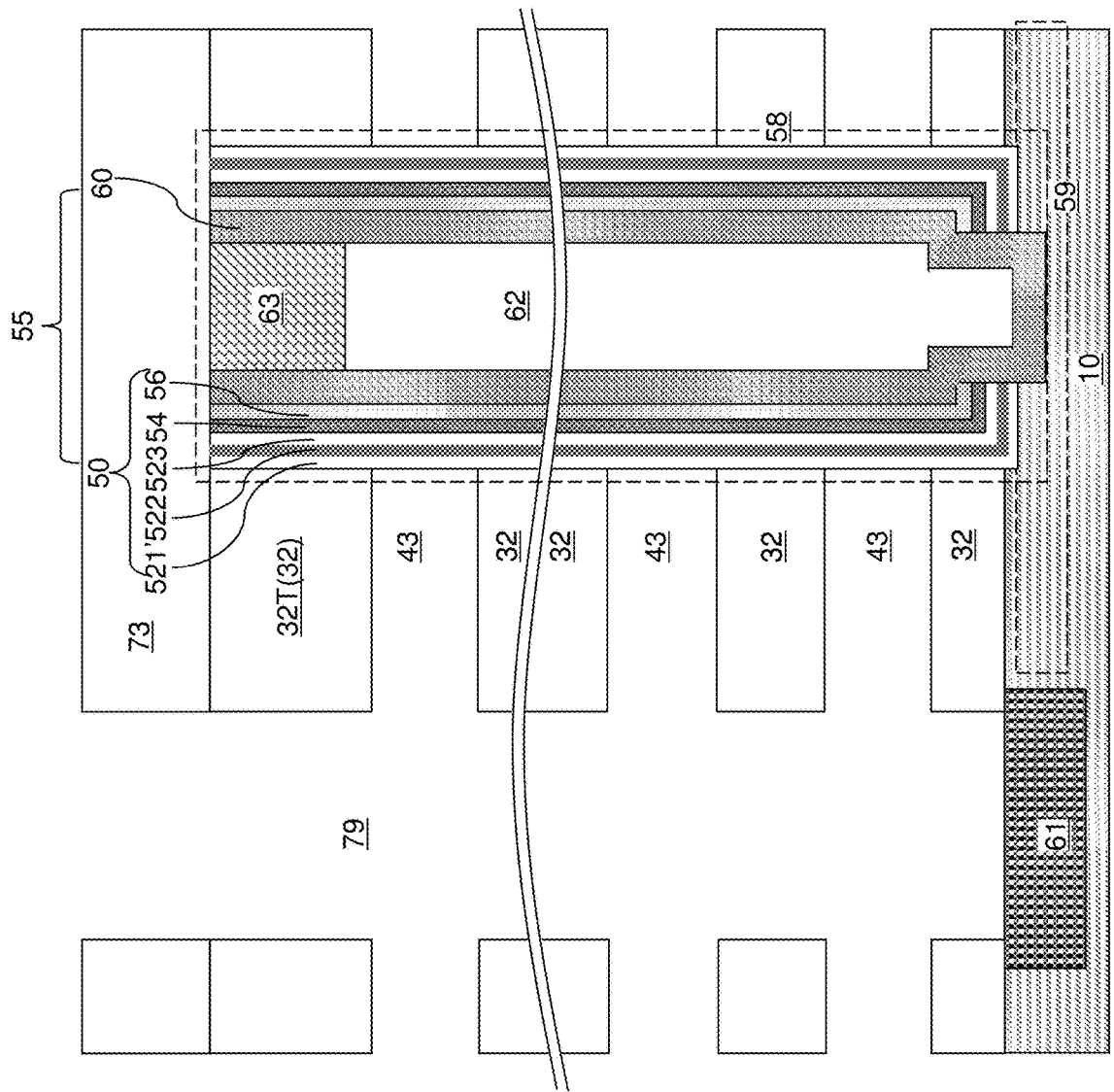
FIGS. 9A-9F are sequential vertical cross-sectional views of a region of the first exemplary structure during formation of electrically conductive layers and backside trench fill structures according to the first embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50 (such as the material of the dielectric liner layer 521'). In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 (such as the material of the dielectric liner layers 521' which acts as an etch stop layer) can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 9B:
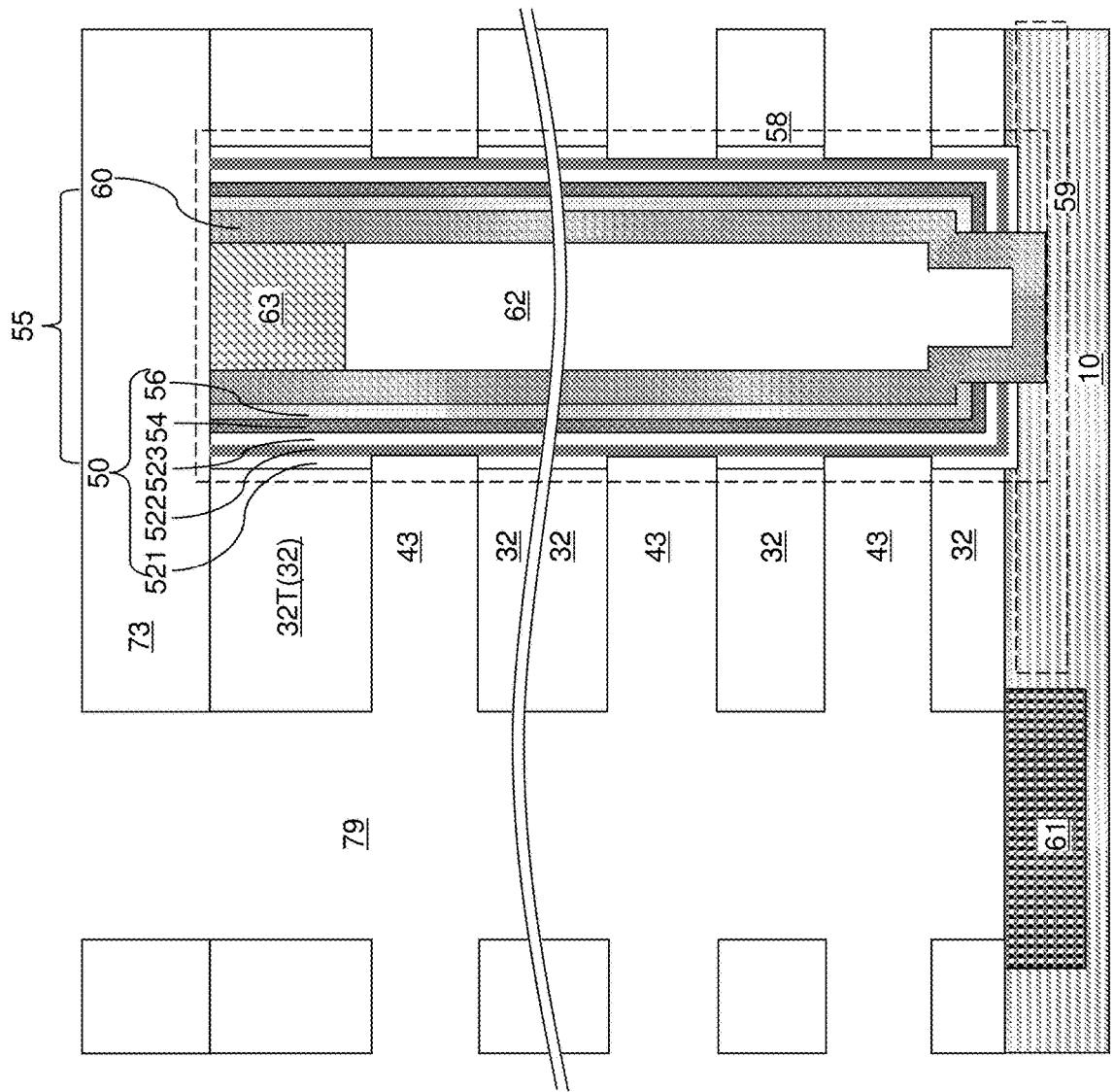

Referring to FIG. 9B, an isotropic etch process may be performed to remove portions of the dielectric liner layers 521' that are located at the levels of the backside recesses 43. Each dielectric liner layer 521' in a memory opening fill structure 58 may be divided into a vertical stack of tubular dielectric liners 521 laterally surrounding and contacting a respective continuous dielectric-metal-oxide blocking dielectric layer 522. The insulating layers 32 may be collaterally recessed by the isotropic etch process. In one embodiment, the isotropic etch process may comprise a wet etch process employing dilute hydrofluoric acid. Cylindrical surface segments of each continuous dielectric-metal-oxide blocking dielectric layer 522 can be physically exposed to the backside recesses 43 at each level of the backside recesses 43.

As discussed above, each continuous dielectric-metal-oxide blocking dielectric layer 522 comprises a respective set of dielectric-metal-oxide blocking dielectric portions that are located at the levels of the sacrificial material layers 42, and thus, are located at the levels of the backside recesses 43. Outer sidewalls of each set of dielectric-metal-oxide blocking dielectric portions (comprising portions of a respective continuous dielectric-metal-oxide blocking dielectric layer 522) are physically exposed to the backside recesses 43 upon division of each dielectric liner layer 521' into a vertical stack of tubular dielectric liners 521.

Figure 9C:
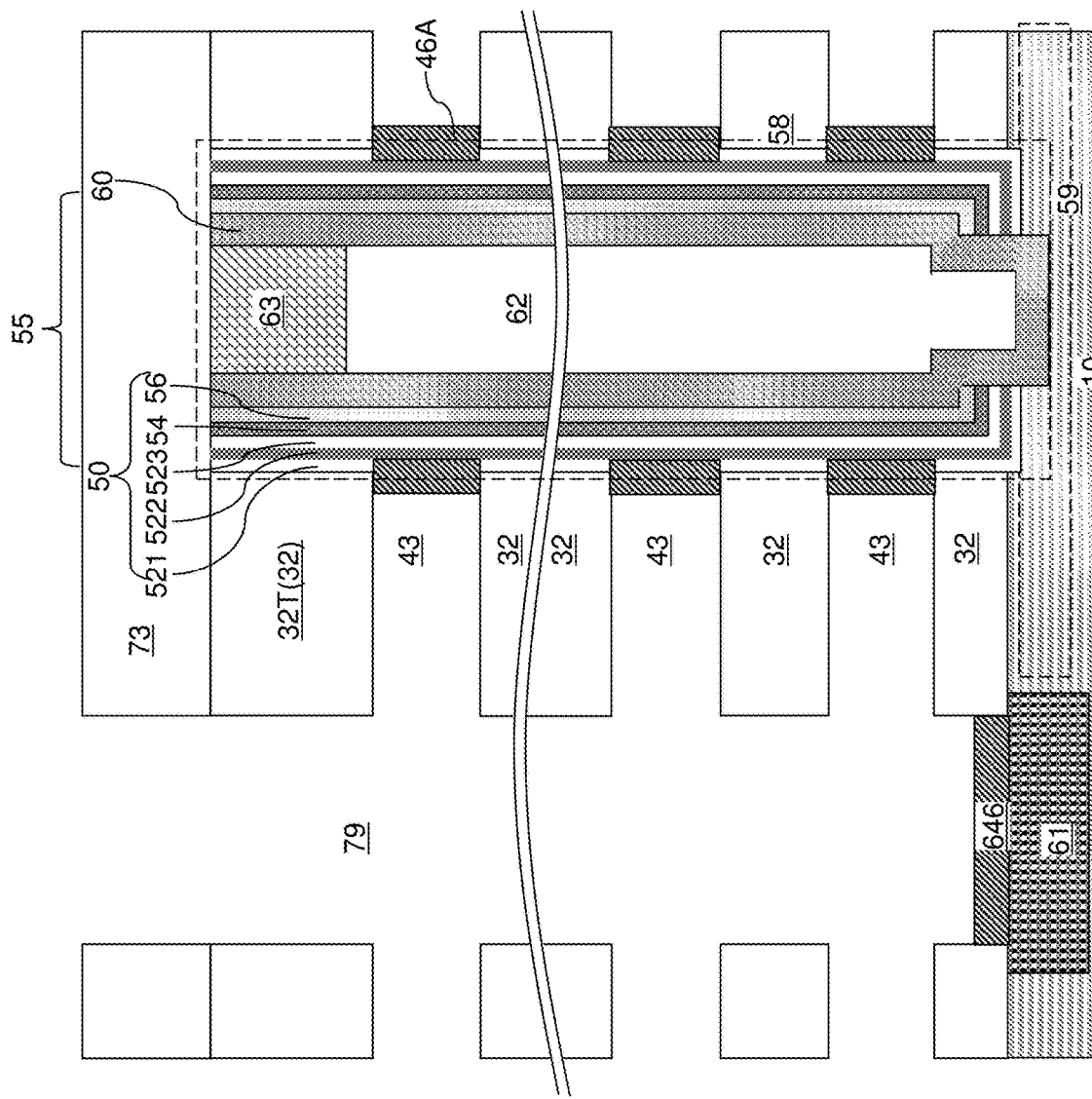

Referring to FIG. 9C and according to a first embodiment of the present disclosure, a selective deposition process is performed to grow an electrically conductive metal nitride material from physically exposed surface of each set of dielectric-metal-oxide blocking dielectric portions (comprising portions of a respective continuous dielectric-metal-oxide blocking dielectric layer 522) exposed in the backside recesses 43 while suppressing or retarding growth of the metal nitride material from physically exposed surfaces of the insulating layers 32 and the contact-level dielectric layer 73. A metal nitride liner 46A comprising the electrically conductive metal nitride material is formed within each of the backside recesses 43 directly on an outer sidewall of a respective dielectric-metal-oxide blocking dielectric portion (comprising a tubular portion of a respective continuous dielectric-metal-oxide blocking dielectric layer 522).

In one embodiment, the selective deposition process may suppress growth of the metal nitride material from physically exposed surfaces of the insulating layers 32 and the contact-level dielectric layer 73. In this case, the metal nitride material does not grow from physically exposed surfaces of the insulating layers 32 and the contact-level dielectric layer 73. In other words, the selective deposition process suppresses, i.e., prevents, growth of the metal nitride material from physically exposed surfaces of the insulating layers 32 and the contact-level dielectric layer 73, and horizontal surfaces of the insulating layers 32 are physically exposed after the selective deposition process. In one embodiment, the metal nitride material may comprise, and/or may consist essentially of, a metal nitride material selected from TiN, TaN, MoN, or WN. In one embodiment, each metal nitride liner 46A comprises a respective tubular metal nitride portions consisting essentially of a metal nitride material selected from TiN, TaN, MoN, or WN, and having a uniform thickness between an inner cylindrical sidewall and an outer cylindrical sidewall. In one embodiment, each metal nitride liner 46A comprises TiN. The outer cylindrical sidewall of each metal nitride liner 46A may vertically extend from a top surface of an underlying insulating layer 32 to a bottom surface of an overlying insulating layer 32. The thickness of each metal nitride liner 46A, as measured between an inner cylindrical sidewall and an outer cylindrical sidewall, may be in a range from 2 nm to 40 nm, such as from 4 nm to 30 nm, and/or from 6 nm to 20 nm, although lesser and greater thicknesses may also be employed.

In one embodiment, the selective deposition process that is employed to form the metal nitride liners 46A may comprise an area-selective atomic layer deposition process. An exemplary area-selective atomic layer deposition process for depositing a TiN layer is described, for example, in L. Zheng et al., Area-Selective Atomic Layer Deposition of TiN Using Trimethoxy(octadecyl)silane as a Passivation Layer, *Langmuir* 2020, 36, 44, 13144-13154, Oct. 26, 2020, incorporated herein by reference in its entirety. Generally, area-selective atomic layer deposition processes may be employed to grow a metal nitride material from dielectric metal oxide surfaces while suppressing or retarding growth of the metal nitride material from silicon oxide surfaces. In one embodiment, a metal nitride growth inhibitor, such as a self-assembled monolayer ("SAM") may be deposited on the surfaces of the silicon oxide insulating layers exposed in the backside recesses 43 without depositing the growth inhibitor on the respective dielectric-metal-oxide blocking dielectric portion (comprising a tubular portion of a respective continuous dielectric-metal-oxide blocking dielectric layer 522 exposed in the backside recesses 43). The SAM may comprise an organic layer having exposed $NH_2$, $CF_3$ and/or $CH_3$ groups which inhibit metal nitride deposition. For example, the SAM may comprise trimethoxy(octadecyl) silane.

The rate of growth of the metal nitride material on the SAM inhibitor covered silicon oxide surfaces may or may not be zero depending on the process parameters employed in an area-selective atomic layer deposition process. In an illustrative example, an area selective atomic layer deposition process employing a combination of $TiCl_4$ and $NH_3$ at a temperature of 250 to 400 degrees Celsius, such as 300 to 350 degrees Celsius can be employed to deposit a TiN liner 46A having a thickness in a range from 12 nm to 15 nm on surfaces of the respective dielectric-metal-oxide blocking dielectric portion (comprising a tubular portion of a respective continuous dielectric-metal-oxide blocking dielectric layer 522 exposed in the backside recesses 43), while the thickness of a TiN liner 46A deposited on the SAM inhibitor covered silicon oxide insulating layer 32 surfaces 0 to 2 nm. The SAM inhibitor layer is volatized during the liner 46A deposition, and is removed as an organic vapor from the deposition chamber.

In one embodiment, each metal nitride liner 46A located on a continuous dielectric-metal-oxide blocking dielectric layer 522 may be formed as a tubular metal nitride portion having a respective cylindrical inner sidewall that contacts an entirety of a cylindrical outer sidewall of a respective cylindrical surface segment of the outer sidewall of the continuous dielectric-metal-oxide blocking dielectric layer 522. In some embodiments, a planar metal nitride portion 646 may grow from the physically exposed surfaces of the source regions 61.

Figure 9D:
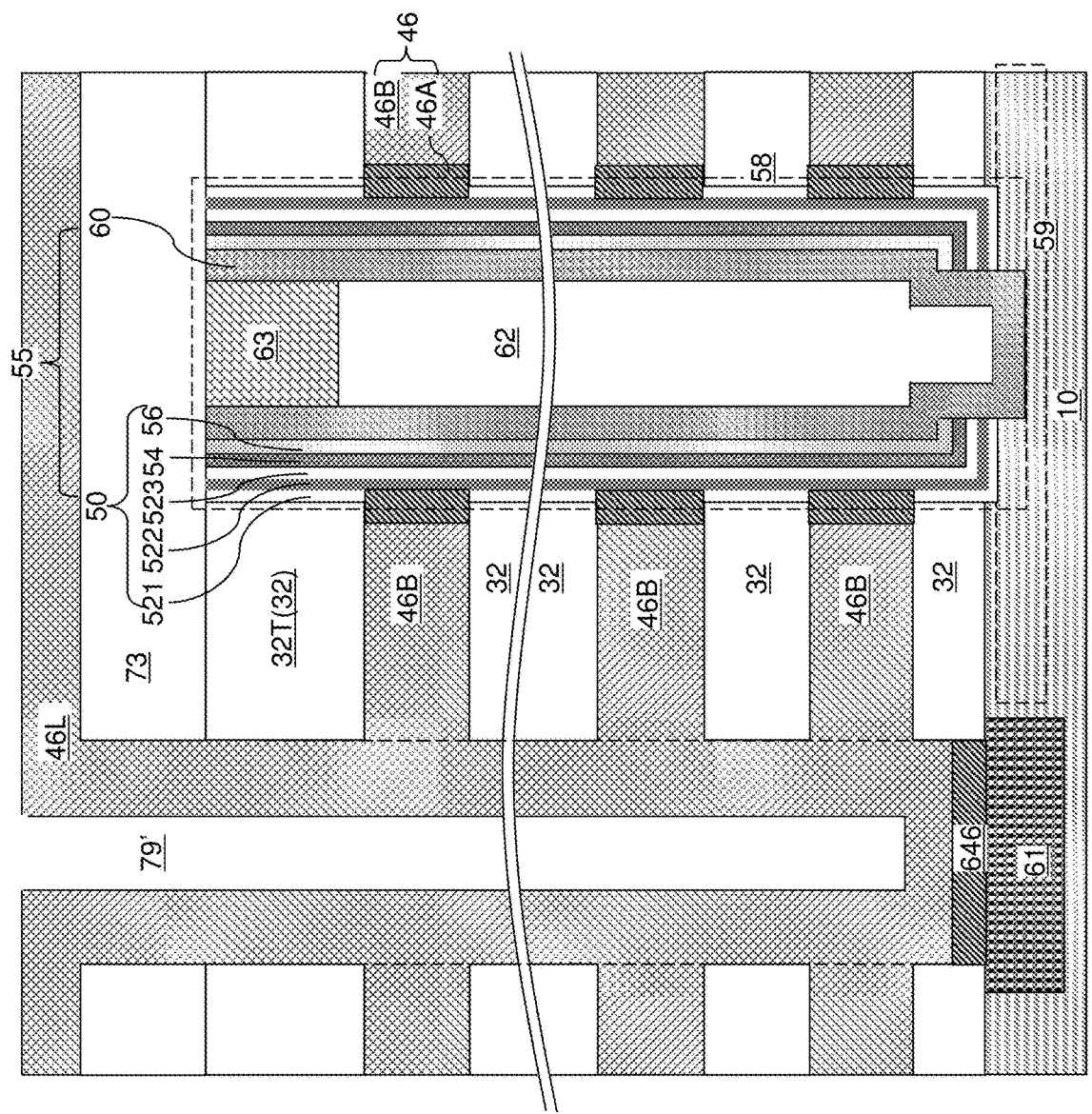

Referring to FIG. 9D, a metal fill material can be deposited in the remaining volumes of backside recesses 43, on the sidewalls of the backside trenches 79, and over the top surface of the contact-level dielectric layer 73. The metal fill material can be deposited by a conformal deposition method, which can be, for example, chemical vapor deposition (CVD), atomic layer deposition (ALD), electroless plating, electroplating, or a combination thereof. In one embodiment, the metal fill material can consist essentially of at least one elemental metal, such as a single elemental metal. In one embodiment, the metal fill material consists essentially of molybdenum. Alternatively, the metal fill material can be selected, for example, from tungsten, cobalt, ruthenium, titanium, or tantalum. Since the metal nitride 46A is absent or has a minimal thickness on surfaces of the insulating layers 32 in the backside recesses 43, preferably the metal fill material is deposited using a fluorine free process to prevent fluorine induced damage to the insulating layers 32. For example, the metal fill material may comprise molybdenum deposited using metal organic CVD or ALD using fluorine free precursor.

Each portion of the metal fill material that fills remaining volumes of the backside trenches 43 constitutes a metal fill material portion 46B. A continuously-extending portion of the metal fill material that is deposited in the backside trenches 79 or above the contact-level dielectric layer 73 constitutes a continuous metallic material layer 46L. Thus, a plurality of electrically conductive layers 46 can be formed in the plurality of backside recesses 43, and the continuous metallic material layer 46L can be formed on the sidewalls of each backside trench 79 and over the contact-level dielectric layer 73. Each contiguous combination of at least one metallic diffusion barrier layer 46A (which may include a plurality of metal nitride liners 46A) and a metal fill material portion 46B constitutes an electrically conductive layer 46. Each sacrificial material layer 42 can be replaced with an electrically conductive layer 46. A backside cavity is present in the portion of each backside trench 79 that is not filled with the continuous metallic material layer 46L.

In one embodiment, each of the metal fill material portions 46B laterally surrounds a respective one, and/or a respective subset, of the tubular metal nitride portions (i.e., liners 46A). Each metal fill material portion 46B can be formed directly on a horizontal bottom surface of an overlying insulating layer 32 and on a horizontal top surface of an underlying insulating layer 32. An electrically conductive layer 46 comprising a contiguous combination of a respective metal nitride liner 46A and a respective metal fill material portion 46B is formed in each of the backside recesses 43.

Figure 9E:
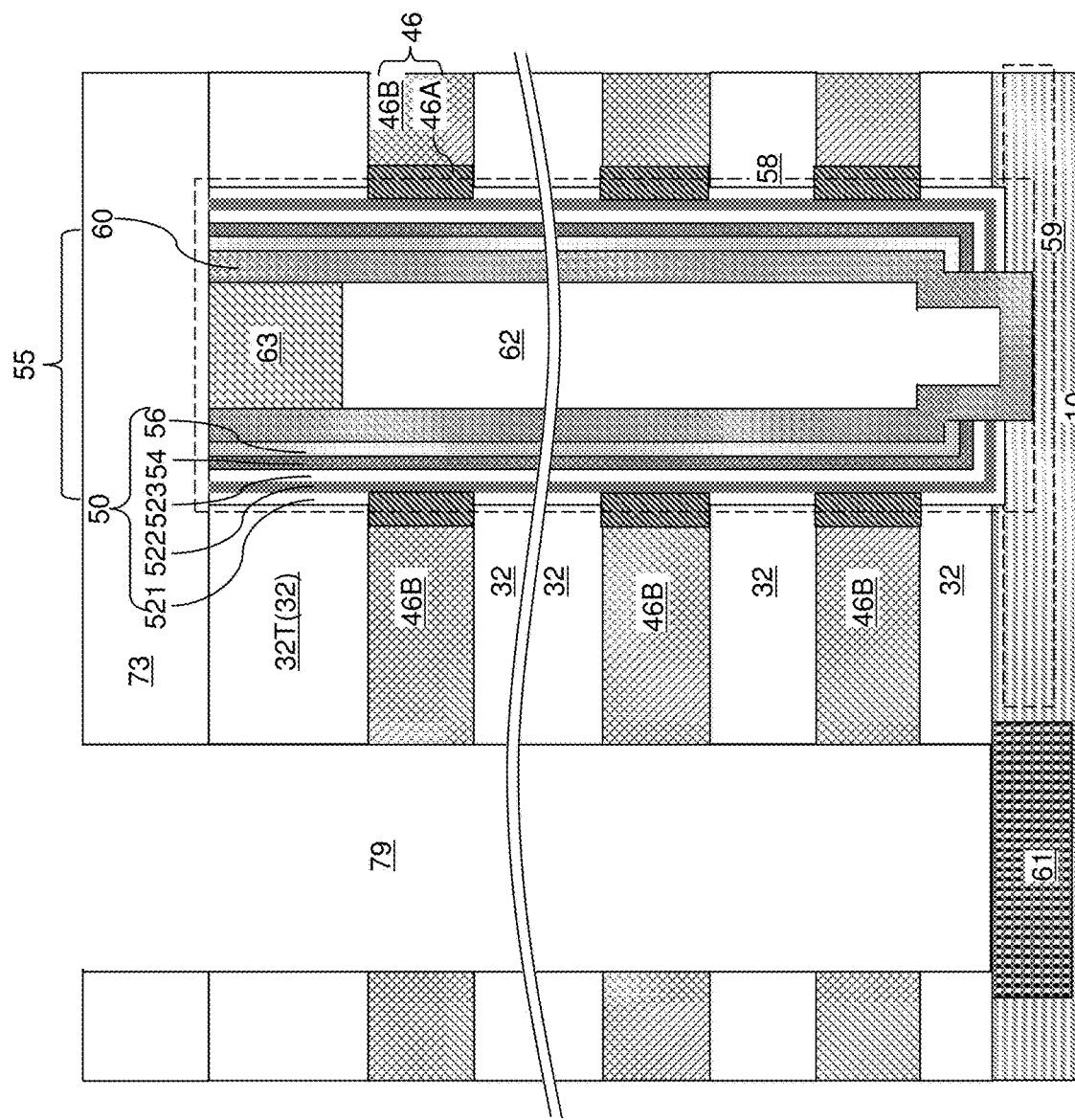

Referring to FIG. 9E, the conductive material layer 46L is etched back from the sidewalls of each backside trench 79 and from above the contact-level dielectric layer 73, for example, by an isotropic wet etch, an anisotropic dry etch, or a combination thereof. If any planar metal nitride portions 646 are formed, such planar metal nitride portions 646 can be removed, for example, by performing an anisotropic etch process. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

One or more bottommost electrically conductive layers 46 may comprise a source side select gate electrode for the vertical NAND strings. One or more topmost electrically conductive layers 46 may comprise a drain side select gate electrode for the vertical NAND strings. The remaining electrically conductive layers 46 may comprise word lines. Each source region 61 is formed in an upper portion of the semiconductor substrate (9, 10). Semiconductor channels (59, 60) extend between each source region 61 and a respective set of drain regions 63.

In one embodiment, each of the electrically conductive layers 46 comprises a tubular metal nitride portion (comprising a metal nitride liner 46A) and a metal fill material portion 46B. In one embodiment, each of the tubular metal nitride portions of the electrically conductive layers 46 laterally surrounds and contacts a respective one of the dielectric-metal-oxide blocking dielectric portions (comprising portions of a continuous dielectric-metal-oxide blocking dielectric layer 522). In one embodiment, each metal fill material portion 46B of the electrically conductive layers 46 comprises a respective horizontal top surface contacting a bottom surface of a respective overlying insulating layer 32 and a respective horizontal bottom surface contacting a top surface of a respective underlying insulating layer 32.

Figure 9F:
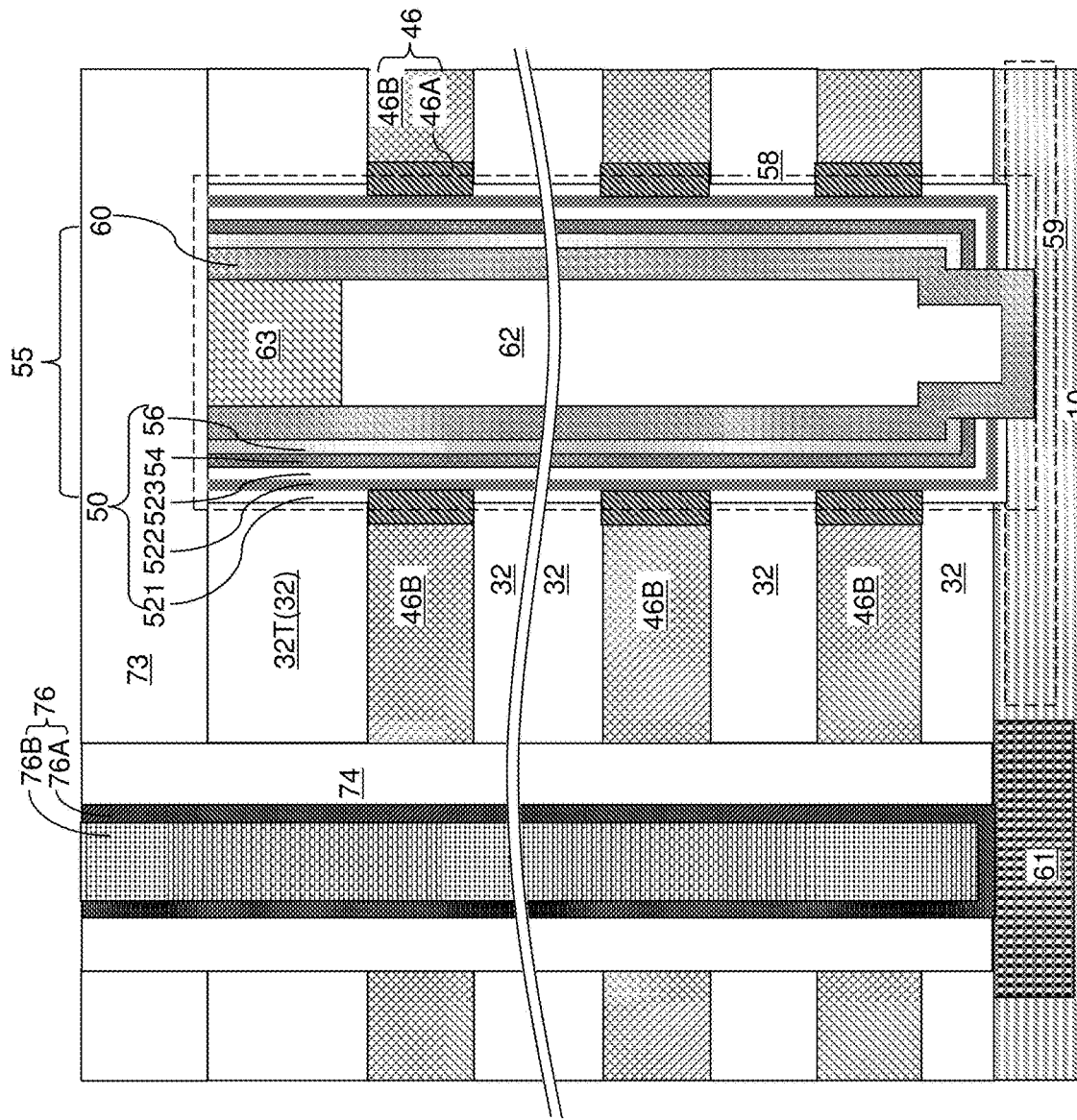

Referring to FIG. 9F, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

FIGS. 10A-10D are sequential vertical cross-sectional views of a region of a second exemplary structure during formation of electrically conductive layers 46 and backside trench fill structures according to a second embodiment of the present disclosure.

Figure 10A:
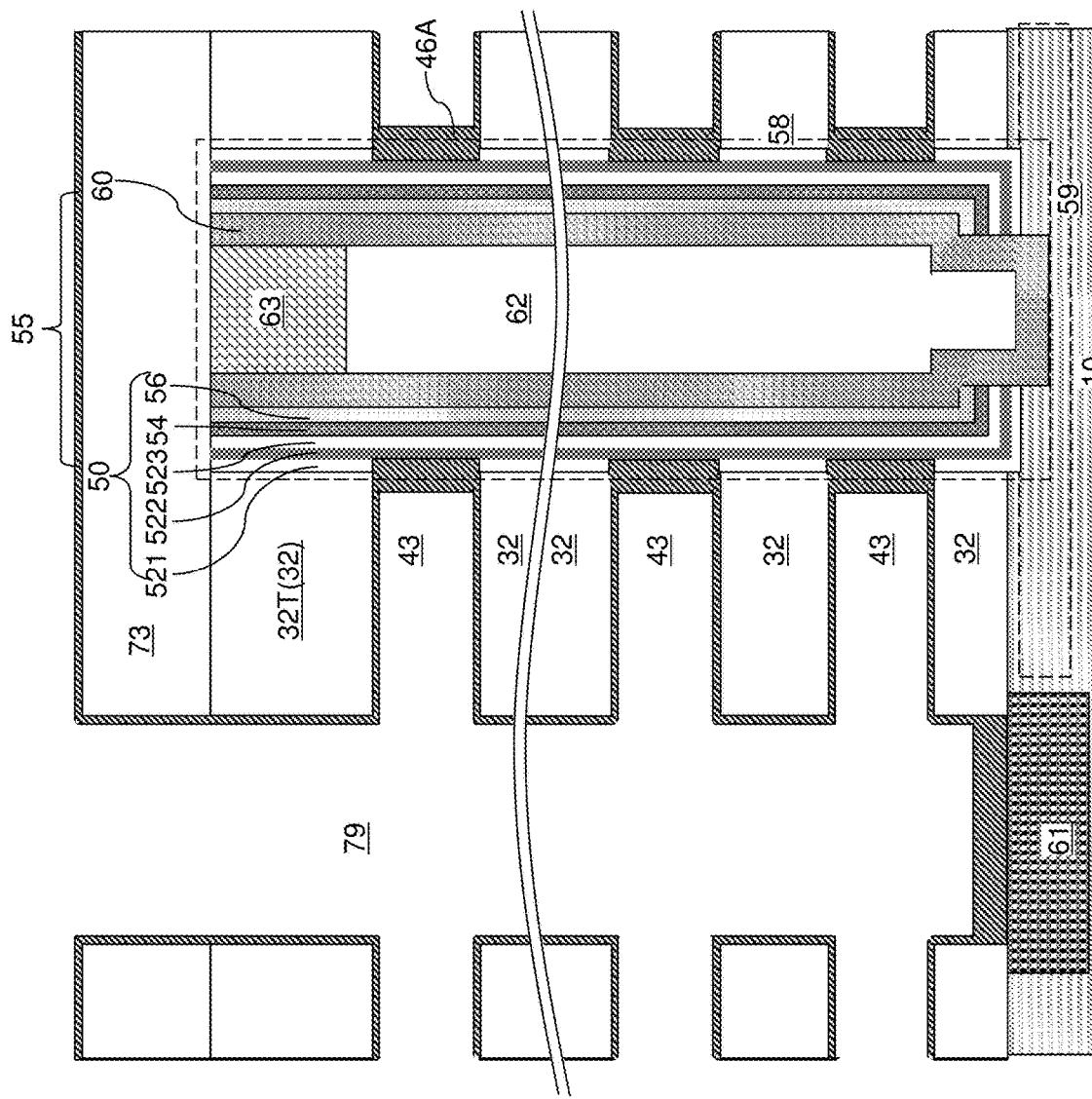
FIGS. 10A-10D are sequential vertical cross-sectional views of a region of a second exemplary structure during formation of electrically conductive layers and backside trench fill structures according to a second embodiment of the present disclosure.

Referring to FIG. 10A, the second exemplary structure according to the second embodiment of the present disclosure may be derived from the first exemplary structure illustrated in FIG. 9B by performing a selective deposition process such that the selective deposition process grows a metal nitride material from physically exposed surface of the set of dielectric-metal-oxide blocking dielectric portions (comprising portions of a continuous dielectric-metal-oxide blocking dielectric layer 522) in the backside recesses 43 while retarding (rather than completely suppressing) growth of the metal nitride material from physically exposed surfaces of the insulating layers 32. In this case, a thin layer of the metal nitride material can grow from physically exposed surfaces of the insulating layers 32 and the contact-level dielectric layer 73. Thus, the metal nitride liner 46A may be formed as a continuous material layer having a first thickness around each physically exposed cylindrical surface segment of the outer sidewall of the continuous dielectric-metal-oxide blocking dielectric layers 522, and having a second, thinner thickness over each physically exposed surface of the insulating layers 32 and the contact-level dielectric layer 73. The first thickness may be in a range from 2 nm to 40 nm, such as from 4 nm to 30 nm, and/or from 6 nm to 20 nm, although lesser and greater thicknesses may also be employed. The second thickness may be in a range from 1% to 50%, such as from 3% to 20%, of the first thickness.

Figure 10B:
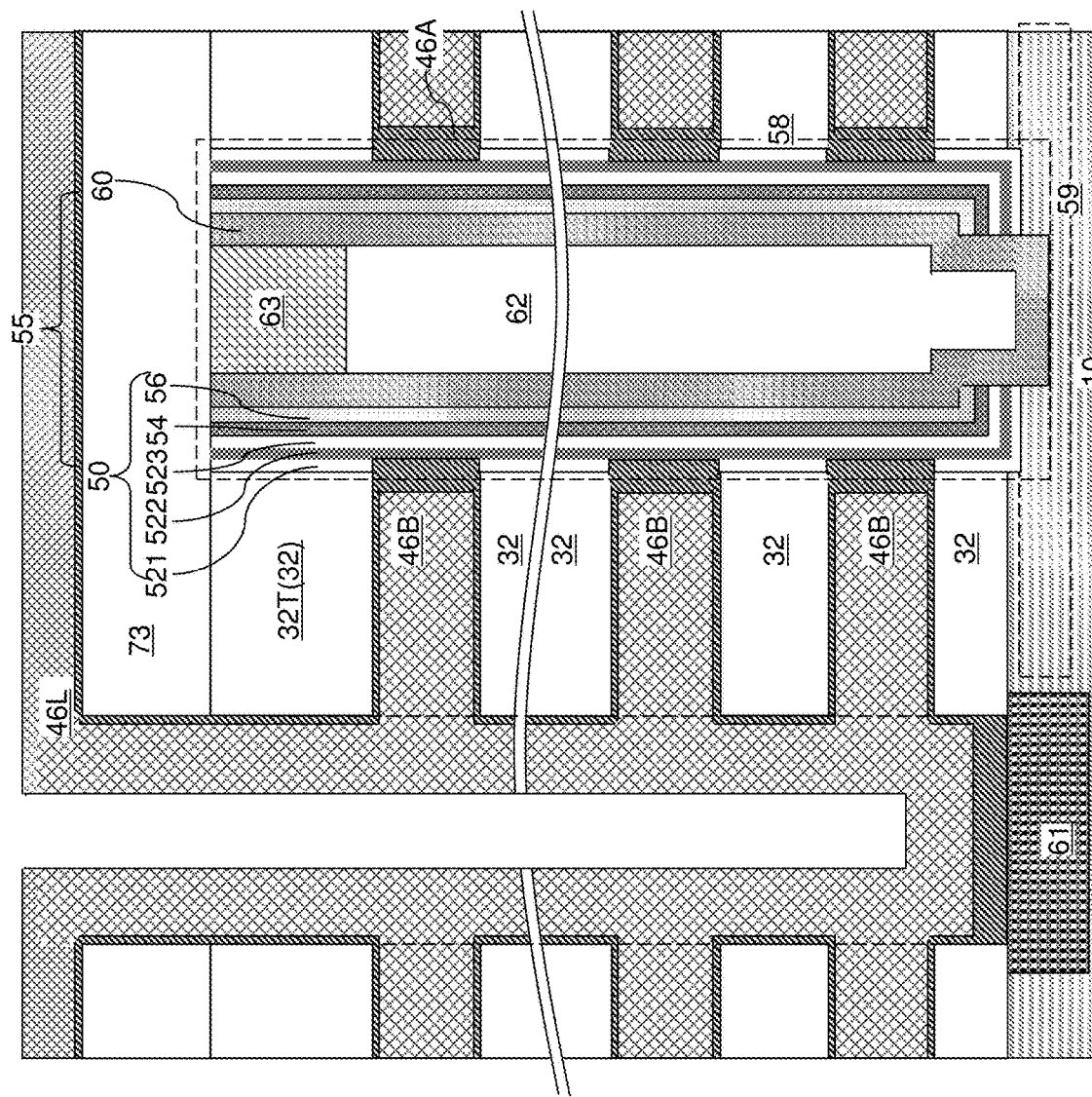

Referring to FIG. 10B, the processing steps described with reference to FIG. 9D can be performed to deposit a metal fill material in the remaining volumes of backside recesses 43, on the sidewalls of the backside trenches 79, and over the top surface of the contact-level dielectric layer 73. Each portion of the metal fill material that fills remaining volumes of the backside trenches 43 constitutes a metal fill material portion 46B. A continuously-extending portion of the metal fill material that is deposited in the backside trenches 79 or above the contact-level dielectric layer 73 constitutes a continuous metallic material layer 46L. Thus, a plurality of electrically conductive layers 46 can be formed in the plurality of backside recesses 43, and the continuous metallic material layer 46L can be formed on the sidewalls of each backside trench 79 and over the contact-level dielectric layer 73. Each contiguous combination of at least one diffusion barrier layer 46A (which may include a plurality of metal nitride liners 46A) and a metal fill material portion 46B that fills a respective backside recess 43 constitutes an electrically conductive layer 46. Each metal fill material portion 46B is spaced from the insulating layers 32 and the contact-level dielectric layer 73 by a respective portion of the metal nitride liner 46A.

Figure 10C:
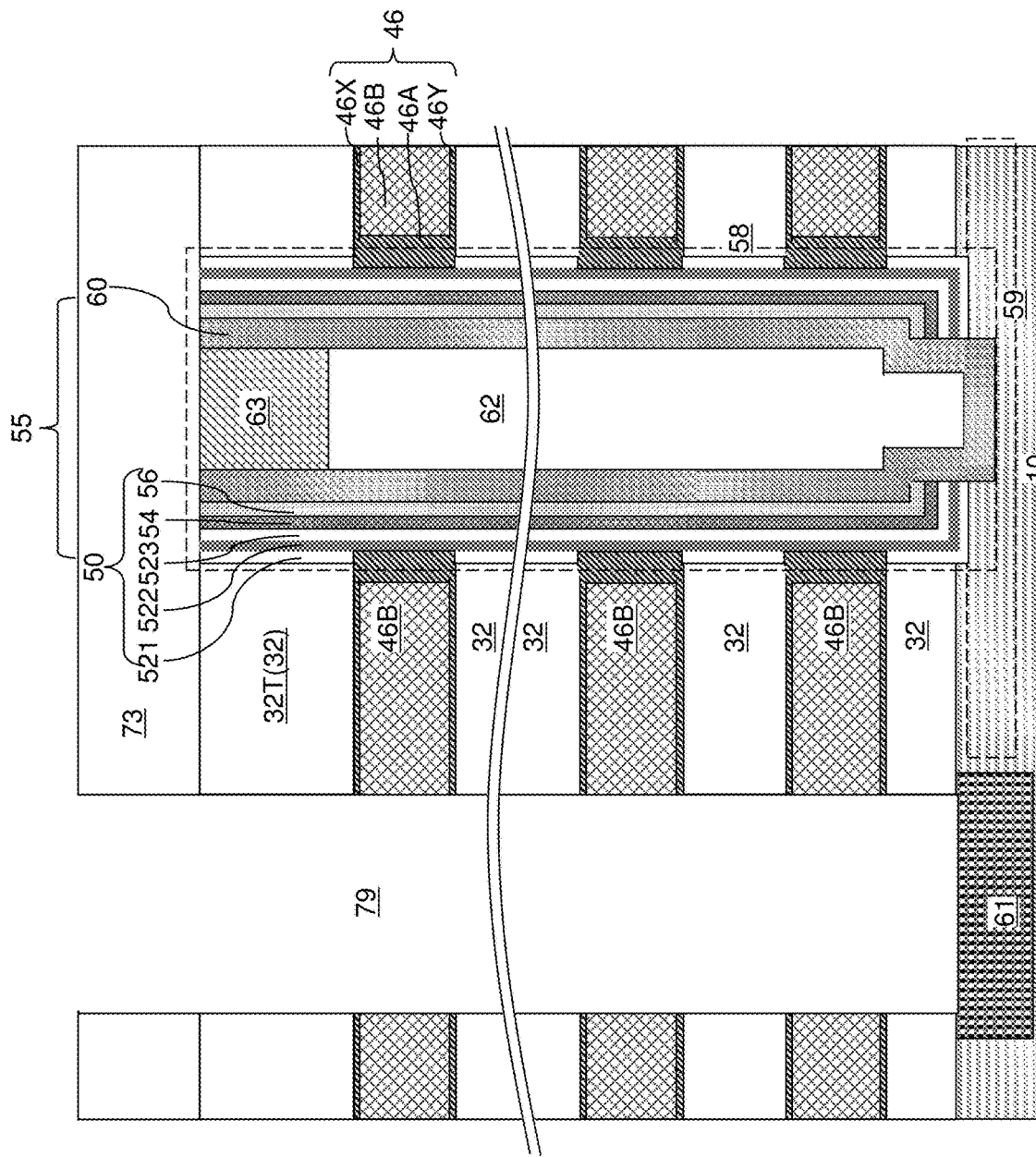

Referring to FIG. 10C, the processing steps described with reference to FIG. 9E can be performed to remove the materials of the metal fill material portions 46B and the metal nitride liner 46A from inside the volumes of the backside trenches 79 and from above the horizontal plane including the top surface of the contact-level dielectric layer 73. The metal nitride liner 46A as formed at the processing steps of FIG. 10A is divided into a plurality of metal nitride liners 46A that are located within the volume of a respective backside recess 43. Electrically conductive layers 46 fill the volumes of the backside recesses 43. Each electrically conductive layer 46 comprises a respective contiguous combination of a metal nitride liner 46A and a metal fill material portion 46B.

In one embodiment, each metal nitride liner 46A comprises an upper planar metal nitride liner portion contacting a horizontal bottom surface of a respective overlying insulating layer 32 and a lower planar metal nitride liner portion contacting a horizontal top surface of a respective underlying insulating layer 32. In one embodiment, each of the metal fill material portions 46B are vertically spaced from the insulating layers 32 by a respective metal nitride liner 46A.

Figure 10D:
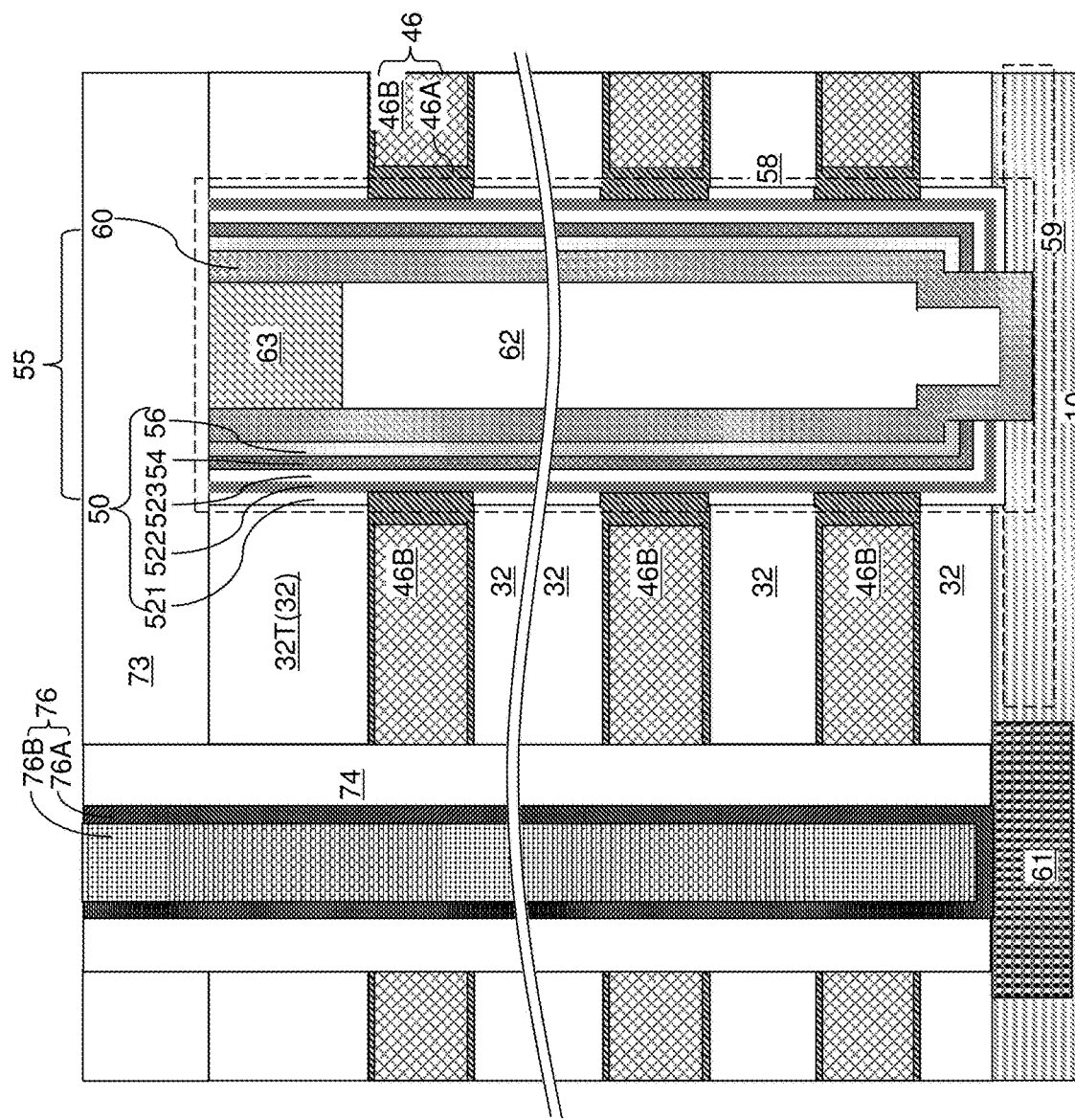

Referring to FIG. 10D, the processing steps described with reference to FIG. 9F can be performed to form the insulating spacer 74 and the optional backside contact via structure 76 within each backside trench 79.

In the second exemplary structure, a memory opening fill structure 58 can be located in a memory opening 49. The memory opening fill structure 58 comprises a set of dielectric-metal-oxide blocking dielectric portions (comprising portions of a continuous dielectric-metal-oxide blocking dielectric layer 522) located at levels of the electrically conductive layers 46. The memory opening fill structure 58 further comprises a memory material layer 54 and a vertical semiconductor channel 60.

In one embodiment, each of the electrically conductive layers 46 comprises a metal fill material portion 46B, a tubular metal nitride portion 46A, an upper planar metal nitride liner portion 46X that is adjoined to a top end of the tubular metal nitride portion and a lower planar metal nitride liner portion 46Y that is adjoined to a bottom end of the tubular metal nitride portion 46A. In one embodiment, each of the upper planar metal nitride liner portion 46X and the lower planar metal nitride liner portion 46Y has a uniform thickness (such as a second thickness) that is less than a lateral thickness (such as a first thickness) of the tubular metal nitride portion 46A (which is measured between a cylindrical inner sidewall and a cylindrical outer sidewall). As discussed above, the second thickness may be in a range from 1% to 50%, such as from 3% to 20%, of the first thickness.

Figure 11A:
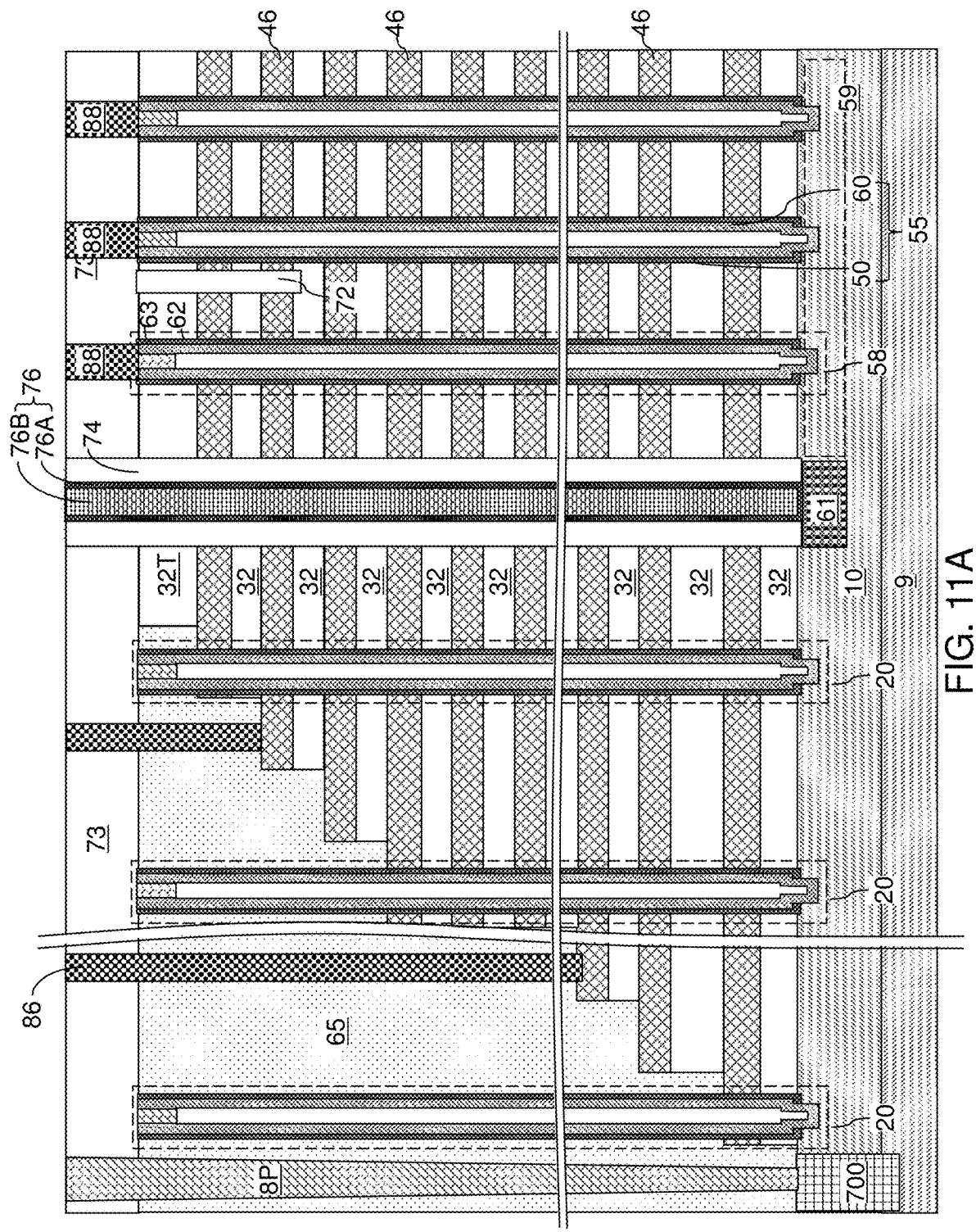
FIG. 11A is a schematic vertical cross-sectional view of the first or second exemplary structure after formation of additional contact via structures according to an embodiment of the present disclosure.
Figure 11B:
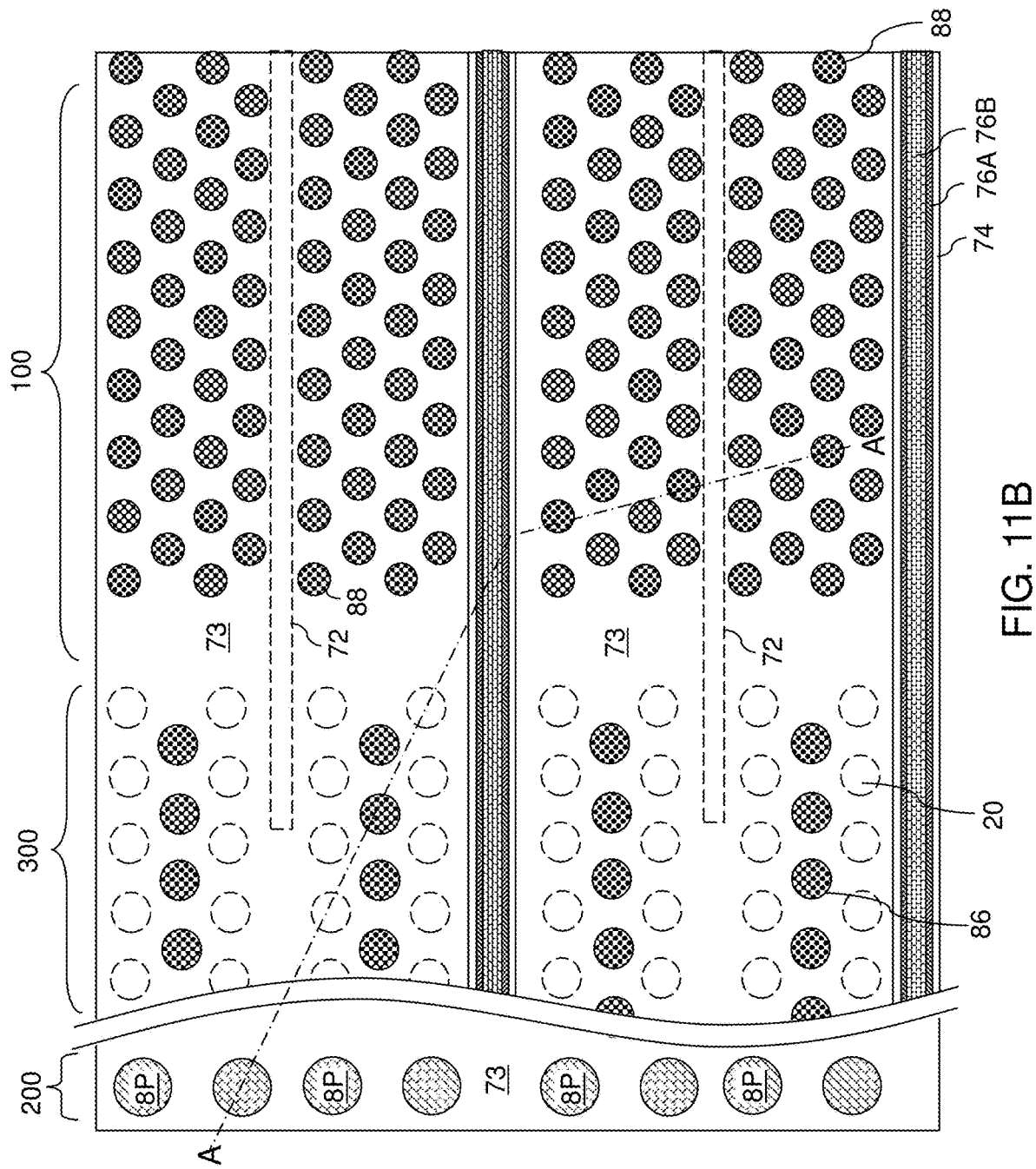
FIG. 11B is a top-down view of the first or second exemplary structure of FIG. 11A. The vertical plane A-A' is the plane of the schematic vertical cross-sectional view of FIG. 11A.

Referring to FIGS. 11A and 11B, additional contact via structures (88, 86, 8P) can be formed through the contact-level dielectric layer 73, and optionally through the retro-stepped dielectric material portion 65 in the first exemplary structure illustrated in FIG. 9F or in the second exemplary structure illustrated in FIG. 10D. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

FIGS. 12A-12J are sequential schematic vertical cross-sectional views of a memory opening 49 within a third exemplary structure during formation of a memory stack structure 55, an optional dielectric core 62, and a drain region 63 therein according to a third embodiment of the present disclosure.

Figures 12A, 12B:
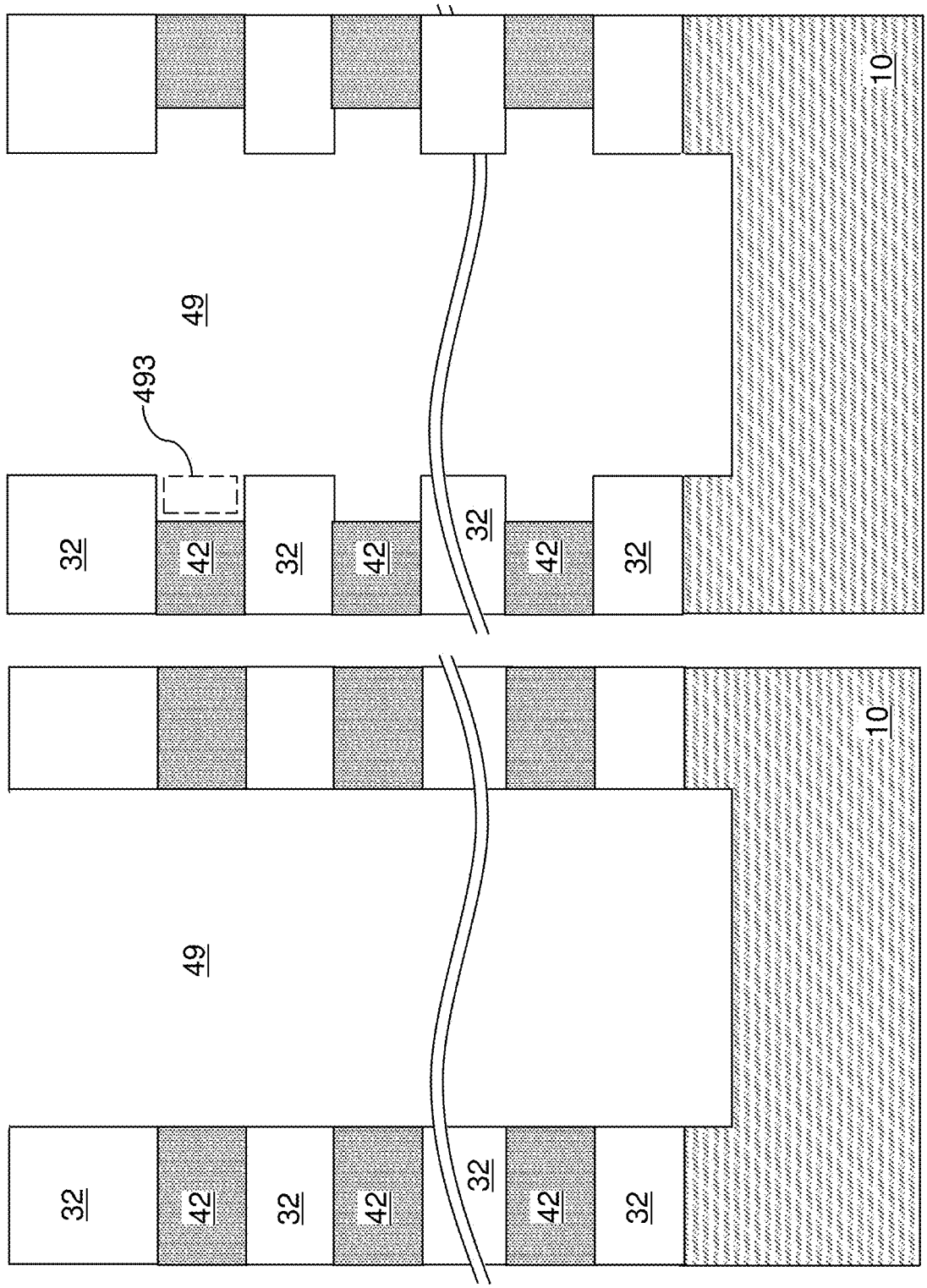

Referring to FIG. 12A, a memory opening 49 in a third exemplary structure is illustrated. The third exemplary structure illustrated in FIG. 12A may be the same as the first exemplary structure illustrated in FIGS. 4A, 4B, and 5A.

Referring to FIG. 12B, a selective etch process can be performed to etch the material of the sacrificial material layers 42 selective to the materials of the insulating layers 32 and the semiconductor material layer 10. Sidewalls of the sacrificial material layers 42 are laterally recessed relative to sidewalls of the insulating layers 32 around each memory opening 49. Cylindrical recesses 493 are formed at levels of the sacrificial material layers 42 around the memory opening 49. The recess distance of the cylindrical recesses 493 (i.e., the lateral offset distance between each recessed sidewall of the sacrificial material layers 42 and unrecessed sidewalls of the insulating layers 32) may be in a range from 5 nm to 40 nm, such as from 10 nm to 30 nm, although lesser and greater recess distances may also be employed.

Figure 12D:
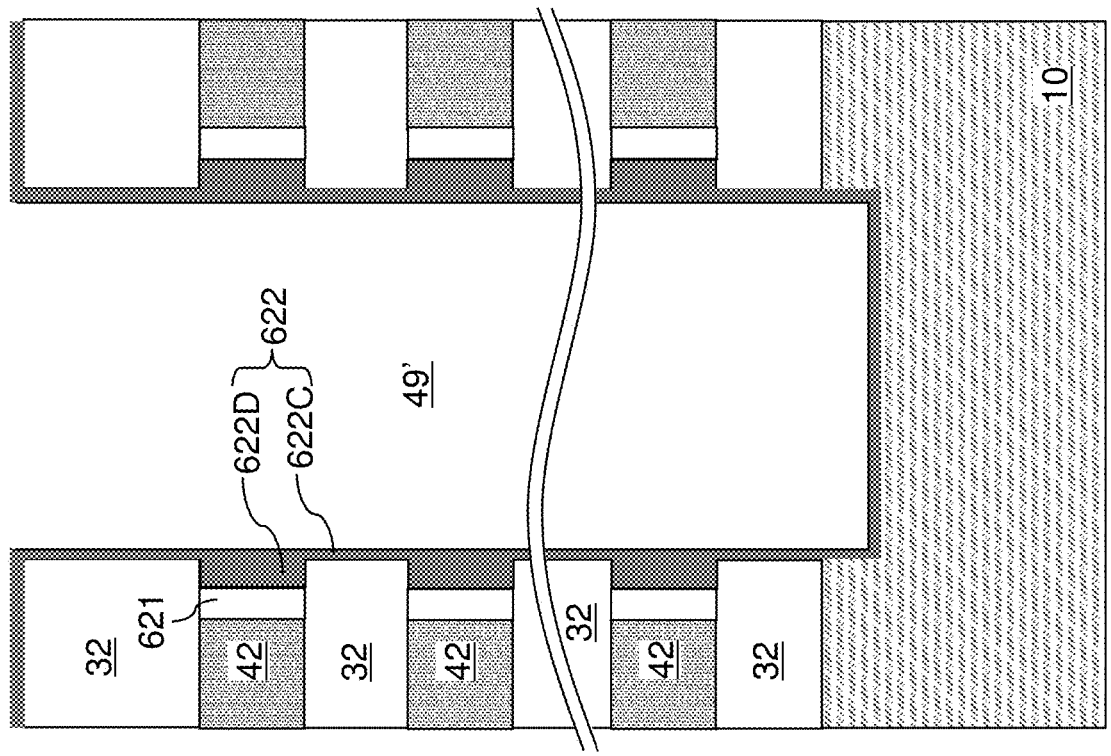
Figure 12C:
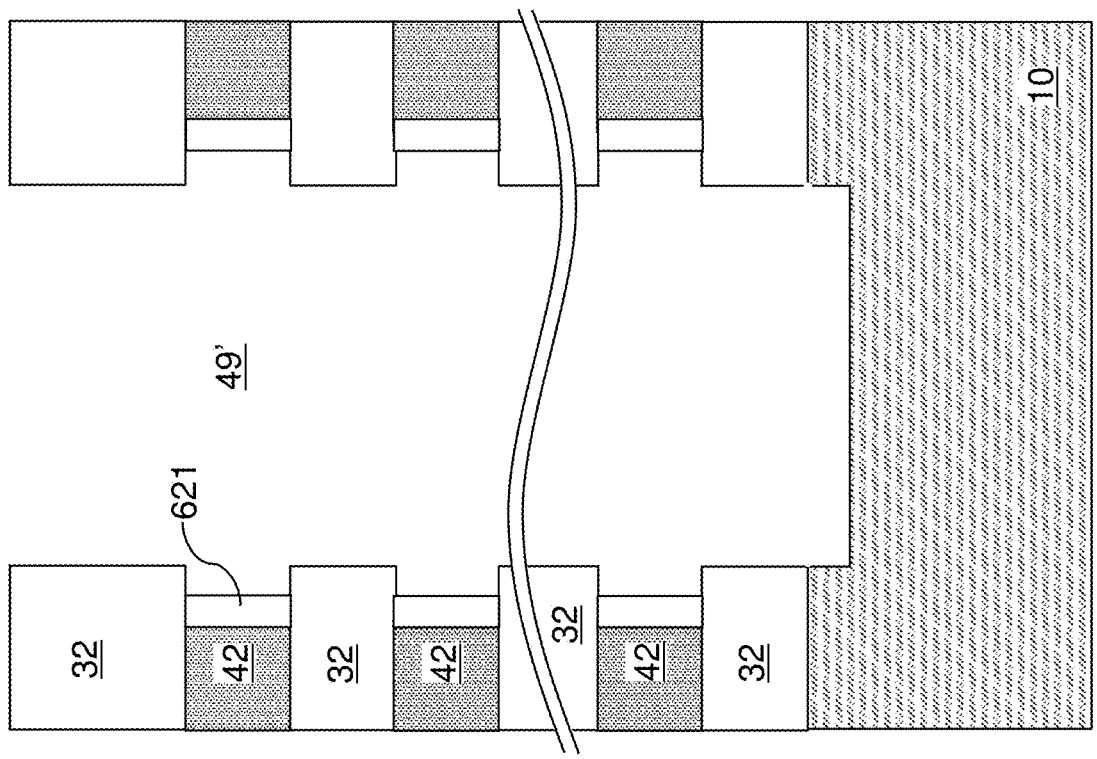

Referring to FIG. 12C, an oxidation process can be performed to convert surface portions of the sacrificial material layers 42 into tubular oxide portions 621. The tubular oxide portions 621 may comprise silicon oxide and may optionally include residual nitrogen atoms therein. The atomic concentration of nitrogen atoms (if present) in the tubular oxide portions 621 decreases with a lateral distance from an interface with a respective one of the sacrificial material layers 32. The lateral thickness (i.e., the thickness between an outer sidewall and an inner sidewall) of each tubular oxide portions 621 may be in a range from 1 nm to 5 nm, such as from 1.5 nm to 4 nm, although lesser and greater thicknesses may also be employed.

Referring to FIG. 12D, a continuous dielectric-metal-oxide blocking dielectric layer 622 having a same material composition as the continuous dielectric-metal-oxide blocking dielectric layer 522 described above can be conformally deposited in the memory opening. Portions of the continuous dielectric-metal-oxide blocking dielectric layer 622 filling the remaining volumes of the cylindrical recesses 493 form discrete dielectric-metal-oxide blocking dielectric portions 622D. The remaining portion of the continuous dielectric-metal-oxide blocking dielectric layer in the memory opening 49 forms a continuous inner dielectric-metal-oxide blocking dielectric layer portion 622C. The continuous dielectric-metal-oxide blocking dielectric layer 622 vertically extends continuously through each layer within the alternating stack (32, 42). Generally, the continuous dielectric-metal-oxide blocking dielectric layer 622 includes a set of discrete dielectric-metal-oxide blocking dielectric portions 622D that are located within volumes of the cylindrical recesses 493 at the levels of the sacrificial material layers 42, and interconnected among each other by the continuous inner dielectric-metal-oxide blocking dielectric layer portion 622C located at the levels of the insulating layers 32.

The continuous dielectric-metal-oxide blocking dielectric layer 622 located in a memory opening 49 may have a straight inner cylindrical sidewall of the continuous inner portion 622C and a laterally-undulating outer sidewall of the discrete portions 622D which form a vertical stack of dielectric-metal-oxide blocking dielectric portions within each memory opening 49. Each of the discrete dielectric-metal-oxide blocking dielectric portions 622D located at a level of a respective one of the sacrificial material layers 42 has a greater lateral thickness than the continuous inner portions 622C of the continuous dielectric-metal-oxide blocking dielectric layer 622 that are located at levels of the insulating layers 32.

Subsequently, a subset of the processing steps described with reference to FIG. 5B and the set of processing steps described with reference to FIG. 5C may be performed to form a silicon oxide blocking dielectric layer 523, a memory material layer 54, an inner dielectric liner 56, and an optional sacrificial cover material layer 601. The combination of the continuous dielectric-metal-oxide blocking dielectric layer 622, the silicon oxide blocking dielectric layer 523, the memory material layer 54, and the inner dielectric liner 56 constitutes a memory film 50.

Referring to FIG. 12F, the processing steps described with reference to FIG. 5D may be performed to remove horizontally-extending portions of the optional sacrificial cover material layer 601, the dielectric material liner 56, the memory material layer 54, the silicon oxide blocking dielectric layer 523, the continuous dielectric-metal-oxide blocking dielectric layer 622.

Referring to FIG. 12G, the processing steps described with reference to FIG. 5E may be performed to remove the sacrificial cover material layer 601, and to deposit a semiconductor channel layer 60L.

Referring to FIG. 12H, the processing steps described with reference to FIG. 5F may be performed to form a dielectric core layer 62L.

Figure 12I:
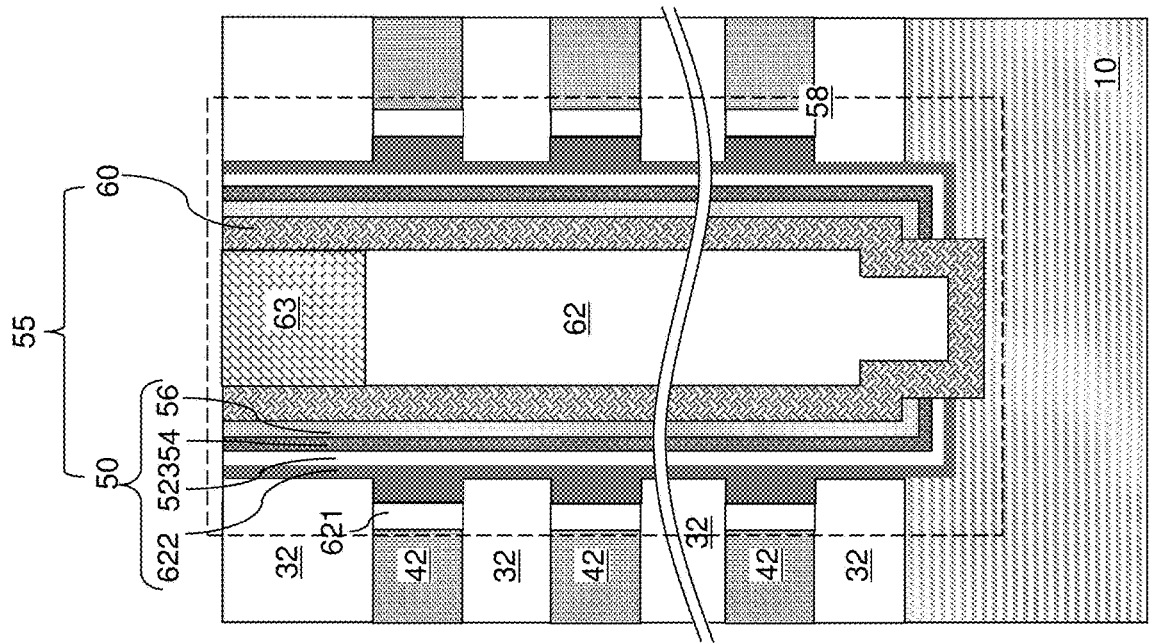

Referring to FIG. 12I, the processing steps described with reference to FIG. 5G may be performed to form a dielectric core 62 within each memory opening 49.

Figure 12J:
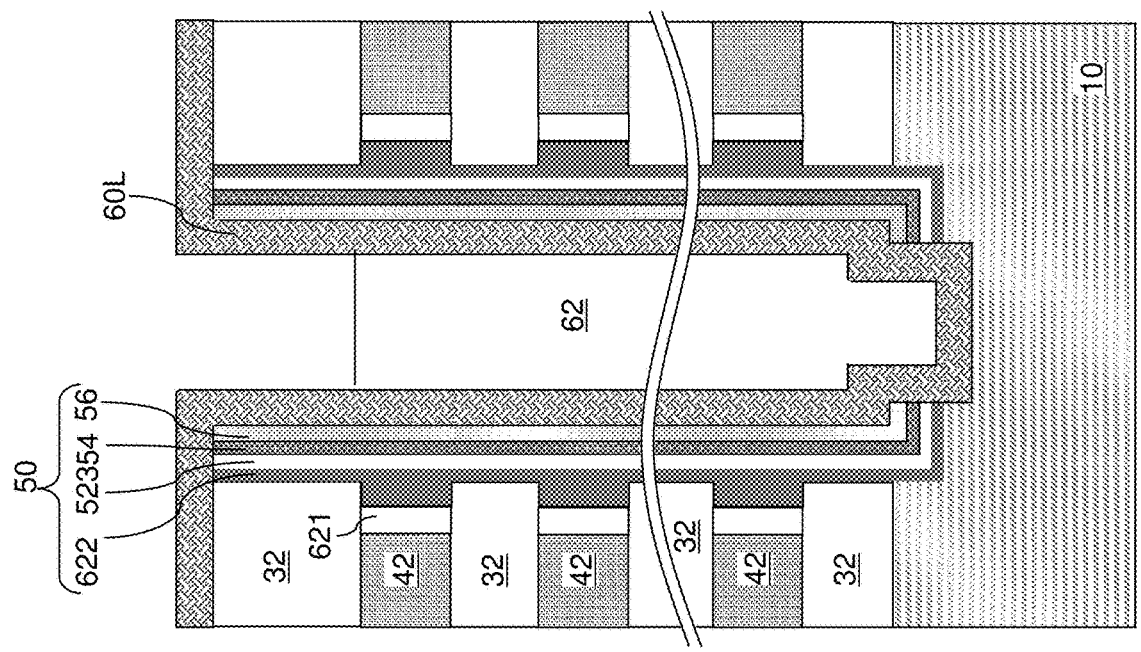

Referring to FIG. 12J, the processing steps described with reference to FIG. 5H may be performed to form a drain region 63 within each memory opening 49. Generally, a memory opening fill structure 58 can be formed in each the memory opening 49. The memory opening fill structure 58 comprises a set of dielectric-metal-oxide blocking dielectric portions (which are portions of a continuous dielectric-metal-oxide blocking dielectric layer 622) located at levels of the sacrificial material layers 42, a memory material layer 54, and a vertical semiconductor channel 60. Subsequently, the processing steps described with reference to FIGS. 7A-7C may be performed.

FIGS. 13A-13F are sequential vertical cross-sectional views of a region of the third exemplary structure during formation of electrically conductive layers 46 and backside trench fill structures (74, 76) according to the third embodiment of the present disclosure.

Figure 13A:
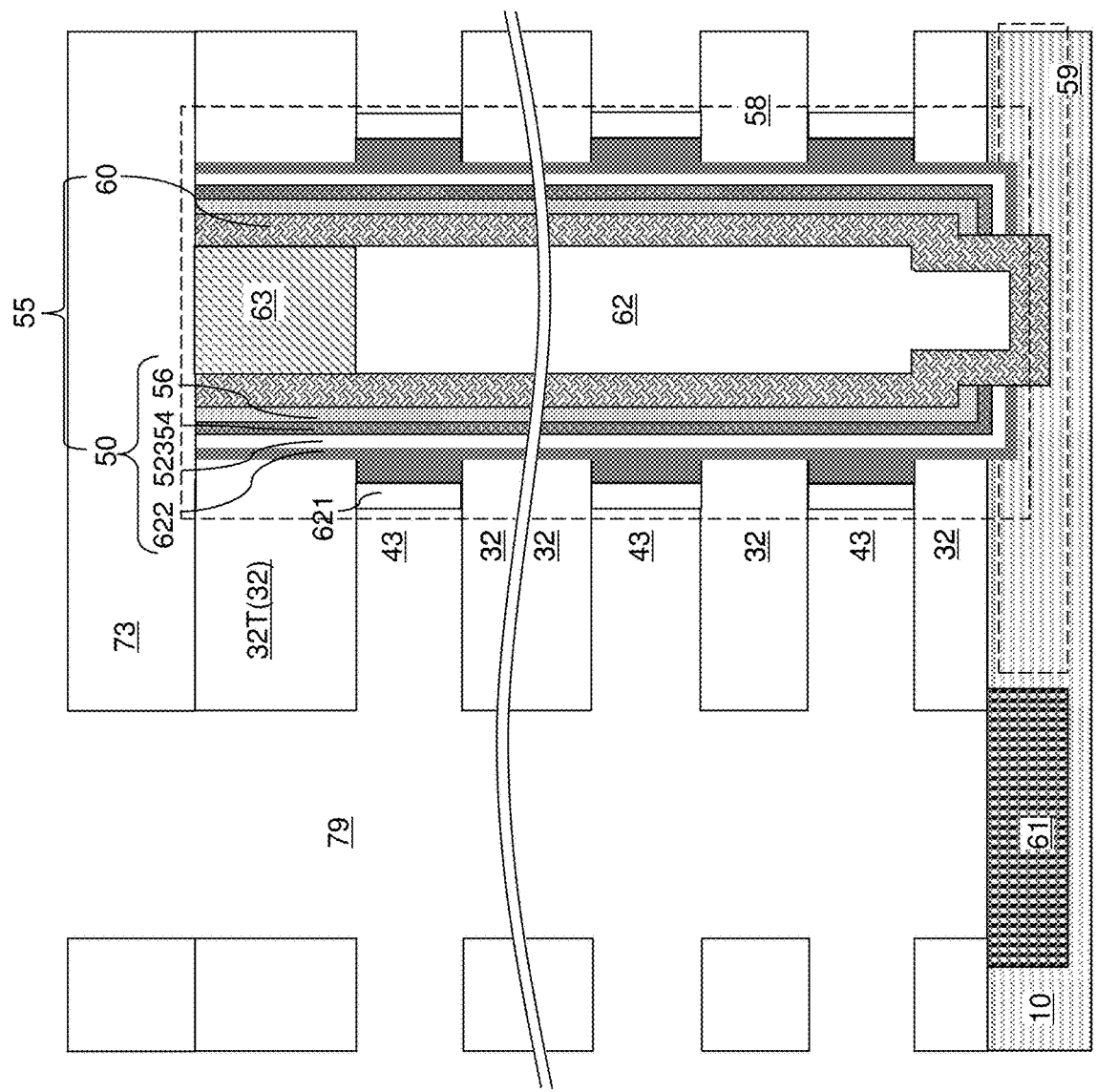

Referring to FIG. 13A, the processing steps described with reference to FIGS. 8 and 9A may be performed to form backside recesses 43. In this case, the etchant that selectively etches the second material of the sacrificial material layers 42 with respect to the first material of the insulating layers 32 and the tubular oxide portions 621 (which function as etch stop portions) can be introduced into the backside trenches 79, for example, employing a selective etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the tubular oxide portions 621 (such as silicon oxide). In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the tubular oxide portions 621 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Figure 13B:
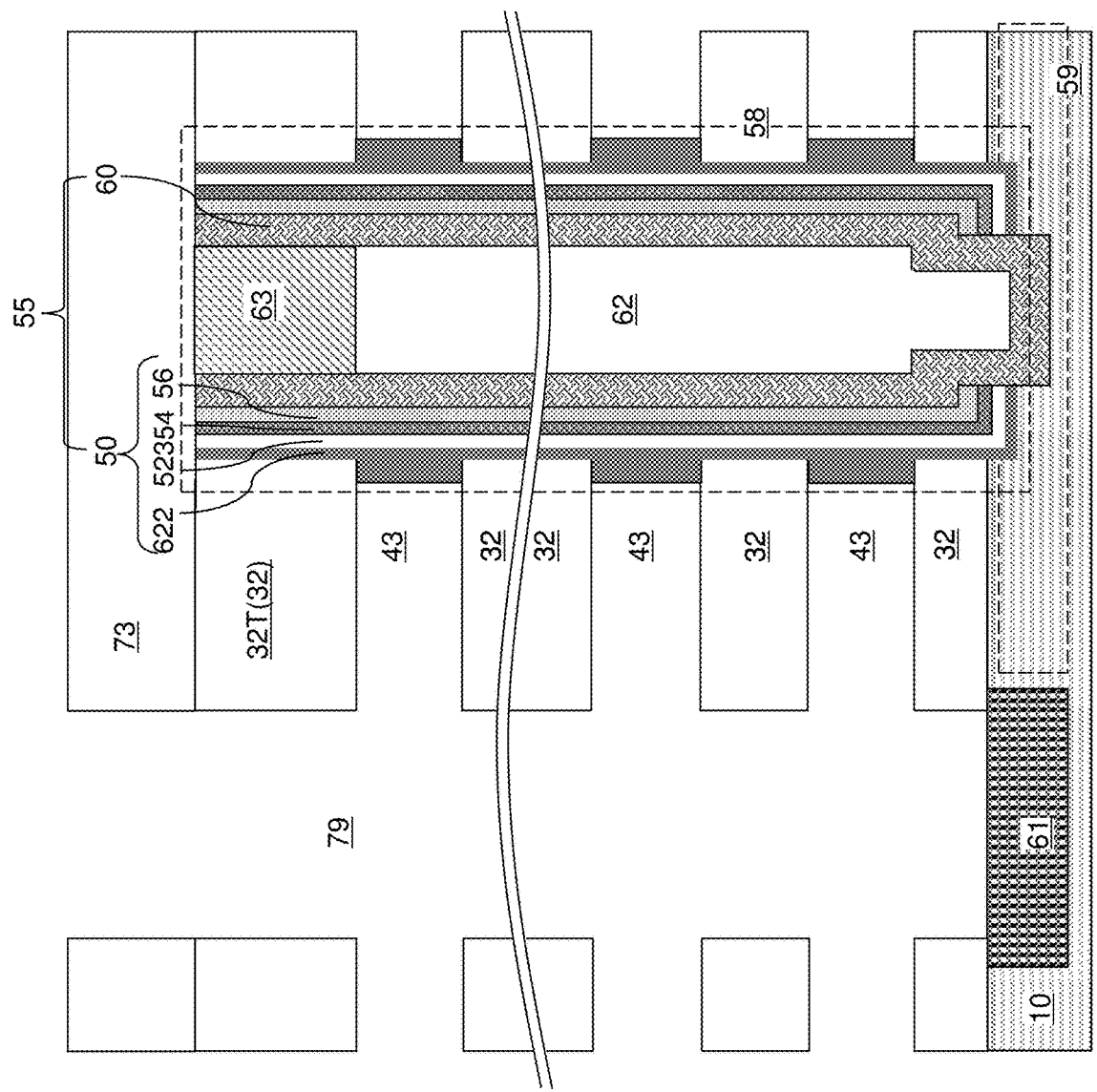

Referring to FIG. 13B, a selective isotropic etch process may be performed to remove the tubular oxide portions 621. The insulating layers 32 and the contact-level dielectric layer 73 may be collaterally recessed by the isotropic etch process. In one embodiment, the isotropic etch process may comprise a wet etch process employing dilute hydrofluoric acid. Cylindrical surface segments of each continuous dielectric-metal-oxide blocking dielectric layer 622 can be physically exposed to the backside recesses 43 at each level of the backside recesses 43.

Figure 13C:
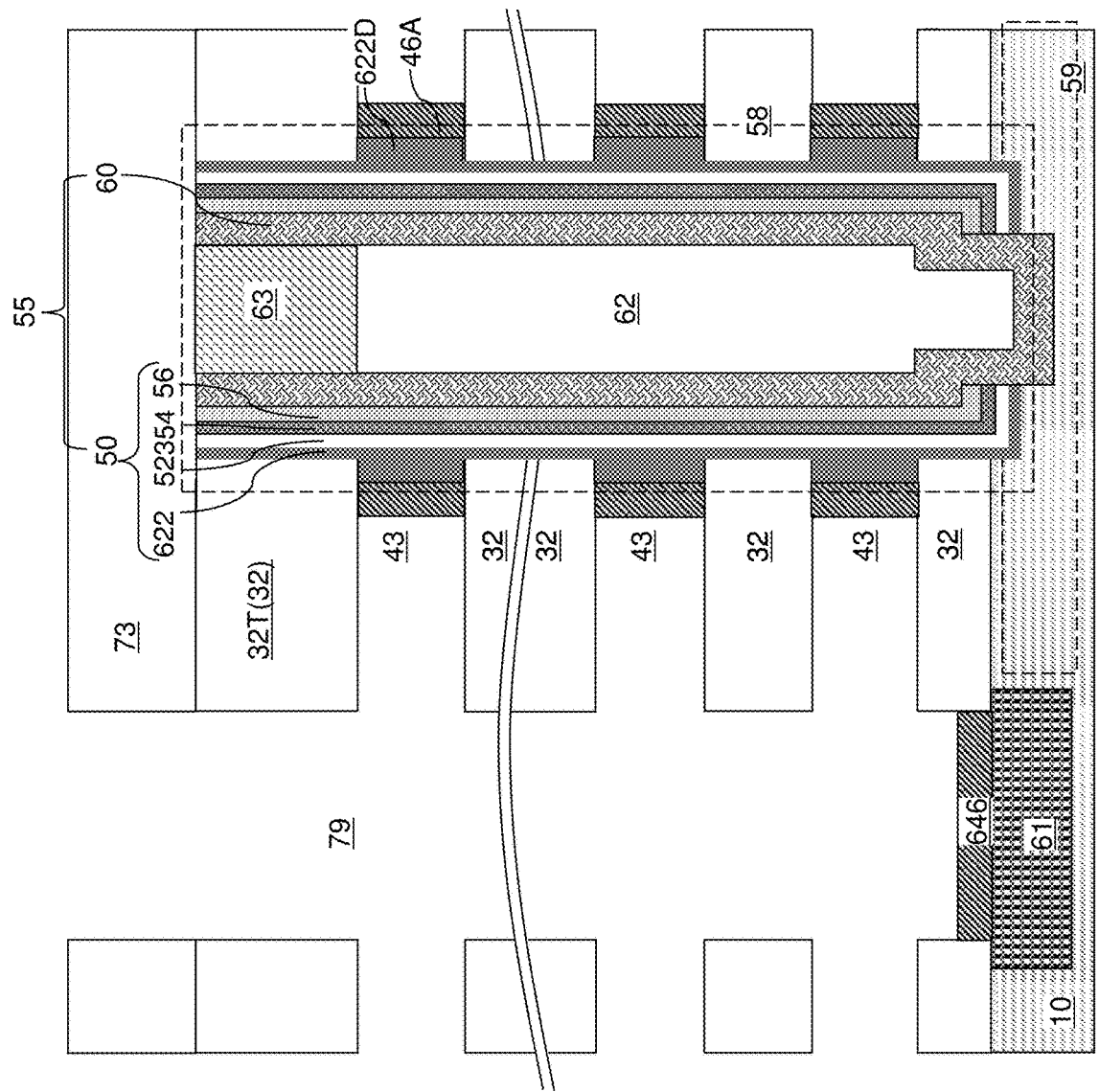

Referring to FIG. 13C, the processing steps described with reference to FIG. 9C may be performed. Specifically, a selective deposition process can be performed, which grows a metal nitride material from physically exposed surface of the set of dielectric-metal-oxide blocking dielectric portions (comprising the discrete portions 622D of the continuous dielectric-metal-oxide blocking dielectric layer 622) in the backside recesses 43 while suppressing or retarding growth of the metal nitride material from the surfaces of the insulating layers 32 in the backside recesses 43 as described above. A metal nitride liner 46A comprising the metal nitride material is formed within each of the backside recesses 43 directly on an outer sidewall of a respective dielectric-metal-oxide blocking dielectric portion 622D. In some embodiments, a planar metal nitride portion 646 may grow from the physically exposed surfaces of the source regions 61.

In one embodiment, each of the dielectric-metal-oxide blocking dielectric portions 622D comprises a respective cylindrical outer sidewall that vertically extends from a respective underlying insulating layer 32 to a respective overlying insulating layer 32, an annular top surface in contact with the respective overlying insulating layer 32, and an annular bottom surface in contact with the respective underlying insulating layer 32.

Referring to FIG. 13D, the processing steps described with reference to FIG. 9D may be performed to deposit a metal fill material in the remaining volumes of backside recesses 43, on the sidewalls of the backside trenches 79, and over the top surface of the contact-level dielectric layer 73. Thus, an electrically conductive layer 46 comprising a contiguous combination of a respective metal nitride liner 46A and a respective metal fill material portion 46B is formed in each of the backside recesses 43.

Figure 13E:
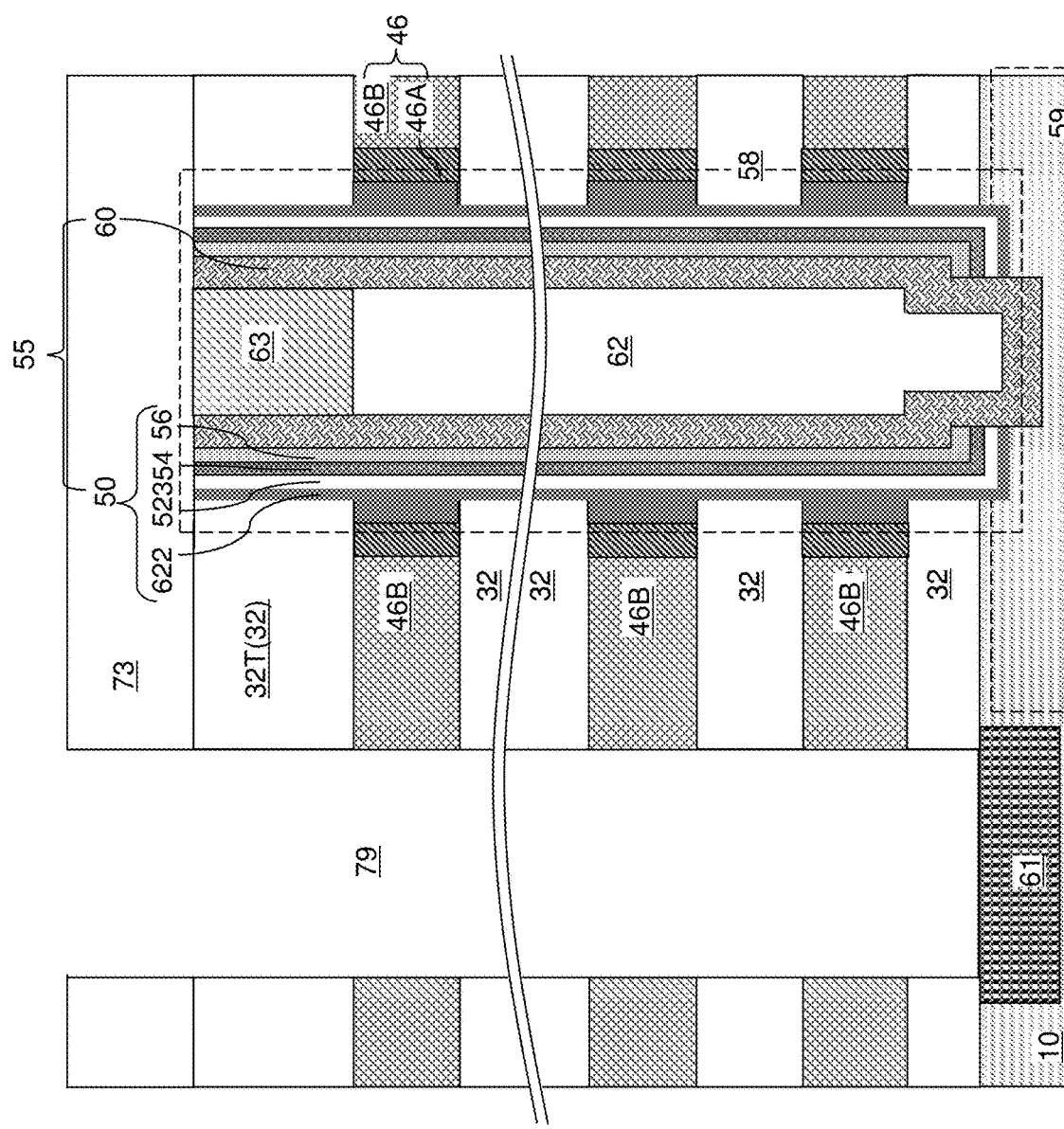

Referring to FIG. 13E, the processing steps described with reference to FIG. 9E may be performed to etch back the conductive material layer 46L from the sidewalls of each backside trench 79 and from above the contact-level dielectric layer 73. If any planar metal nitride portions 646 are formed, such planar metal nitride portions 646 can be removed, for example, by performing an anisotropic etch process.

In one embodiment, each of the tubular metal nitride portions 46A of the electrically conductive layers 46 laterally surrounds and contacts a respective one of the dielectric-metal-oxide blocking dielectric portions 622D. In one embodiment, each metal fill material portion 46B of the electrically conductive layers 46 comprises a respective horizontal top surface contacting a bottom surface of a respective overlying insulating layer 32, and a respective horizontal bottom surface contacting a top surface of a respective underlying insulating layer 32.

Figure 13F:
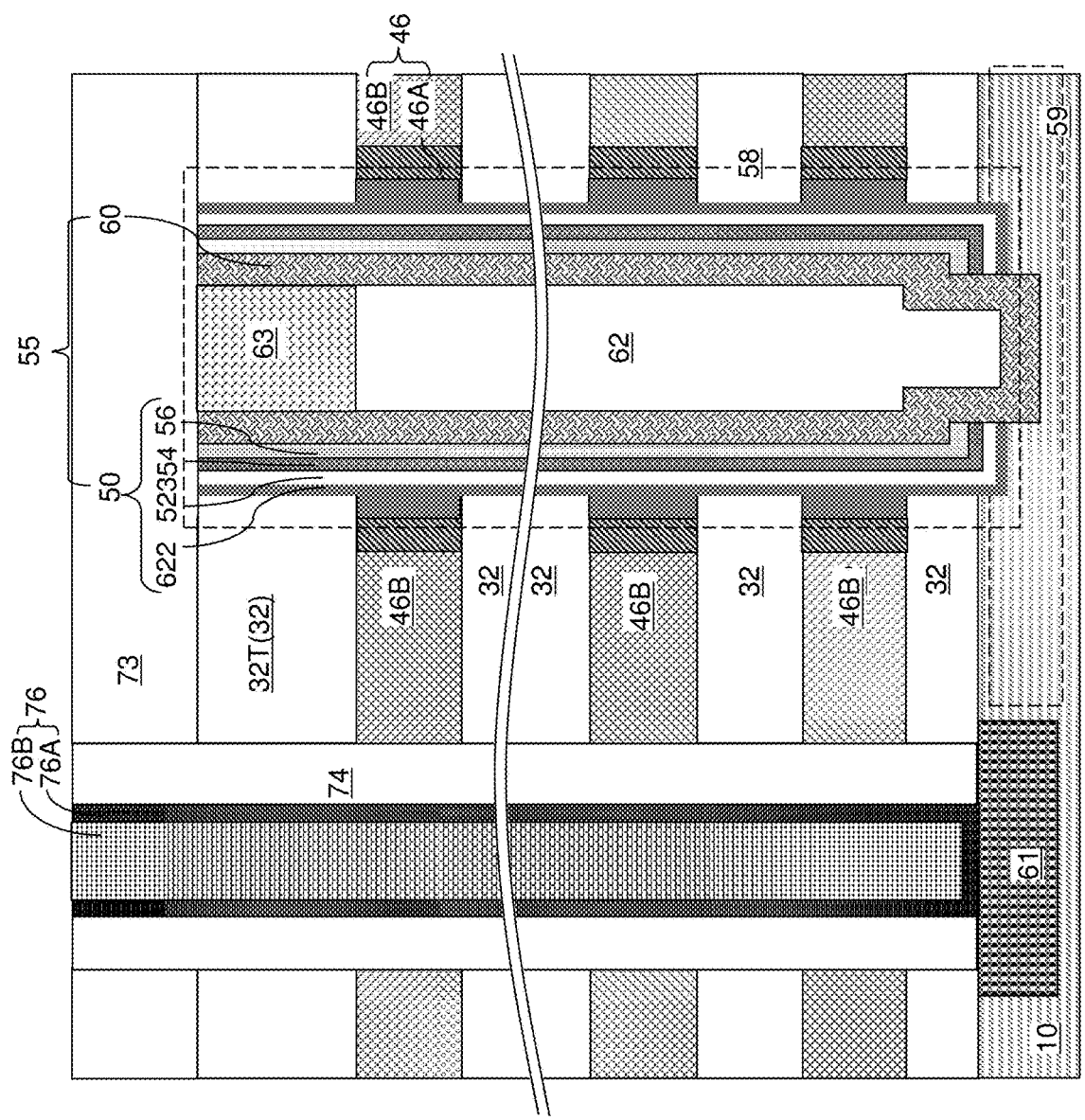

Referring to FIG. 13F, the processing steps described with reference to FIG. 9F may be performed to form a backside trench fill structure (74, 76) within each backside trench 79. Subsequently, the processing steps described with reference to FIGS. 11A and 11B may be performed to form additional contact via structures.

Figure 13G:
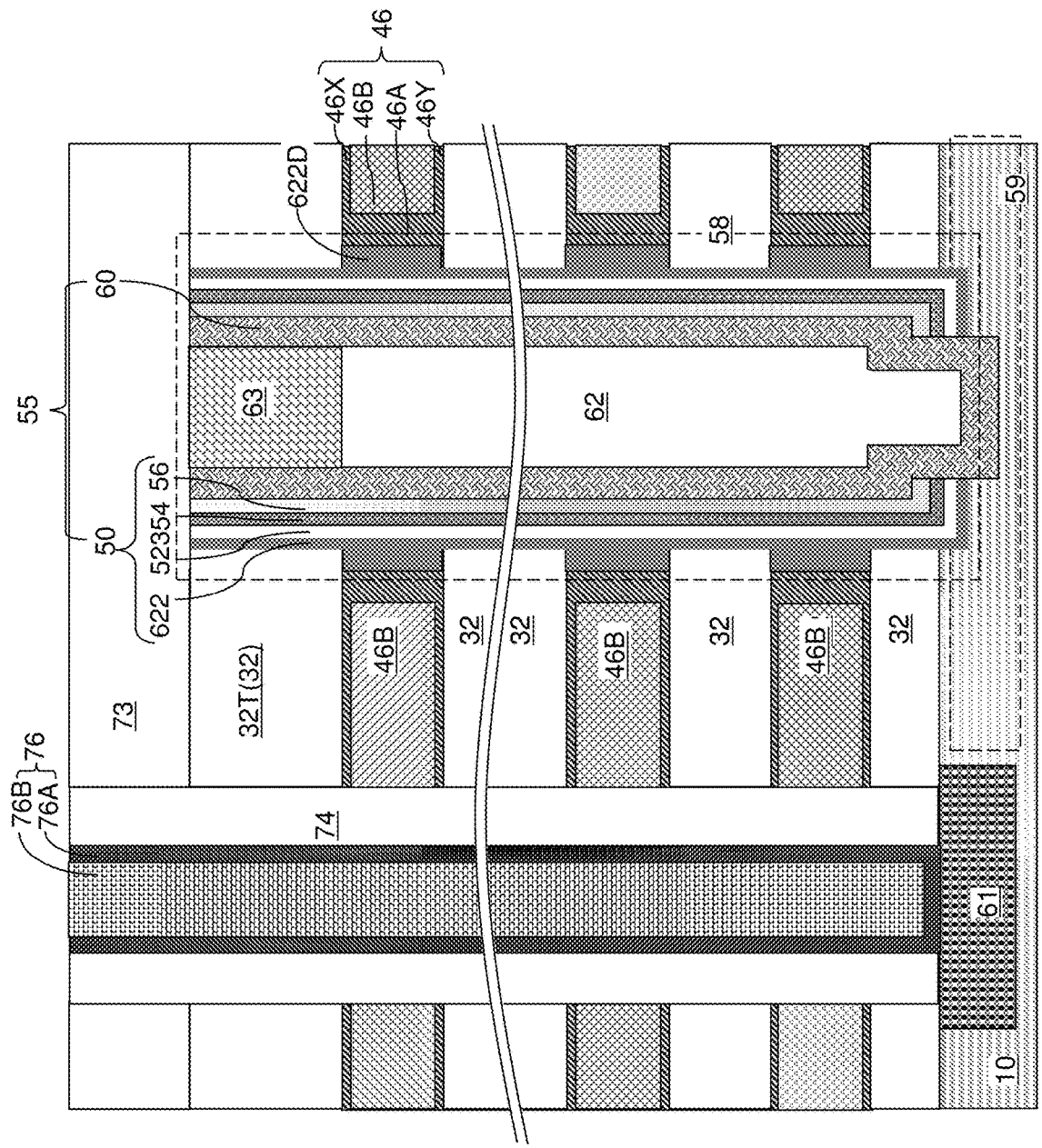
FIG. 13G is a vertical cross-sectional view of a region of an alternative embodiment of the third exemplary structure according to the third embodiment of the present disclosure.

Referring to FIG. 13G, an alternative embodiment of the third exemplary structure may be derived from the third exemplary structure illustrated in FIG. 13F by employing the selective deposition process described with reference to FIG. 10A instead of the selective deposition process described with reference to FIG. 13C. In this case, the selective deposition process grows a metal nitride material from physically exposed surface of the set of dielectric-metal-oxide blocking dielectric portions 622D in the backside recesses 43 while retarding growth of the metal nitride material from physically exposed surfaces of the insulating layers 32.

In this case, a thin layer of the metal nitride material can grow from physically exposed surfaces of the insulating layers 32 and the contact-level dielectric layer 73. Thus, the metal nitride liner may be formed as a continuous material layer having portions 46A having a first thickness around each physically exposed cylindrical surface segment of the outer sidewall of the discrete portion 622D of the continuous dielectric-metal-oxide blocking dielectric layers 622, and having planar horizontal portions 46X and 46Y having a second smaller thickness over each physically exposed surface of the insulating layers 32 and the contact-level dielectric layer 73. The first thickness may be in a range from 2 nm to 40 nm, such as from 4 nm to 30 nm, and/or from 6 nm to 20 nm, although lesser and greater thicknesses may also be employed. The second thickness may be in a range from 1% to 50%, such as from 3% to 20%, of the first thickness.

Figure 14:
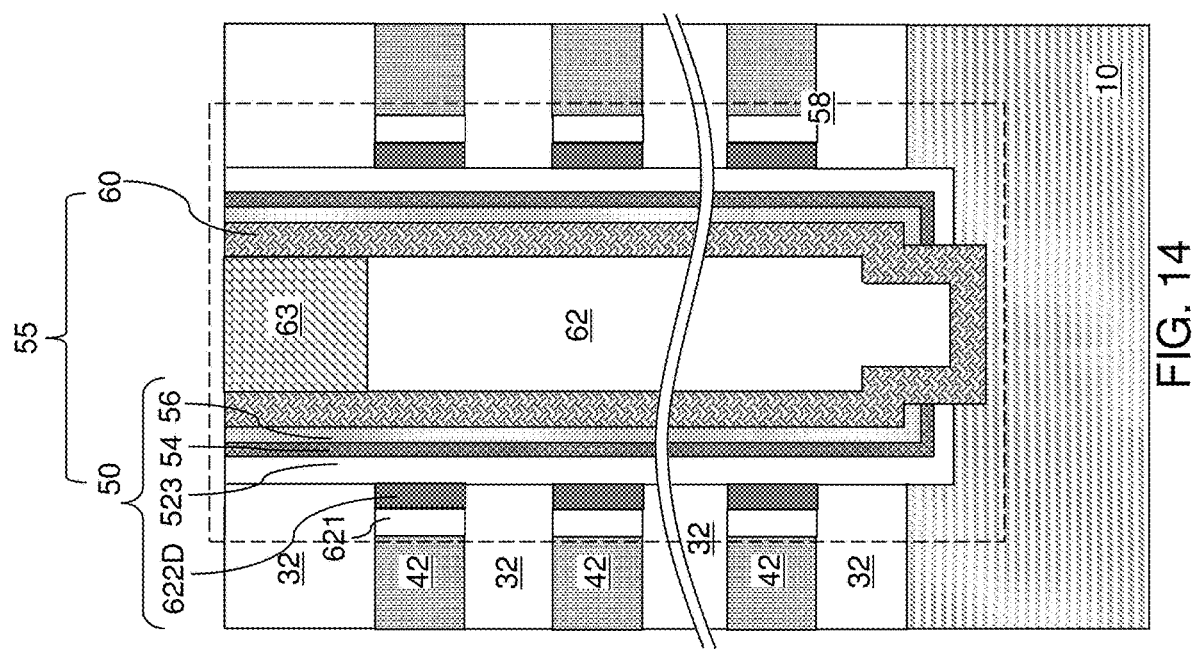
FIG. 14 is a vertical cross-sectional view of a region of a fourth exemplary structure after formation of memory opening fill structures according to a fourth embodiment of the present disclosure.

Referring to FIG. 14, a region of a fourth exemplary structure according to a fourth embodiment of the present disclosure is illustrated after formation of memory opening fill structures 58. The fourth exemplary structure may be derived from the third exemplary structure illustrated in FIG. 12D by conformally depositing dielectric metal oxide material into remaining volumes of the cylindrical recesses 493 and on physically exposed sidewalls of the insulating layers 32 around the memory opening 49. Subsequently, the dielectric metal oxide material may be anisotropically etched to form discrete dielectric-metal-oxide blocking dielectric portions 622D. In other words, the continuous inner portion 622C of layer 622 shown in FIG. 12D is removed by anisotropic etching. The dielectric metal oxide material of the discrete dielectric-metal-oxide blocking dielectric portions 622D may comprise any material that may be employed for the continuous dielectric-metal-oxide blocking dielectric layer 522 as described above. Each of the discrete dielectric-metal-oxide blocking dielectric portions 622D may have a tubular configuration. In one embodiment, inner sidewalls of the discrete dielectric-metal-oxide blocking dielectric portions 622D may be vertically coincident with sidewalls of the insulating layers 32 around the memory opening 49.

The silicon oxide blocking dielectric layer 523 is deposited directly on the vertical stack of discrete dielectric-metal-oxide blocking dielectric portions 622D in each memory opening. Subsequently, a memory material layer 54, an inner dielectric liner 56, and an optional sacrificial cover material layer 601 may be deposited as described with reference to FIG. 5C. The processing steps described with reference to FIGS. 5D-5H can be subsequently formed to provide the fourth exemplary structure illustrated in FIG. 14.

Each memory opening fill structure 58 can be located in a respective memory opening 49, and comprise a set of discrete dielectric-metal-oxide blocking dielectric portions 622D located at levels of the sacrificial material layers 42, a memory material layer 54, and a vertical semiconductor channel 60. The discrete dielectric-metal-oxide blocking dielectric portions 622D are vertically spaced from each other and are not connected to each other by another metal oxide portion. In one embodiment, cylindrical inner sidewalls of the discrete dielectric-metal-oxide blocking dielectric portions 622D are vertically coincident with sidewalls of the insulating layers 32 of the alternating stack (32, 46) that are located around the memory opening 49.

FIGS. 15A-15F are sequential vertical cross-sectional views of a region of the fourth exemplary structure during formation of electrically conductive layers 46 and backside trench fill structures (74, 76) according to the fourth embodiment of the present disclosure.

Figure 15A:
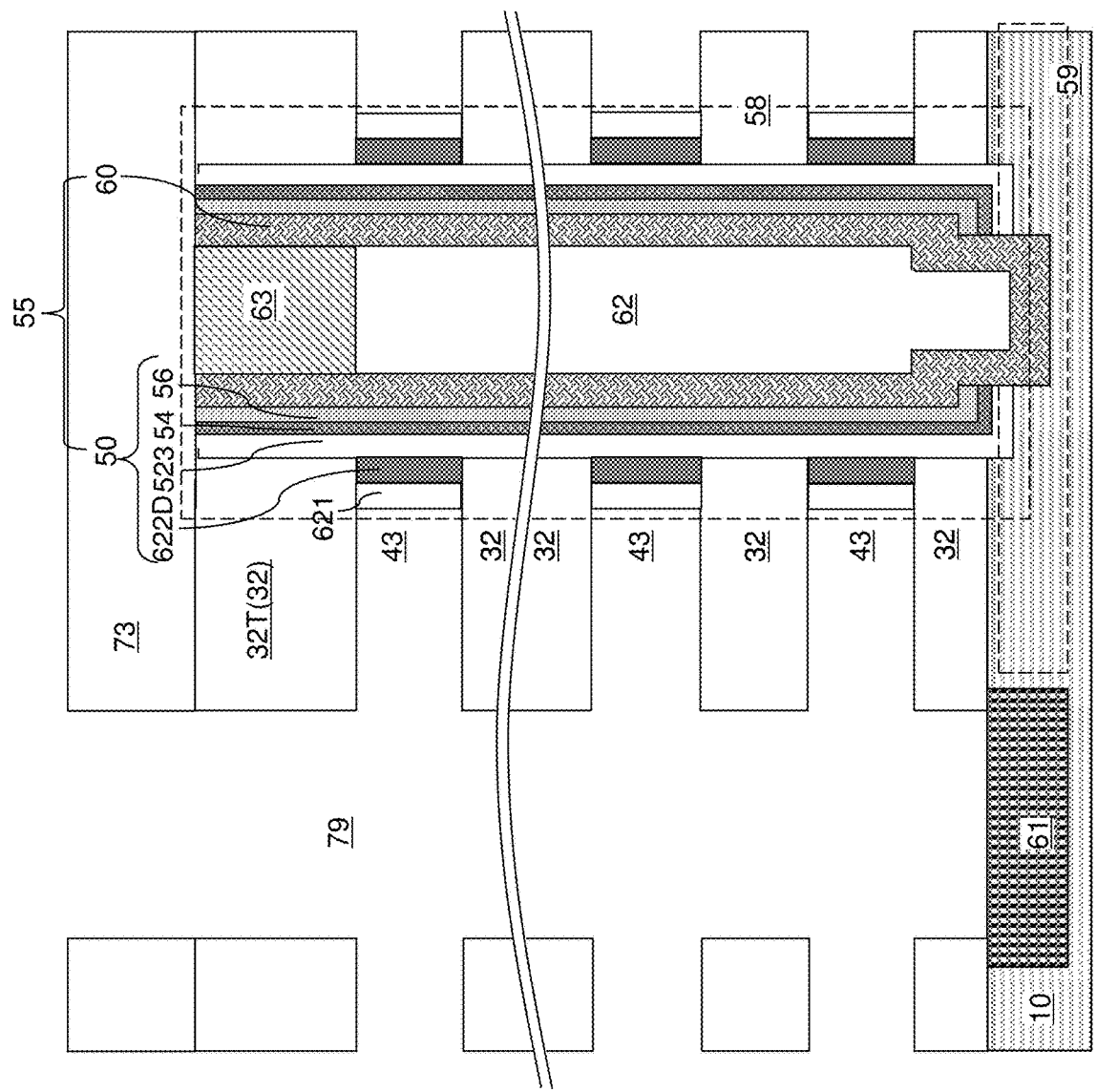
FIGS. 15A-15F are sequential vertical cross-sectional views of a region of the fourth exemplary structure during formation of electrically conductive layers and backside trench fill structures according to the fourth embodiment of the present disclosure.

Referring to FIG. 15A, the processing steps described with reference to FIG. 13A may be performed to form backside recesses 43.

Figure 15B:
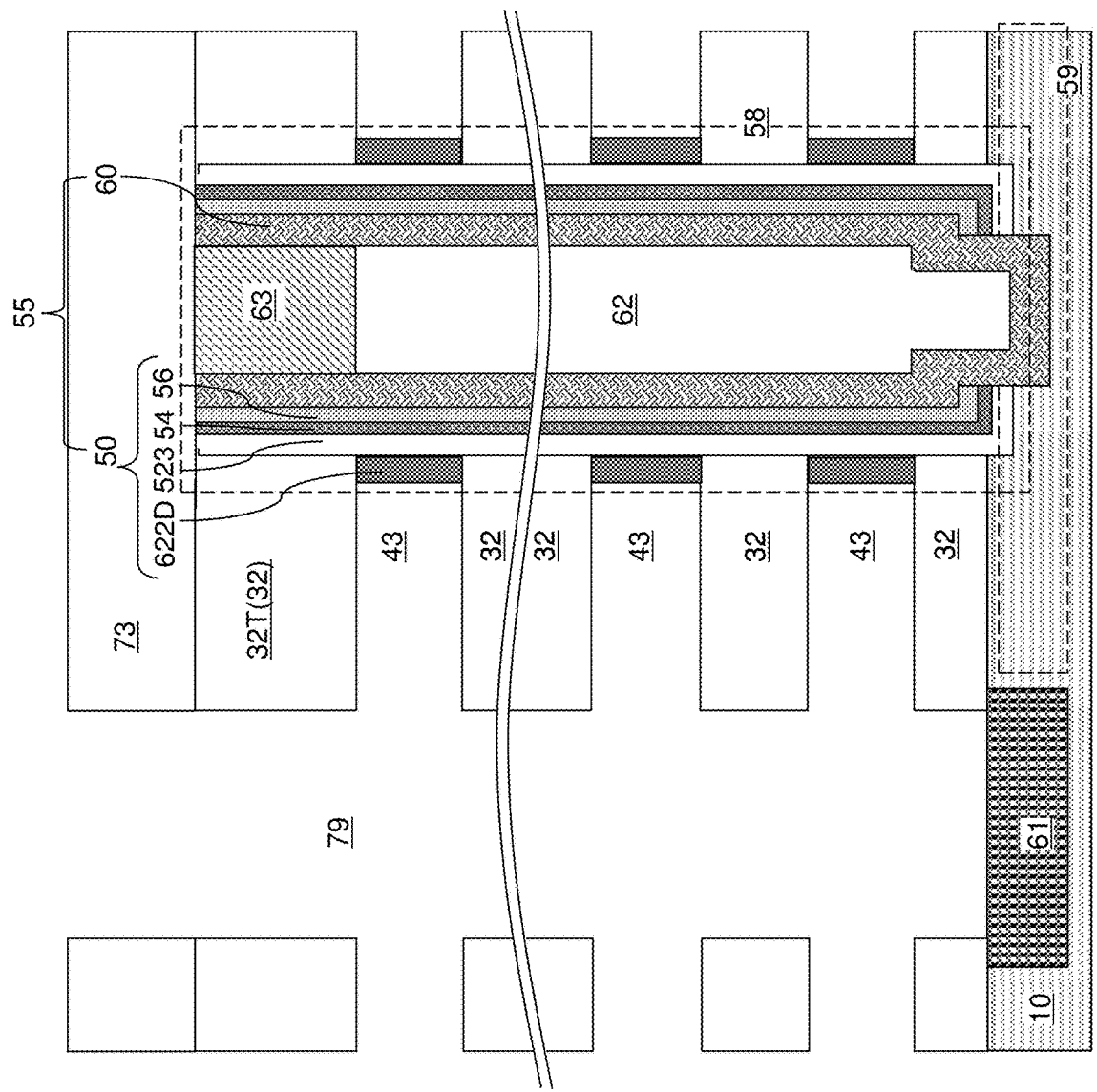

Referring to FIG. 15B, the processing steps described with reference to FIG. 13B may be performed. Specifically, an isotropic etch process may be performed to remove the tubular oxide portions 621.

Figure 15C:
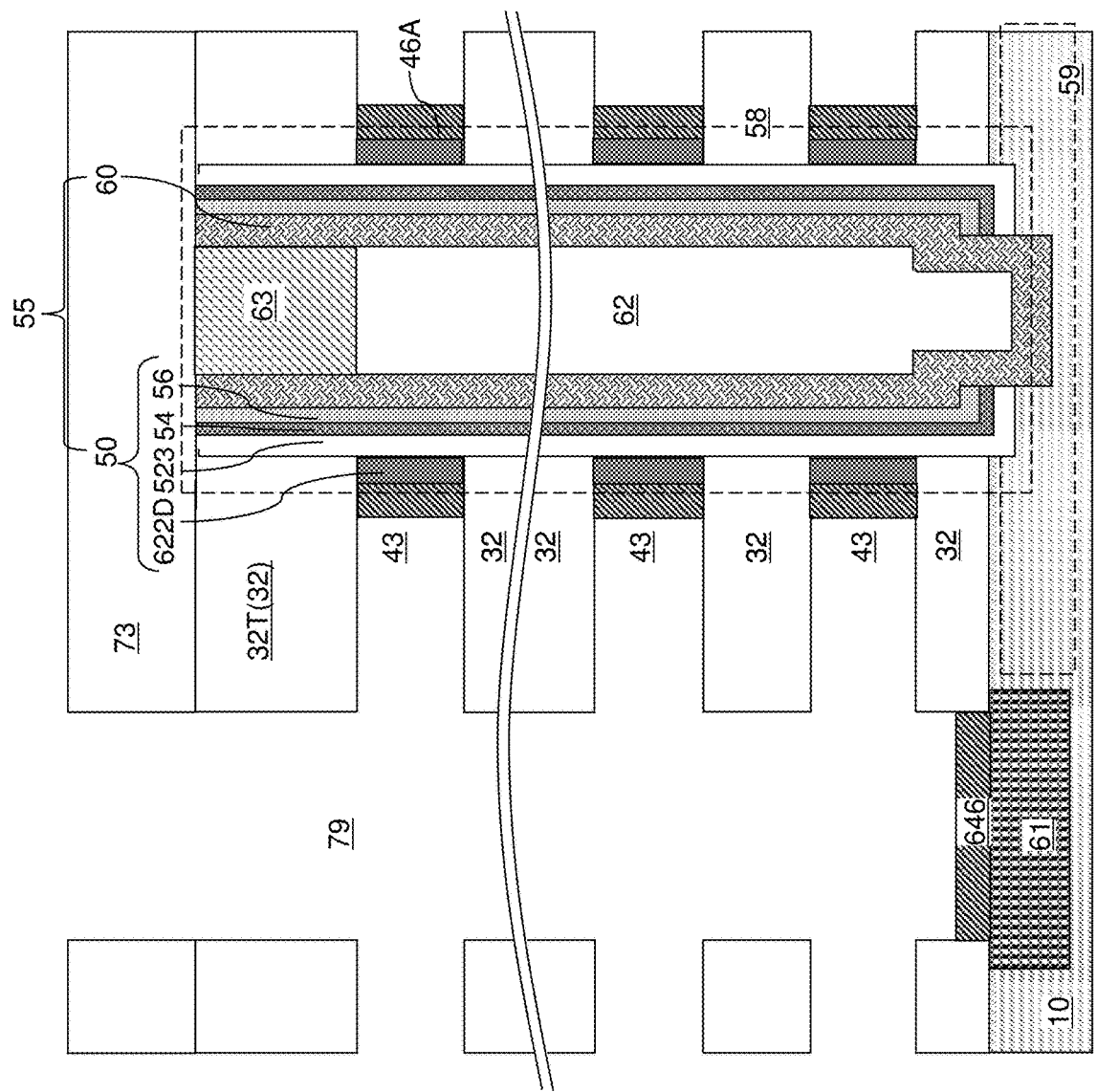

Referring to FIG. 15C, the processing steps described with reference to FIG. 13C may be performed. A metal nitride liner 46A comprising the metal nitride material is formed within each of the backside recesses 43 directly on an outer sidewall of a respective discrete dielectric-metal-oxide blocking dielectric portion 622D.

Figure 15D:
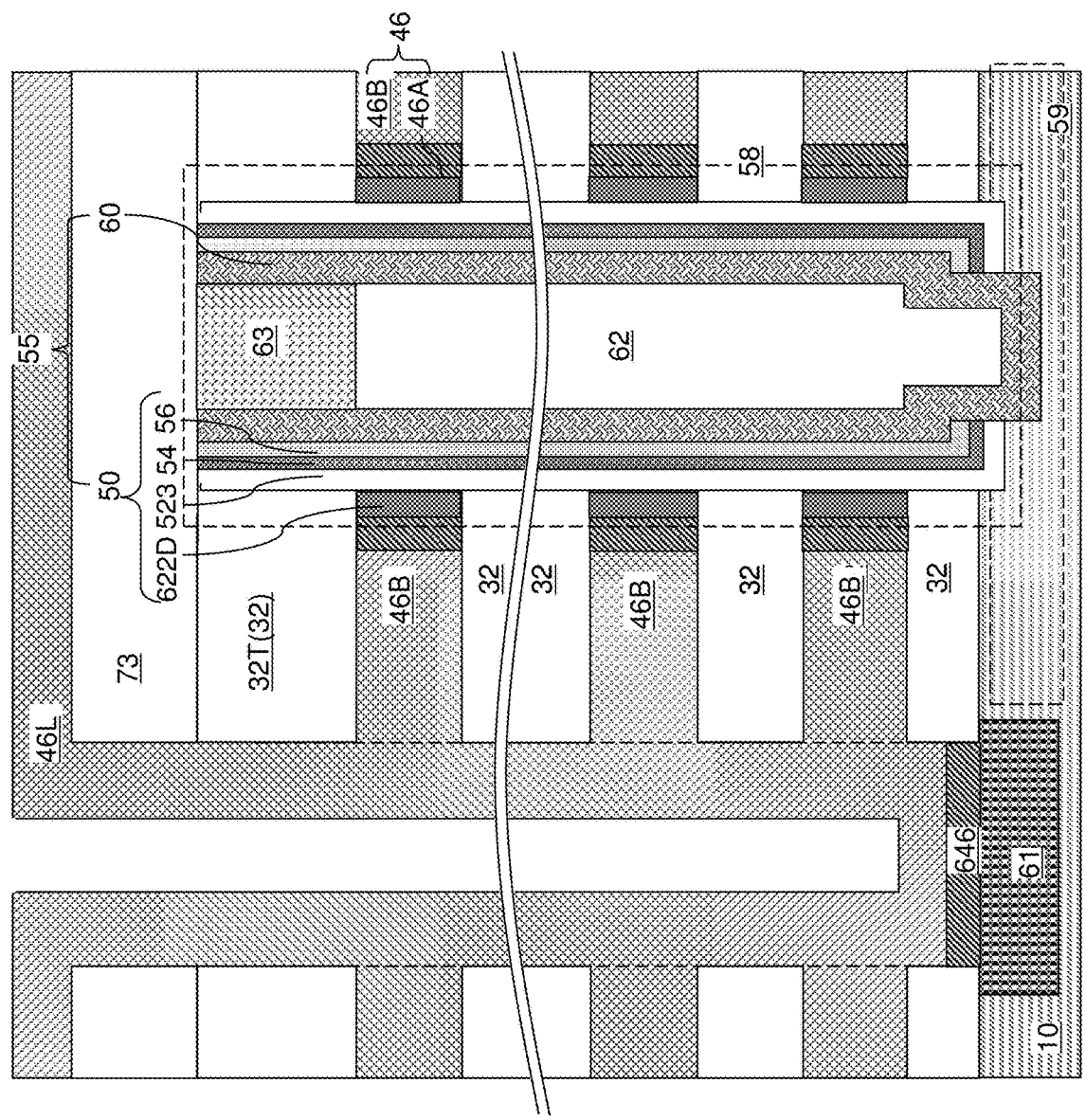

Referring to FIG. 15D, the processing steps described with reference to FIG. 13D may be performed to deposit a metal fill material in the remaining volumes of backside recesses 43, on the sidewalls of the backside trenches 79, and over the top surface of the contact-level dielectric layer 73. Each portion of the metal fill material that fills remaining volumes of the backside trenches 43 constitutes a metal fill material portion 46B.

Figure 15E:
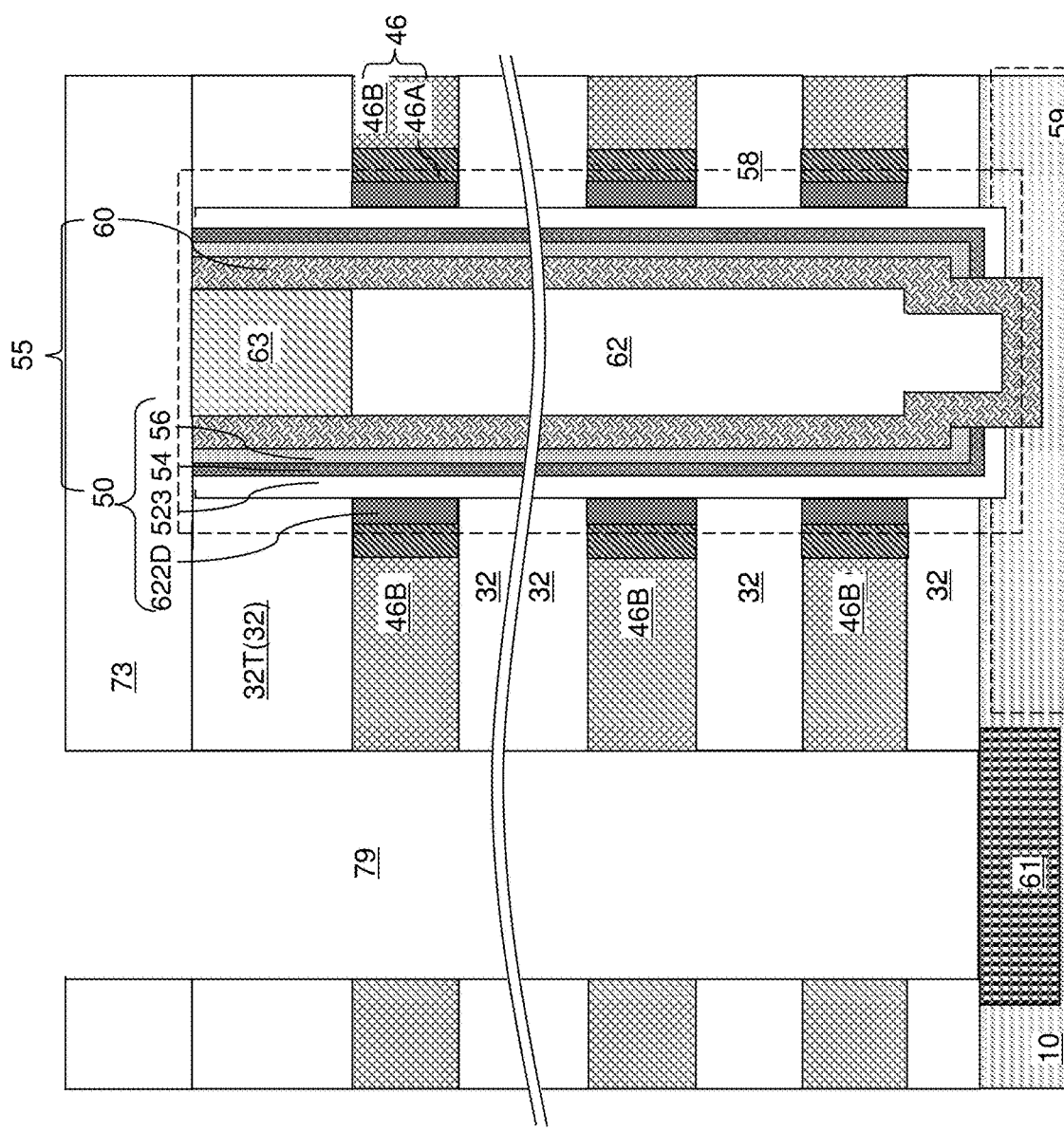

Referring to FIG. 15E, the processing steps described with reference to FIG. 13E may be performed to etch back the conductive material layer 46L from the sidewalls of each backside trench 79 and from above the contact-level dielectric layer 73. Thus, the sacrificial material layers 42 are replaced with the electrically conductive layers 46.

Figure 15F:
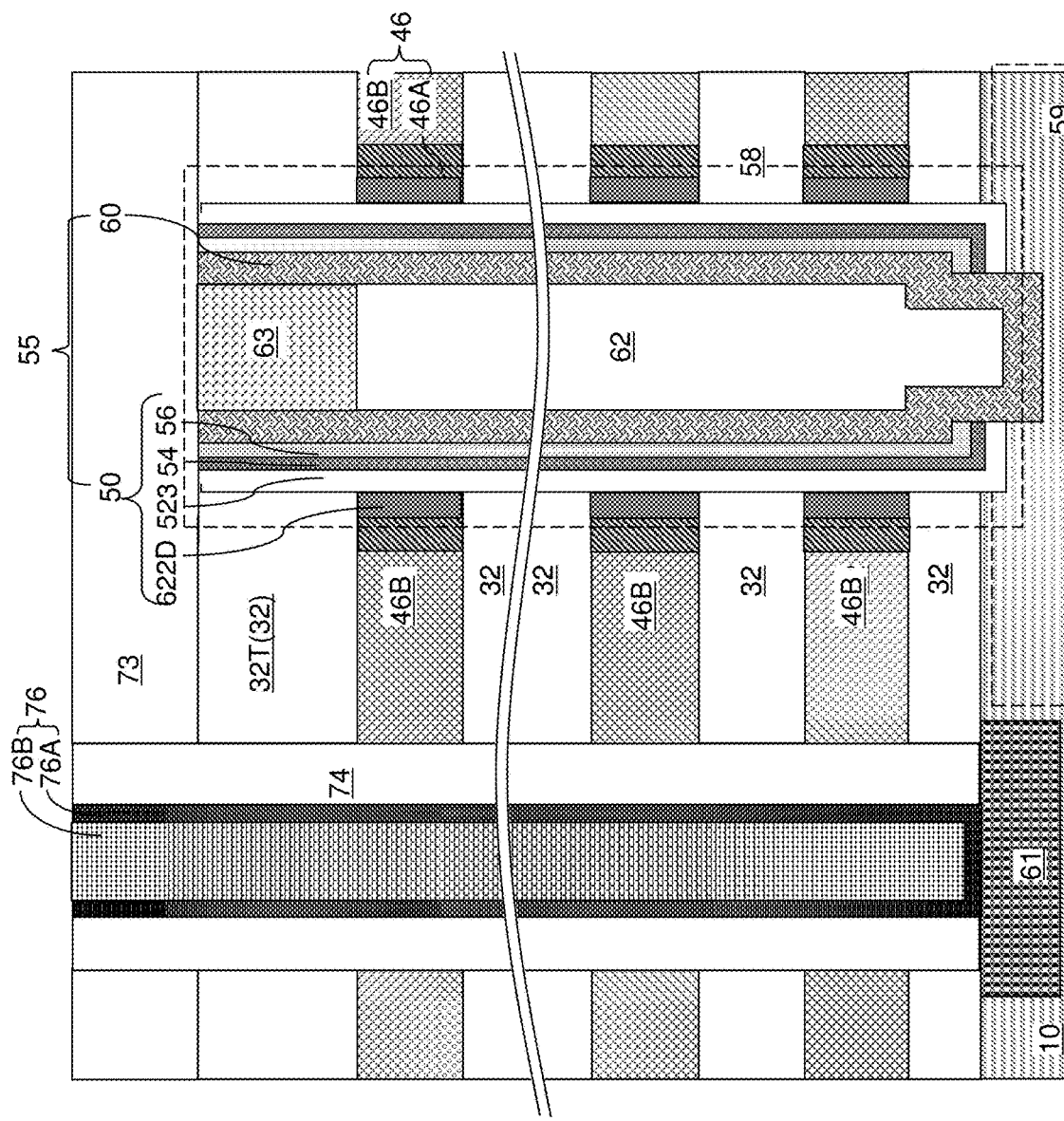

Referring to FIG. 15F, the processing steps described with reference to FIG. 13F may be performed to form a backside trench fill structure (74, 76) within each backside trench 79. Subsequently, the processing steps described with reference to FIGS. 11A and 11B may be performed to form additional contact via structures.

Figure 15G:
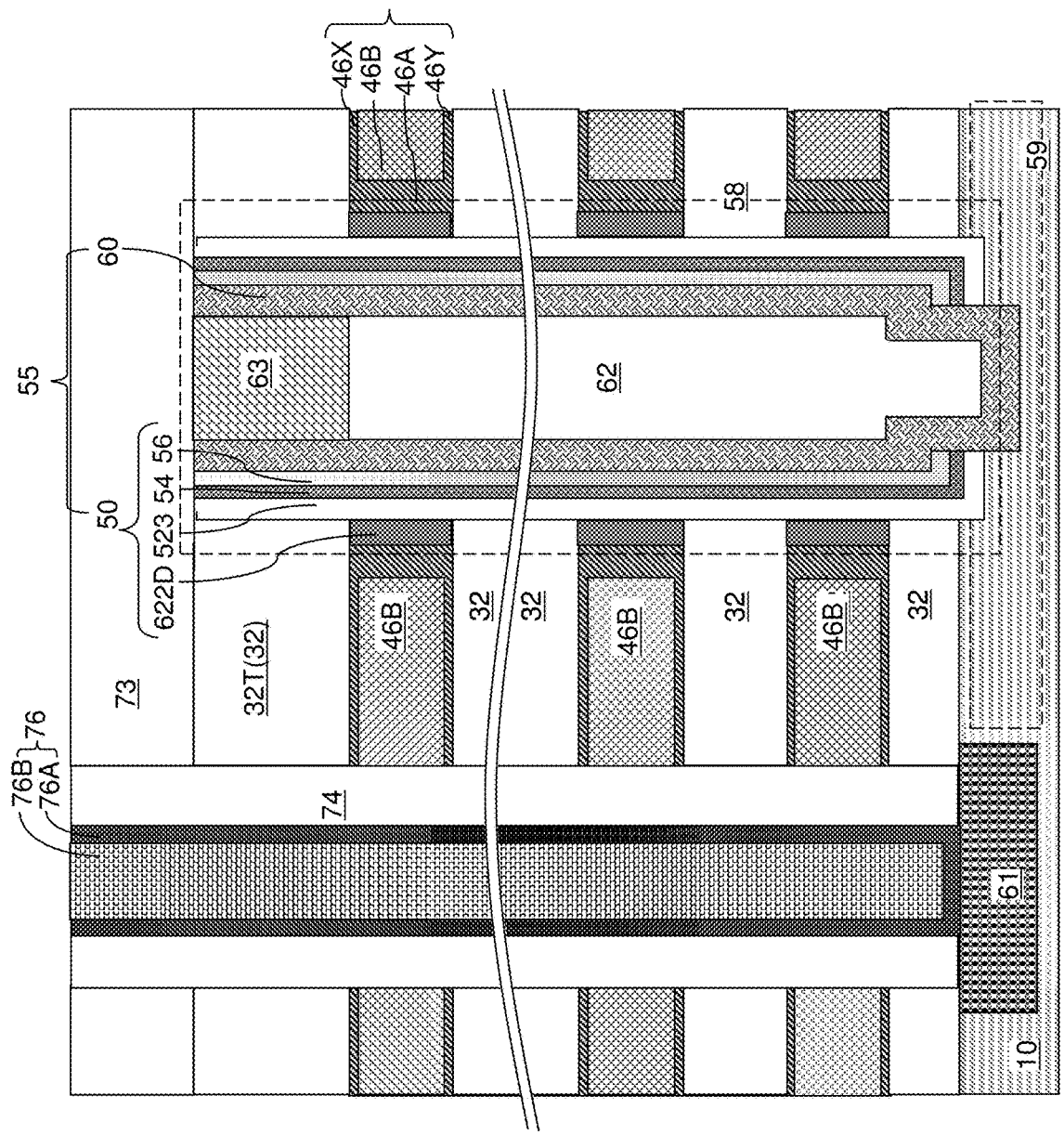
FIG. 15G is a vertical cross-sectional view of a region of an alternative embodiment of the fourth exemplary structure according to the fourth embodiment of the present disclosure.

Referring to FIG. 15G, an alternative embodiment of the third exemplary structure may be derived from the third exemplary structure illustrated in FIG. 15F by employing the selective deposition process described with reference to FIG. 10A instead of the selective deposition process described with reference to FIG. 15C. In this case, the selective deposition process grows a metal nitride material from physically exposed surface of the discrete dielectric-metal-oxide blocking dielectric portions 622D in the backside recesses 43 while retarding growth of the metal nitride material from physically exposed surfaces of the insulating layers 32.

In this case, a thin layer of the metal nitride material can grow from physically exposed surfaces of the insulating layers 32 and the contact-level dielectric layer 73. Thus, the metal nitride liner may be formed as a continuous material layer having portions 46A having a first thickness around each physically exposed cylindrical surface segment of the outer sidewall of the discrete portion 622D of the continuous dielectric-metal-oxide blocking dielectric layers 622, and having planar horizontal portions 46X and 46Y having a second smaller thickness over each physically exposed surface of the insulating layers 32 and the contact-level dielectric layer 73. The first thickness may be in a range from 2 nm to 40 nm, such as from 4 nm to 30 nm, and/or from 6 nm to 20 nm, although lesser and greater thicknesses may also be employed. The second thickness may be in a range from 1% to 50%, such as from 3% to 20%, of the first thickness.

Referring to all drawings and according to various embodiments of the present disclosure, a three-dimensional memory device is provided, which comprises: an alternating stack (32, 46) of insulating layers 32 and electrically conductive layers 46; a memory opening 49 vertically extending through the alternating stack (32, 46); and a memory opening fill structure 58 located in the memory opening 49 and comprising a set of dielectric-metal-oxide blocking dielectric portions (which comprise portions of a continuous dielectric-metal-oxide blocking dielectric layer (522, 622) or a set of discrete dielectric-metal-oxide blocking dielectric portions 622D) located at levels of the electrically conductive layers 46, a memory material layer 54, and a vertical semiconductor channel 60. Each of the electrically conductive layers 46 comprises a tubular metal nitride portion (e.g., metal nitride liner) 46A and a metal fill material portion 46B.

Each of the tubular metal nitride portions 46A of the electrically conductive layers 46 laterally surrounds and contacts a respective one of the dielectric-metal-oxide blocking dielectric portions. Each metal fill material portion 46B either contacts respective overlying and underlying insulating layers of the insulating layers 32, or contacts respective upper and lower metal nitride liner portions (46X, 46Y) which have a smaller thickness than the tubular metal nitride portions 46A.

In one embodiment, the tubular metal nitride portions 46A comprise TiN, TaN, MoN, or WN, the dielectric-metal-oxide blocking dielectric portions (522, 622 or 622D) comprise aluminum oxide or a dielectric transition metal oxide, and the metal fill material portions 46 comprise molybdenum, tungsten, cobalt, ruthenium, titanium, or tantalum. In one embodiment, the tubular metal nitride portions comprise TiN, the dielectric-metal-oxide blocking dielectric portions comprise aluminum oxide, and the metal fill material portions comprise molybdenum.

In one embodiment, each of the metal fill material portions 46B laterally surrounds a respective one of the tubular metal nitride portions 46A.

In one embodiment, the set of dielectric-metal-oxide blocking dielectric portions comprises portions of a continuous dielectric-metal-oxide blocking dielectric layer (522, 622) that vertically extends continuously through each electrically conductive layer 46 within the alternating stack (32, 46). In one embodiment, the continuous dielectric-metal-oxide blocking dielectric layer (522, 622) comprises a straight inner sidewall that vertically extends through each layer within the alternating stack (32, 46).

In the first and second embodiments, the continuous dielectric-metal-oxide blocking dielectric layer 522 comprises a straight outer sidewall that vertically extends through each layer within the alternating stack (32, 46). In the third embodiment, the continuous dielectric-metal-oxide blocking dielectric layer 622 comprises a continuous inner portion 622C and discrete outer portions 622D located at levels of the electrically conductive layers 46 and having a greater lateral thickness than the continuous inner portions 622C located at levels of the insulating layers 32.

In the third and fourth embodiments, the set of dielectric-metal-oxide blocking dielectric portions comprise discrete dielectric-metal-oxide blocking dielectric portions 622D each of which comprises a respective cylindrical outer sidewall that vertically extends from a respective underlying insulating layer of the insulating layers 32 to a respective overlying insulating layer of the insulating layers 32, an annular top surface in contact with the respective overlying insulating layer, and an annular bottom surface in contact with the respective underlying insulating layer. Each of the tubular metal nitride portions 46A comprises a respective cylindrical inner sidewall that contacts an entirety of a cylindrical outer sidewall of a respective one of the discrete dielectric-metal-oxide blocking dielectric portions 622D.

In the fourth embodiment, the discrete dielectric-metal-oxide blocking dielectric portions 622D are vertically spaced apart from each other; and each discrete dielectric-metal-oxide blocking dielectric portion 622D is in direct contact with and has a same vertical extent as a respective one of the electrically conductive layers 46 within the alternating stack (32, 46). In the fourth embodiment, cylindrical inner sidewalls of the discrete dielectric-metal-oxide blocking dielectric portions 622 are vertically coincident with sidewalls of the insulating layers 32 of the alternating stack (32, 46) that are located around the memory opening 49.

In the first embodiment, each metal fill material portion 46B contacts respective overlying and underlying insulating layers 32; and each metal fill material portion 46 comprises a respective horizontal top surface contacting a bottom surface of the respective overlying insulating layer 32, and a respective horizontal bottom surface contacting a top surface of the respective underlying insulating layer 32.

In the second embodiment, each metal fill material portion 46B contacts the respective upper and lower metal nitride liner portions (46X, 46Y); the upper metal nitride liner portion 46X is adjoined to a top end of the tubular metal nitride portion 46A; the lower metal nitride liner portion 46Y is adjoined to a bottom end of the tubular metal nitride portion 46A; and each of the upper metal nitride liner portion 46X and the lower metal nitride liner portion 46Y has a uniform thickness that is less than a lateral thickness of the tubular metal nitride portion 46A between a cylindrical inner sidewall and a cylindrical outer sidewall of portion 46A.

Generally, the lateral thickness of the tubular metal nitride portion of each metallic liner layer 46A is not limited by the height of the backside recesses 43. Further, the lateral thickness of the tubular metal nitride portion of each metallic liner layer 46A does not reduce the vertical thickness of the metal fill material portions 46B that provides higher electrical conductivity than the metal nitride liner layer. The upper and lower metal nitride liner portions (46X, 46Y) may be omitted or made thinner than the tubular metal nitride portion of the liner 46A to provide a thicker metal fill material portion 46B. Thus, the overall electrical conductivity of the electrically conductive layers 46 is not significantly impacted by increasing the lateral thickness of the tubular metal nitride portion of each metallic liner layer 46A. However, increase in the lateral thickness of the tubular metal nitride portion of each metallic liner layer 46A can provide higher memory cell reliability when used in combination with molybdenum metal fill material portions 46B.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers;
   a memory opening vertically extending through the alternating stack; and
   a memory opening fill structure located in the memory opening and comprising a set of dielectric-metal-oxide blocking dielectric portions located at levels of the electrically conductive layers, a memory material layer, and a vertical semiconductor channel,
   wherein:
   each of the electrically conductive layers comprises a tubular metal nitride portion and a metal fill material portion;
   each of the tubular metal nitride portions of the electrically conductive layers laterally surrounds and contacts a respective one of the dielectric-metal-oxide blocking dielectric portions;
   each metal fill material portion either contacts respective overlying and underlying insulating layers of the insulating layers, or contacts respective upper and lower metal nitride liner portions which have a smaller thickness than the tubular metal nitride portions; and
   the set of dielectric-metal-oxide blocking dielectric portions comprise discrete dielectric-metal-oxide blocking dielectric portions each of which comprises a respective cylindrical outer sidewall that vertically extends from a respective underlying insulating layer of the insulating layers to a respective overlying insulating layer of the insulating layers, an annular top surface in contact with the respective overlying insulating layer, and an annular bottom surface in contact with the respective underlying insulating layer.

2. The three-dimensional memory device of claim 1, wherein each of the tubular metal nitride portions comprises a respective cylindrical inner sidewall that contacts an entirety of a cylindrical outer sidewall of a respective one of the discrete dielectric-metal-oxide blocking dielectric portions.

3. The three-dimensional memory device of claim 1, wherein:
   the discrete dielectric-metal-oxide blocking dielectric portions are vertically spaced apart from each other; and
   each of the discrete dielectric-metal-oxide blocking dielectric portions is in direct contact with and has a same vertical extent as a respective one of the electrically conductive layers within the alternating stack.

4. The three-dimensional memory device of claim 3, wherein cylindrical inner sidewalls of the discrete dielectric-metal-oxide blocking dielectric portions are vertically coincident with sidewalls of the insulating layers of the alternating stack that are located around the memory opening.

* * * * *